United States Patent
Shinomiya et al.

(10) Patent No.: US 10,644,689 B2
(45) Date of Patent: May 5, 2020

(54) TRANSISTOR DRIVE CIRCUIT AND MOTOR DRIVE CONTROL APPARATUS

(71) Applicant: DENSO CORPORATION, Kariya, Aichi-pref. (JP)

(72) Inventors: Kohei Shinomiya, Kariya (JP); Takahiro Iwamura, Kariya (JP); Akimasa Niwa, Kariya (JP); Masahiro Yamamoto, Kariya (JP); Seiji Nishimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/326,638

(22) PCT Filed: Jul. 31, 2017

(86) PCT No.: PCT/JP2017/027691

§ 371 (c)(1),
(2) Date: Feb. 19, 2019

(87) PCT Pub. No.: WO2018/034137

PCT Pub. Date: Feb. 22, 2018

(65) Prior Publication Data

US 2019/0363706 A1 Nov. 28, 2019

(30) Foreign Application Priority Data

Aug. 17, 2016 (JP) .................................. 2016-160111
Aug. 17, 2016 (JP) .................................. 2016-160112

(Continued)

(51) Int. Cl.
*H02P 27/08* (2006.01)
*H02P 29/60* (2016.01)
(Continued)

(52) U.S. Cl.
CPC ....... *H03K 17/08122* (2013.01); *H02P 27/08* (2013.01); *H03K 17/08128* (2013.01);
(Continued)

(58) Field of Classification Search
None
See application file for complete search history.

(56) References Cited

U.S. PATENT DOCUMENTS 4,760,293 A * 7/1988 Hebenstreit .......... H03K 17/107
 327/432
5,383,082 A * 1/1995 Nishizawa ....... H03K 17/08122
 361/18

(Continued)

FOREIGN PATENT DOCUMENTS

| JP | H04-354156 A | 12/1992 |
|---|---|---|
| JP | 2002-016486 A | 1/2002 |
| JP | 2007-037255 A | 2/2007 |
| JP | 2010-279193 A | 12/2010 |

OTHER PUBLICATIONS

Oct. 17, 2017 International Search Report issued in International Patent Application No. PCT/JP2017/027691.

*Primary Examiner* — Bentsu Ro
(74) *Attorney, Agent, or Firm* — Oliff PLC

(57) ABSTRACT

A transistor drive circuit drives a bipolar-type transistor and a MOSFET that are connected in parallel to each other. A temperature detection element that detects a temperature of a the bipolar-type transistor or the MOSFET. When the temperature is equal to or less than a threshold, the transistor drive circuit turns on both of the MOSFET and the bipolar-type transistor. When the temperature exceeds the threshold, the transistor drive circuit turns on only the bipolar-type transistor.

39 Claims, 44 Drawing Sheets

| (30) Foreign Application Priority Data | (56) References Cited |
|---|---|

Aug. 17, 2016 (JP) ................................. 2016-160113
Aug. 17, 2016 (JP) ................................. 2016-160114
Aug. 17, 2016 (JP) ................................. 2016-160115
Jul. 19, 2017 (JP) ................................. 2017-140057

(51) Int. Cl.
  H03K 17/0812 (2006.01)
  H03K 17/16 (2006.01)
  H03K 17/08 (2006.01)
(52) U.S. Cl.
  CPC ......... *H03K 17/162* (2013.01); *H03K 17/168* (2013.01); *H03K 2017/0806* (2013.01)

U.S. PATENT DOCUMENTS

| | | | |
|---|---|---|---|
| 7,274,243 B2* | 9/2007 | Pace | H02M 7/538 327/396 |
| 2004/0095088 A1* | 5/2004 | Nakaho | B60R 1/07 318/280 |
| 2006/0103237 A1* | 5/2006 | Uemura | F02D 41/20 307/1 |
| 2007/0284664 A1 | 12/2007 | Okuda et al. | |
| 2013/0062626 A1 | 3/2013 | Takao et al. | |
| 2013/0088279 A1* | 4/2013 | Shimano | H03K 17/163 327/401 |

* cited by examiner

OPERATION OF TURN-ON DELAY CIRCUIT

OPERATION OF TURN-OFF DELAY CIRCUIT

TRANSISTOR DRIVE CIRCUIT AND MOTOR DRIVE CONTROL APPARATUS

CROSS-REFERENCE TO RELATED APPLICATIONS

The present application is based on Japanese Patent Applications No. 2016-160111 to No. 2016-160115, filed on Aug. 17, 2016, and Japanese Patent Application No. 2017-140057, filed on Jul. 19, 2017, the descriptions of which are incorporated herein.

TECHNICAL FIELD

The present disclosure relates to a drive circuit and a motor drive control apparatus that drives a motor by the drive circuit, the drive circuit driving a bipolar-type transistor and a metal-oxide-semiconductor field-effect transistor (MOSFET) in which the bipolar-type transistor and the MOSFET are connected in parallel to each other and an element size of the MOSFET is smaller than that of the bipolar-type transistor.

BACKGROUND ART

A reverse-conducting insulated-gate bipolar transistor (RC-IGBT) is a type of bipolar-type transistor. The RC-IGBT is a high-voltage power element, but has an issue in that on-resistance is high. Thus, reduction in loss due to this has been implemented by, for example, connecting a low-loss MOSFET using a wide-gap semiconductor such as SiC in parallel to the RC-IGBT and simultaneously turning on the RC-IGBT and the MOSFET. Hereafter, the operation in which the IGBT and the FET are simultaneously turned on may be referred to as "direct-current (DC) assist."

CITATION LIST

Patent Literature

[PTL 1] JP-A-H04-354156

SUMMARY OF INVENTION (First Issue)

When the above-described configuration is used, an element that has a smaller chip size than the RC-IGBT is typically used as the MOSFET that is connected in parallel. Therefore, when conduction amount to a load increases, the FET may enter an overheating state and may not be able to contribute to the reduction of loss.

(Second Issue)

When parallel drive is performed in such a manner, as shown in FIG. 42, regarding the MOSFET, a low-level voltage that is applied when the MOSFET is turned off may be set to a negative potential to reliably maintain the off-state. Then, because a potential difference with a high-level voltage that is applied when the MOSFET is turned on increases, drive loss increases.

(Third Issue)

In drive control that is typically performed regarding the above-described configuration, as shown in FIG. 43, turn-on of the RC-IGBT is started first and turn-on of the MOSFET is started thereafter. In this case, when a signal that commands turn-on of the RC-IGBT is received, regarding the MOSFET side, for example, turn-on is started after awaiting the elapse of a fixed amount of time based on a timer or a resistor-capacitor (CR) time constant.

Regarding the above-described fixed amount of time, the fixed amount of time is set so as to include a margin that takes into consideration variations in the switching characteristics and temperature characteristics of the RC-IGBT, and the like. Therefore, the timing at which turn-on of the MOSFET is started tends to be further delayed. An issue arises in that the effect of reducing loss through parallel drive with the RC-IGBT is not sufficiently obtained.

(Fourth Issue)

In DC assist such as that described above, as shown in FIG. 44, a control pattern in which the IGBT is turned on first and the FET is turned off first is typical. However, when the FET is turned off first, during turn-off of the IGBT that is subsequently performed, a so-called tail current may flow, as indicated by hatching in FIG. 44. Then, electric power loss also occurs in accompaniment with the generation of the tail current. Here, "Si" indicated in FIG. 44 refers to the IGBT and "SiC" refers to a FET in which use of a SiC-MOSFET is assumed.

(Fifth and Sixth Issues)

In pulse width modulation (PWM) control that is typically performed regarding the above-described configuration, as shown in a lower row in FIG. 45, turn-off of the MOSFET is started first and turn-off of the RC-IGBT is started thereafter. Therefore, compared to a case in which only the RC-IGBT is driven as shown in an upper row in FIG. 45, the amount of time until turn-off is completed becomes long and controllability becomes poor.

For example, when a bridge circuit is configured by upper and lower arms in which the above-described parallel-connection elements are connected in series, when operation of the bridge circuit by the same input signal as that when only the RC-IGBT is driven is assumed, the upper and lower arms may be simultaneously turned on and a short-circuit current may flow. Then, if dead-time at which the upper and lower arms are simultaneously turned off is set so as to be longer to prevent the short-circuit current from flowing, increase in loss becomes a concern.

(First Object)

An object of the present disclosure is to provide a transistor drive circuit that is capable of achieving reduction in loss taking into consideration a heat-generation state of a transistor when a bipolar-type transistor and a MOSFET are driven in parallel, and a motor drive control apparatus that drives a motor using the drive circuit.

(Second Object)

An object of the present disclosure is to provide a transistor drive circuit that is capable of reducing drive loss when a bipolar-type transistor and a MOSFET are driven in parallel.

(Third Object)

An object of the present disclosure is to provide a transistor drive circuit that is capable of setting, with higher accuracy, a timing at which turn-on on a MOSFET side is started, when a bipolar-type transistor and a MOSFET are driven in parallel.

(Fourth Object)

An object of the present disclosure is to provide a transistor drive circuit that is capable of suppressing loss that accompanies generation of tail current, when a bipolar-type transistor and a MOSFET are driven in parallel.

(Fifth and Sixth Objects)

An object of the present disclosure is to provide a transistor drive circuit that is capable of improving controllability when a bipolar-type transistor and a MOSFET are driven in parallel by PWM control.

(First Disclosure)

According to an aspect of the present disclosure, a temperature detection element detects a temperature of a bipolar-type transistor or a MOSFET. When the temperature is equal to or less than a threshold, the MOSFET and the bipolar-type transistor are both turned on. When the temperature exceeds the threshold, only the bipolar-type transistor is turned on. As a result of a configuration such as this, when the temperature of the bipolar-type transistor or the MOSFET increases and exceeds the threshold, parallel drive is not performed and only the bipolar-type transistor is turned on. Consequently, the MOSFET can be prevented from reaching an overheating state and loss can be reduced.

In addition, according to an aspect of the present disclosure, a current detection element detects a current that flows via the bipolar-type transistor. When the current is equal to or less than a threshold, the MOSFET and the bipolar-type transistor are both turned on. When the current exceeds the threshold, only the bipolar-type transistor is turned on. As a result of a configuration such as this, when an assumption that the temperature of the MOSFET is increasing is made as a result of the current that flows via the bipolar-type transistor exceeding the threshold, parallel drive is not performed and only the bipolar-type transistor is turned on. Consequently, the MOSFET can be prevented from reaching an overheating state and loss can be reduced.

In addition, according to an aspect of the present disclosure, the current detection element detects the current that flows via the bipolar-type transistor and (1) when the current is equal to or less than a first threshold in one polarity, the MOSFET and the bipolar-type transistor are both turned on. In addition, (2) when the current is equal to or less than a second threshold that is set to be higher than a first threshold correspondence value in another polarity, the MOSFET and the bipolar-type transistor are simultaneously turned on, and (3) when the current exceeds the second threshold, only the bipolar-type transistor is turned on. In addition, when the current exceeds the first threshold in one polarity, only the bipolar-type transistor is turned on.

That is, in response to cases in which a current amount that flows via the bipolar-type transistor differs as in (1) to (3), described above, switching in stages is performed such as by (1) parallel drive, (2) parallel drive only when the current indicates one polarity, and (3) driving of the bipolar-type transistor alone. As a result, the MOSFET can be prevented from reaching an overheating state.

In addition, according to an aspect of the present disclosure, the temperature detection element and the current detection element respectively detect the temperature of the bipolar-type transistor or the MOSFET and the current that flows via the transistor. Then, when a two-dimensional coordinate value that is determined based on the temperature and the current is equal to or less than a threshold that is set on the coordinate, the MOSFET and the bipolar-type transistor are both turned on. When the two-dimensional coordinate value exceeds the threshold, only the bipolar-type transistor is turned on.

As a result of a configuration such as this, a heat-generation state of the MOSFET is evaluated based on two parameters, the temperature of the bipolar-type transistor or the MOSFET and the current. When the two-dimensional coordinate value that is determined based on the temperature and the current exceeds the threshold, parallel drive is not performed and only the bipolar-type transistor is turned on. Consequently, the MOSFET can be reliably prevented from reaching an overheating state and loss can be reduced.

In addition, according to an aspect of the present disclosure, in a manner similar to the above-described disclosed aspect, the heat-generation state of the MOSFET is evaluated based on two parameters, the temperature of the bipolar-type transistor or the MOSFET and the current. When the two-dimensional coordinate value that is determined based on the temperature and the current exceeds the threshold, a drive voltage that is applied to the gate of the MOSFET that is driven in parallel is reduced and the MOSFET is turned on. As a result of a configuration such as this, a gate drive voltage of the MOSFET can be reduced based on an increase level of the temperature of the FET, and heat generation can be suppressed.

In addition, according to an aspect of the present disclosure, in a motor drive circuit, the circuit in which the bipolar-type transistor and the MOSFET are connected in parallel is configured as a single arm. When the temperature detection element detects the temperature of the bipolar-type transistor or the MOSFET and the current detection element detects a current that flows to the motor, a control circuit determines a driving state of the bipolar-type transistor and the MOSFET based on the magnitude of the temperature and the magnitude of the current. Then, the control circuit outputs a drive control signal to a transistor drive circuit that drives the bipolar-type transistor and the MOSFET. As a result of a configuration such as this, based on the temperature of the bipolar-type transistor or the MOSFET, and the current that flows to the motor, the control circuit determines the driving state of the two elements. Consequently, the MOSFET can be prevented from reaching an overheating state.

(Second Disclosure)

According to an aspect of the present disclosure, when a drive subject is that in which the bipolar-type transistor and the MOSFET are connected in parallel, to turn on and turn off the MOSFET, while the voltage that is applied to the gate of the MOSFET is changed between a positive-polarity high level and a negative-polarity low level, a period during which an intermediate level that is between both levels is applied as the voltage is provided.

As a result of a configuration such as this, an off-state of the MOSFET can be reliably maintained basically by the negative-polarity low-level voltage being applied to the gate. When the MOSFET is turned on, the voltage that is applied to the gate is changed to the positive-polarity high level after passing through a period during which the intermediate level is maintained. In addition, when the MOSFET is also turned off, the voltage is changed from the positive-polarity high level to the negative-polarity low level by passing through the period during which the intermediate level is maintained. Consequently, drive loss can be reduced by an amount amounting to the relative decrease in potential difference between the intermediate level and the high level.

In addition, according to an aspect of the present disclosure, a rising edge detection circuit and a falling edge detection circuit respectively edge-detect a rising edge and a falling edge of an input signal. A rising timer and a falling timer respectively count fixed amounts of time from when the rising edge and the falling edge are detected. An IGBT drive control unit applies a turn-on level voltage to the gate of the bipolar-type transistor by an IGBT drive circuit from when the rising edge is detected. When the fixed amount of time counted by the falling timer elapses from when the falling edge is detected, the IGBT drive control unit applies a turn-off level voltage.

A low-level application circuit, an intermediate level application circuit, and a high-level application circuit configuring a MOS drive circuit are respectively controlled by first, second, and third MOS drive control units. The first MOS drive control unit applies a low-level voltage to the gate of the MOSFET during a period in which the IGBT drive circuit is applying the turn-off level voltage. The second MOS drive control unit applies an intermediate-level voltage during a first period from when the rising edge is detected until the elapse of the fixed amount of time counted by the rising timer and a second period from when the falling edge is detected until the elapse of the fixed amount of time counted by the falling timer. The third MOS drive control unit applies a high-level voltage between the first period and the second period.

As a result of a configuration such as this, the first period and the second period in which the MOS drive circuit applies the intermediate-level voltage to the gate of the MOSFET can be respectively set within the period in which the bipolar-type transistor starts turn-on and within the period in which the bipolar-type transistor starts turn-off. Consequently, even when there is a likelihood that the MOSFET is turned on as a result of the intermediate-level voltage being applied, no issues arise whatsoever.

(Third Disclosure)

According to an aspect of the present disclosure, when the bipolar-type transistor is turned on, after the drive voltage of the transistor reaches a Miller voltage, turn-on of the MOSFET starts upon end of a Miller period and thereafter. That is, when the bipolar-type transistor is turned on, a period during which the drive current indicates a Miller voltage level during the process of increasing from low level to high level occurs. The drive voltage subsequently increases again towards high level. The time at which the drive voltage starts to increase again is immediately before turn-on of the bipolar-type transistor is completed. Consequently, as a result of turn-on of the MOSFET being started at this time and thereafter, turn-on of the MOSFET can be reliably made earlier than that in conventional technology. Loss reduction effect can be improved.

In addition, according to an aspect of the present disclosure, a gate rising-period detection circuit detects a rising-period until the drive current of the bipolar-type transistor rises to the turn-on level. During the rising-period, a gate voltage difference detection circuit operates synchronously with a clock signal of which a period is shorter than changing time of the drive voltage of the bipolar-type transistor, determines a difference between a current value of the drive voltage and a value at one period before, and outputs a difference detection signal when the difference is greater than a threshold voltage. During the rising-period, a charge period detection circuit outputs a charge period detection signal during a capacity charge period of the bipolar-type transistor from when a first output of the difference detection signal is stopped until when a second output is stopped.

An AND gate takes the logical AND of the difference detection signal, the charge period detection signal, and the clock signal. When the rising detection circuit detects rising of an output signal of the AND gate, the MOS drive circuit applies the turn-on level voltage to the gate of the MOSFET. When the falling detection circuit detects the falling of the input signal, the MOS drive circuit applies the turn-off level voltage. In this case, the gate rising-period detection circuit detects a period from when the rising detection circuit detects the rising of the input signal until the falling detection circuit detects the falling of the charge period detection signal as the rising-period.

When turn-on of the bipolar-type transistor is started and the drive voltage thereof reaches the Miller voltage, the drive voltage starts to increase again after maintaining a fixed level for a predetermined period. That is, the timing at which the difference detection signal is outputted while the charge period detection circuit is outputting the charge period detection signal is the timing at which the drive voltage starts to increase again from the Miller voltage. Therefore, as a result of a configuration such as this, turn-on of the MOSFET can be reliably started upon the end of the Miller voltage period.

(Fourth Disclosure)

According to an aspect of the present disclosure, the current detection element detects a current that flows via the bipolar-type transistor or the MOSFET. When the bipolar-type transistor or the MOSFET is turned off, when the current is equal to or less than a threshold, the MOSFET is turned off after the bipolar-type transistor is turned off. When the current exceeds the threshold, the bipolar-type transistor is turned off after the MOSFET is turned off.

In general, between the bipolar-type transistor and the MOSFET, the current capability of the former is higher. Therefore, turn-off in a state in which a large current is flowing is basically required to be carried out by the bipolar-type transistor. Here, the current that flows via the bipolar-type transistor or the MOSFET is detected and the magnitude of the current is evaluated based on a threshold with reference to the current capability of the FET.

When the current exceeds the threshold, the state is such that the current capability of the MOSFET is exceeded. Therefore, the MOSFET is turned off and the bipolar-type transistor is turned off thereafter, as in the past. Meanwhile, when the current is equal to or less than the threshold, the current is within a range that can be handled by the current capability of the MOSFET. Consequently, generation of tail current can be prevented and electric power loss can be reduced by the bipolar-type transistor being turned off first and the MOSFET being turned off thereafter.

In addition, according to an aspect of the present disclosure, the bipolar drive circuit and the MOS drive circuit apply the turn-on level voltage and the turn-off level voltage to the gates of the corresponding elements based on the level change in the input signal. A turn-on delay circuit is arranged on a path in which the input signal is received by the MOS drive circuit and delays the rising timing of the input signal. A first delay circuit is arranged on a path that branches from a path in which the input signal is directly received by the bipolar and MOS drive circuits, and delays the falling timing of the input signal. In addition, a second turn-off delay circuit is arranged on a path that branches from a path in which the input signal that has passed through the turn-on delay circuit is directly received by the bipolar and MOS drive circuits, and delays the falling timing of the input signal.

A comparator compares a terminal voltage of the current detection element and a voltage that corresponds to the threshold. A first selector is arranged on an input side of the bipolar drive circuit, and switches between a path in which the first turn-off delay circuit is interposed and a path in which the first turn-off delay circuit is not interposed. A second selector is arranged on an input side of the MOS drive circuit, and switches between a path in which the second turn-off delay circuit is interposed and a path in which the second turn-off delay circuit is not interposed. A set/reset (RS) flip-flop is set by an output signal of the comparator and reset by an output signal of the third turn-off delay circuit. Switching of the first and second selectors is performed by an output signal of the RS flip-flop.

As a result of a configuration such as this, when the detected current is equal to or less than the threshold, as a result of the second selector selecting the path that passes through the second delay circuit, the MOSFET is turned off after the bipolar-type transistor is turned off. When the current exceeds the threshold, as a result of the first selector selecting the path that passes through the first delay circuit, the bipolar-type transistor is turned off after the MOSFET is turned off.

(Fifth Disclosure)

According to an aspect of the present disclosure, when the bipolar-type transistor and the MOSFET are driven in parallel by PWM control, a carrier midpoint estimating unit estimates an intermediate time in the period of the carrier generating the received PWM signal. Then, an on-time adjusting unit adjusts an on-time of the MOSFET by the MOS drive circuit based on the estimated intermediate time. As a result of a configuration such as this, the timing at which turn-off of the MOSFET is started can be determined with the estimated intermediate time of the carrier period as a starting point. Therefore, the timing can be made earlier than that based on the PWM signal that is actually received. Consequently, the amount of time until turn-off is completed can be kept equal to that when only the bipolar-type transistor is driven, and controllability can be improved.

In addition, according to an aspect of the present disclosure, the carrier midpoint estimating unit counts a period from rising to falling of the PWM signal by a timer. A PWM width midpoint estimation circuit halves the counted timer value. Regarding consecutive first and second periods, when the value of the halved timer value is added to a current time indicated by a time detection counter circuit, a storage circuit stores the results as first and second data, respectively. Then, a carrier midpoint estimation circuit determines a difference between the first data and the second data, and sets a result of the second data being added to the difference as an estimation value of the intermediate time of the carrier period.

In a third period following the second period, the on-time adjusting unit can estimate an on-time width of the bipolar-type transistor from the rising of the PWM signal in the third period and the estimation value. Therefore, these are used when the MOSFET is turned on. As a result of a configuration such as this, the intermediate time of the carrier period can be appropriately estimated. The timing at which turn-off of the MOSFET is started can be made earlier such that the amount of time until turn-off is completed is equal to that when only the bipolar-type transistor is driven.

In addition, according to an aspect of the present disclosure, the on-time adjusting unit delays the rising timing of the PWM signal by an on-side delay circuit, and a pulse width estimation circuit estimates a pulse width of the PWM signal that is outputted to the bipolar-type transistor based on the rising timing of the PWM signal and the intermediate time received by the carrier midpoint estimation circuit. Then, a pulse width determination circuit sets a result of a predetermined value being subtracted from the pulse width estimated from the rising timing delayed by the on-side delay circuit as the on-time of the MOSFET in the third period, and turns on the MOSFET within a period before and after the intermediate time. As a result of a configuration such as this, the timing at which turn-off of the MOSFET is started can be made earlier such that the amount of time until turn-off is completed is equal to that when only the bipolar-type transistor is driven.

(Sixth Disclosure)

According to an aspect of the present disclosure, when the input signal becomes the turn-on level, the bipolar drive circuit applies the turn-on level voltage to the gate of the bipolar-type transistor after elapse of a first delay time. Then, when the input signal becomes the turn-off level, when a first drive method is selected in a selection circuit, the turn-off level voltage is applied to the gate after the elapse of the first delay time. When a second drive method is selected, the turn-off level voltage is applied to the gate upon elapse of an amount of time that is equal to or less than a difference time in which a second delay time that is set to be shorter than the first delay time is subtracted from the first delay time.

When the input signal becomes the turn-on level, the MOS drive circuit applies the turn-on level voltage to the gate of the MOSFET after the elapse of the second delay time after the elapse of the first delay time. Then, when the input signal becomes the turn-off level, when the first drive method is selected, the turn-off level voltage is applied to the gate upon elapse of an amount of time that is equal to or less than the difference time. When the second drive method is selected, the turn-off level voltage is applied to the gate after the elapse of the first delay time.

As a result of a configuration such as this, when the first drive method is selected, the on-period of the bipolar-type transistor is equal to a period in which the input signal is at the on-level. In addition, the MOSFET is turned on in a shorter period during the on-period of the bipolar-type transistor. Consequently, on-resistance can be reduced compared to that when the bipolar-type transistor is singly turned on.

Meanwhile, when the second drive method is selected, the period from when the bipolar-type transistor is turned on until the MOSFET is turned off is equal to or less than the period in which the input signal is at the on-level. In addition, because the MOSFET is turned off after the bipolar-type transistor is turned off, switching loss during turn-off can be reduced. In addition, when the bipolar-type transistor and the MOSFET that are connected in parallel are considered to be a single element, because the on-period of the element is equal to or less than the period in which the input signal is at the on-level in either drive method, decrease in controllability can be avoided.

In addition, according to an aspect of the present disclosure, a determination circuit determines whether or not the pulse width of the input signal is less than a predetermined threshold. Then, even when the second drive method is selected in the selection circuit, when the pulse width is less than the threshold, the bipolar drive circuit and the MOS drive circuit select the first drive method. As a result of a configuration such as this, when response through the second drive method becomes difficult because the pulse width of the input signal is short, controllability can be maintained by the first drive method being applied as an alternative.

BRIEF DESCRIPTION OF DRAWINGS

The above-described object, other objects, characteristics, and advantages of the present disclosure will be further clarified through the following detailed description, with reference to the accompanying drawings. The drawings are as follows.

DESCRIPTION OF EMBODIMENTS

<First Disclosure>

First Embodiment

Figure 1:
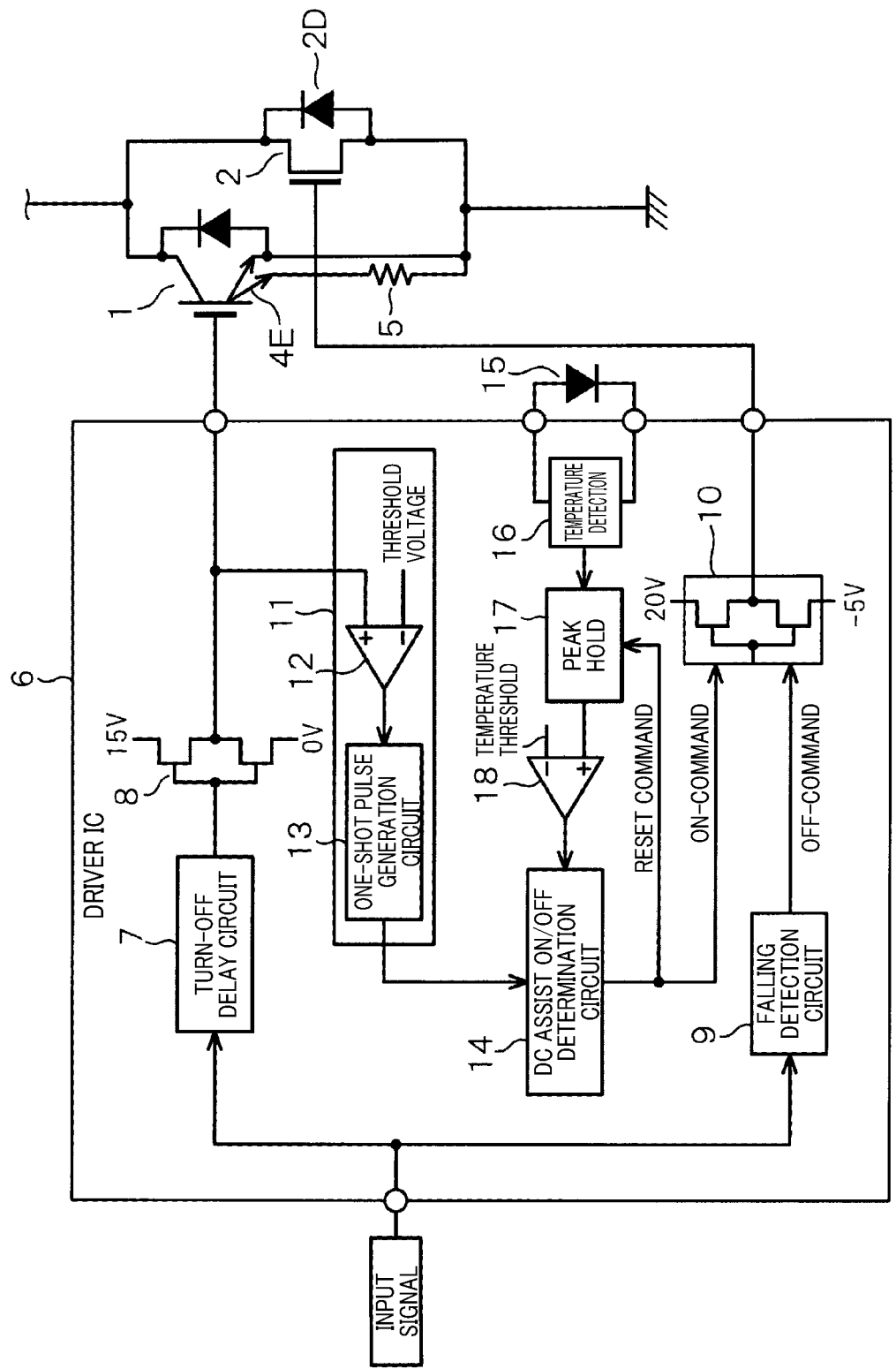
FIG. 1 is a functional block diagram of a configuration of a driver IC according to a first embodiment corresponding to a first disclosure.

As shown in FIG. 1, a collector and an emitter of an RC-IGBT 1 and a drain and a source of a SiC-MOSFET 2 are respectively commonly connected. For example, the collector of the IGBT 1 and the drain of the FET 2 are connected to an element on an upper arm side (not shown) that is configured by elements that are similarly connected in parallel. The emitter of the IGBT 1 and the source of the FET 2 are connected to ground.

A detection element for dividing the flow of a collector current and detecting the collector current is provided in the IGBT 1. However, in FIG. 1, only an emitter terminal 4E of the detection element is shown. The emitter terminal 4E is connected to the ground by a resistor 5. In addition, a reverse-direction parasitic diode 2D is connected between the drain and the source of the FET 2.

A signal that controls driving of the IGBT 1 is received by a driver IC 6 from a control circuit (not shown). The input signal is received by an IGBT drive circuit 8 via a turn-off delay circuit 7. When the level of the input signal changes from high to low that is a turn-off level, the turn-off delay circuit 7 changes the signal that is outputted to the IGBT drive circuit 8 to low level upon elapse of a fixed delay time.

For example, the IGBT drive circuit 8 is configured by a series circuit of two MOSFETs. For example, the IGBT drive circuit 18 outputs 15 V as a high-level drive voltage and 0 V as a low-level drive voltage to a gate of the IGBT 1. Here, for convenience of description, the IGBT drive circuit 8 is that which outputs the low-level drive voltage when the input signal is low level and outputs the high-level drive voltage when the input signal is high level.

In addition, the drive control signal is received by a falling detection circuit 9. An output signal of the falling detection circuit 9 is received as an off-command of an MOS drive circuit 10. The MOS drive circuit 10 is also similarly configured by a series circuit of two MOSFETs. For example, the MOS drive circuit 10 outputs 20 V as the high-level drive voltage and −5 V as the low-level drive voltage to the gate of the FET 2.

An input terminal of an IGBT gate rising determination circuit 11 is connected to the gate of the IGBT 1. The rising determination circuit 11 is configured by a comparator 12 and a one-shot pulse generation circuit 13. The comparator 12 outputs a trigger signal to the one-shot pulse generation circuit 13 when a gate voltage of the IGBT 1 exceeds a threshold voltage. The one-shot pulse generation circuit 13 outputs a one-shot pulse signal to a DC assist ON/OFF determination circuit 14 when the trigger signal is received.

A temperature-sensitive diode 15 that is composed of SiC in a manner similar to the FET 2 is connected to the driver IC 6. The temperature-sensitive diode 15 detects the temperature near the FET 2. A temperature detecting unit 16 detects a forward-direction voltage of the temperature-sensitive diode 15 and outputs, to a peak hold circuit 17, a temperature detection voltage of which the level linearly changes based on the forward-direction voltage. The peak hold circuit 17 holds a peak value of the detection voltage outputted by the temperature detecting unit 16 and inputs the peak value to a non-inverting input terminal of a comparator 18. The non-inverting input terminal of the comparator 18 is provided with a temperature threshold. An output signal of the comparator 18 is received by an ON/OFF determination circuit 14.

The ON/OFF determination circuit 14 provides an on-command signal to the MOS drive circuit 10. In addition, the ON/OFF determination circuit 14 outputs, as a one-shot pulse, a reset command to the peak hold circuit 17. When the on-command signal is provided by the ON/OFF determination circuit 14, the MOS drive circuit 10 sets the gate of the FET 2 to high level and maintains this state until an off-command signal is provided by a rising detection circuit 9. Then, when the off-command signal is provided, the MOS drive circuit 10 sets the gate of the FET 2 to low level.

Figure 2:
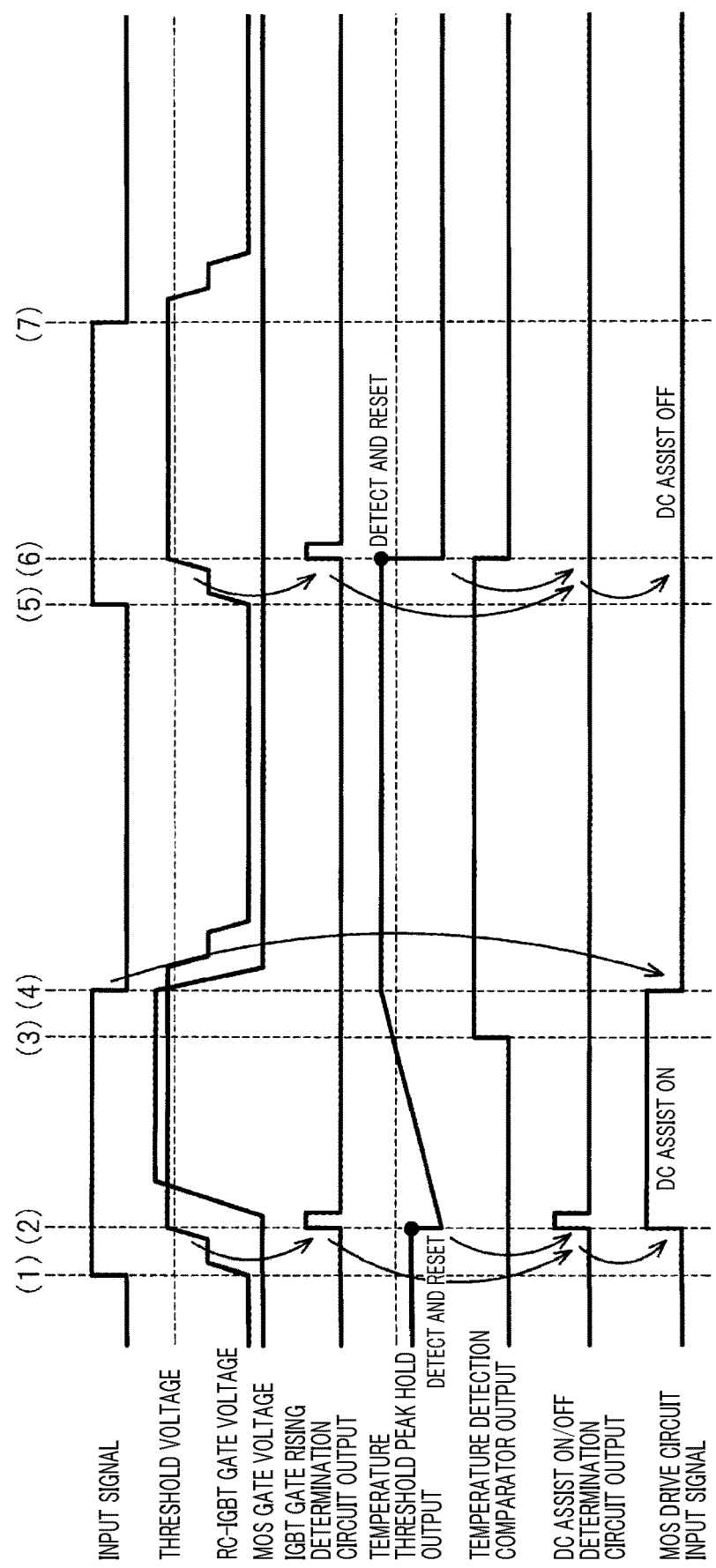
FIG. 2 is an operation timing chart of the driver IC.

Next, operations according to the present embodiment will be described. As shown in FIG. 2, when the input signal changes to high level at time point (1), the gate voltage of the IGBT 1 starts to increase. When the gate voltage exceeds a threshold voltage at time point (2), the rising determination circuit 11 outputs the one-shot pulse. When the level held by the peak hold circuit 17 until immediately before time point (2) is below a temperature threshold of the comparator 18, the ON/OFF determination circuit 14 outputs the on-command to the MOS drive circuit 10. As a result, the gate voltage of the FET 2 starts to increase. The FET 2 is turned ON simultaneously with the IGBT 1, and "DC assist" is performed.

After the hold level of the peak hold circuit 17 is reset at time point (2), the temperature detected by the temperature-sensitive diode 15 increases as a result of the FET 2 being turned on. Then, when the temperature exceeds the threshold temperature at time point (3), the output signal of the comparator 18 changes to high level. Subsequently, when the input signal becomes low level at time point (4), at the falling, the off command is received by the MOS drive circuit 10 and the FET 2 starts turn-off. In addition, a voltage level corresponding to the temperature detected by the temperature-sensitive diode 15 at this time is held by the peak hold circuit 17. Furthermore, turn-off of the IGBT 1 is started after the elapse of the delay time provided by the turn-off delay circuit 7, from time (4).

At time point (5), an on-operation of the IGBT 1 of a next cycle is started. The gate voltage of the IGBT 1 increases.

The gate voltage exceeds the threshold voltage at time point (6). However, the level held by the peak hold circuit 17 until immediately therebefore exceeds the temperature threshold of the comparator 18. In this case, even when the rising determination circuit 11 outputs the one-shot pulse, the ON/OFF determination circuit 14 does not output the on-command. Therefore, the gate voltage of the FET 2 remains 0 V and "DC assist" is not performed.

Figure 3:
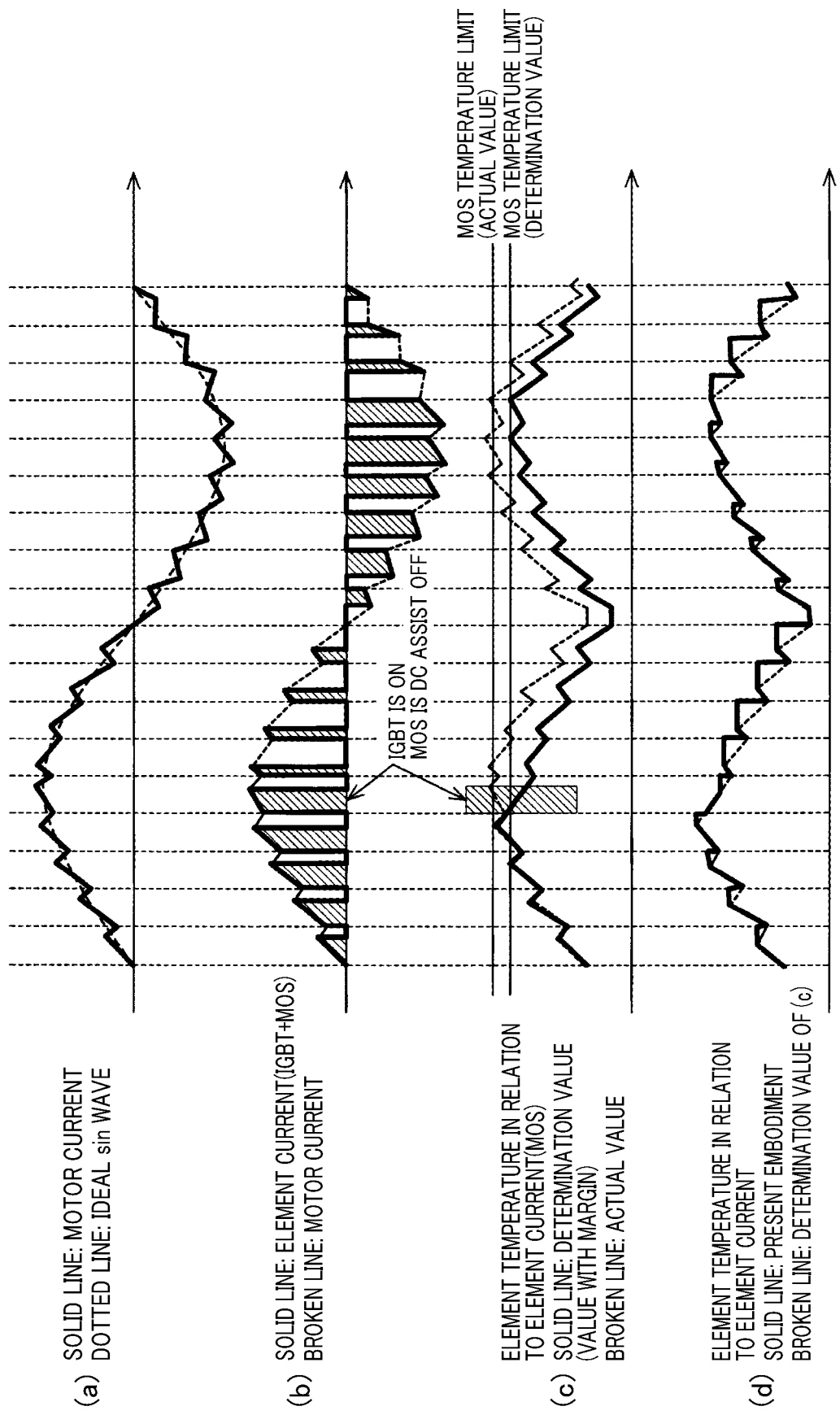
FIG. 3 is a waveform diagram of changes in currents and temperatures.

Here, for example, a motor being driven by PWM control by an inverter circuit in which a parallel element of the IGBT 1 and the FET 2 configures a single arm is assumed. As shown in FIG. 3, when a sine-wave-like current is sent to the motor, when DC assist is performed at each PWM period, the temperature of the FET 2 increases during a period in which PWM duty indicates a high value and may exceed a limit value as indicated by a broken line.

In this regard, as a result of the driver IC 6 operating as according to the present embodiment, DC assist is not performed when the temperature of the FET 2 nears a limit as an actual value. Therefore, temperature increase in the FET 2 can be suppressed.

As described above, according to the present embodiment, the temperature of the FET 2 is detected by the diode 15. When the temperature is equal to or less than the threshold, the FET 2 and the IGBT 1 are both turned on, and DC assist is performed. When the temperature exceeds the threshold, only the IGBT 1 is turned on. Specifically, the IGBT drive circuit 8 applies a turn-on level voltage and a turn-off level voltage to the gate of the IGBT 1 based on level changes in the signal received via the turn-off delay circuit 8. The MOS drive circuit 1 applies the turn-on level voltage and the turn-off level voltage to the gate of the FET 2.

When the peak value of the voltage signal outputted by the temperature detecting unit 16 based on the temperature detected by the diode 15 is held by the peak hold circuit 17, the comparator 18 compares the peak value to a threshold. Then, during the period in which the IGBT 1 is turned on, when the gate drive voltage of the IGBT 1 exceeds the threshold voltage, the IGBT gate rising determination circuit 11 outputs the trigger signal.

When the trigger signal is received, the DC assist ON/OFF determination circuit 14 determines whether or not to turn on the FET 2 based on the comparison result of the comparator 18. The falling detection circuit 9 detects a falling edge of the input signal and outputs the off-command to turn off the FET 2 by the MOS drive circuit 10. That is, when the temperature of the FET 2 increases and exceeds the threshold, parallel drive is not performed and only the IGBT 1 is turned on. The FET 2 can be prevented from reaching an overheating state and loss can be reduced.

Second Embodiment

Figure 4:
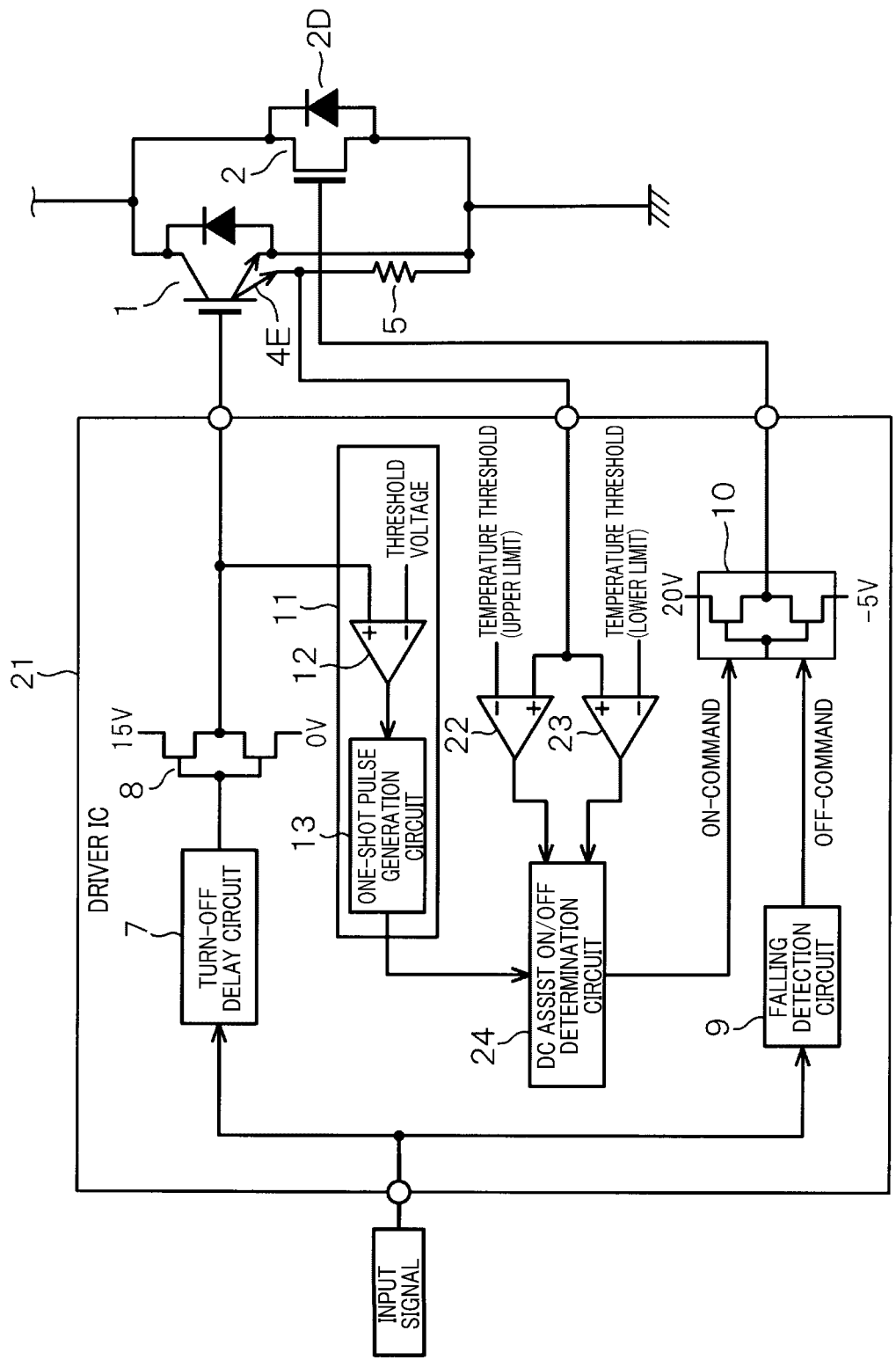
FIG. 4 is a second embodiment and a functional block diagram of a configuration of a driver IC.

Hereafter, sections that are identical to those according to the first embodiment are given the same reference numbers and the descriptions are omitted. Differing sections will be described. As shown in FIG. 4, in a driver IC 21 according to a second embodiment, the temperature-sensitive diode 15 to the peak hold circuit 17 that are the configuration for detecting the temperature of the FET 2 are eliminated. In addition, comparators 22 and 23, as well as an ON/OFF determination circuit 24 that replaces the ON/OFF determination circuit 14, are provided.

The non-inverting input terminals of the comparators 22 and 23 are connected to the emitter terminal 4E of a current detection element provided in the IGBT 1. A current threshold (upper limit) and a current threshold (lower limit) are respectively applied to the inverting input terminals of the comparators 22 and 23. In addition, the output signals of the comparators 22 and 23 are both received by the ON/OFF determination circuit 24.

Figure 5:
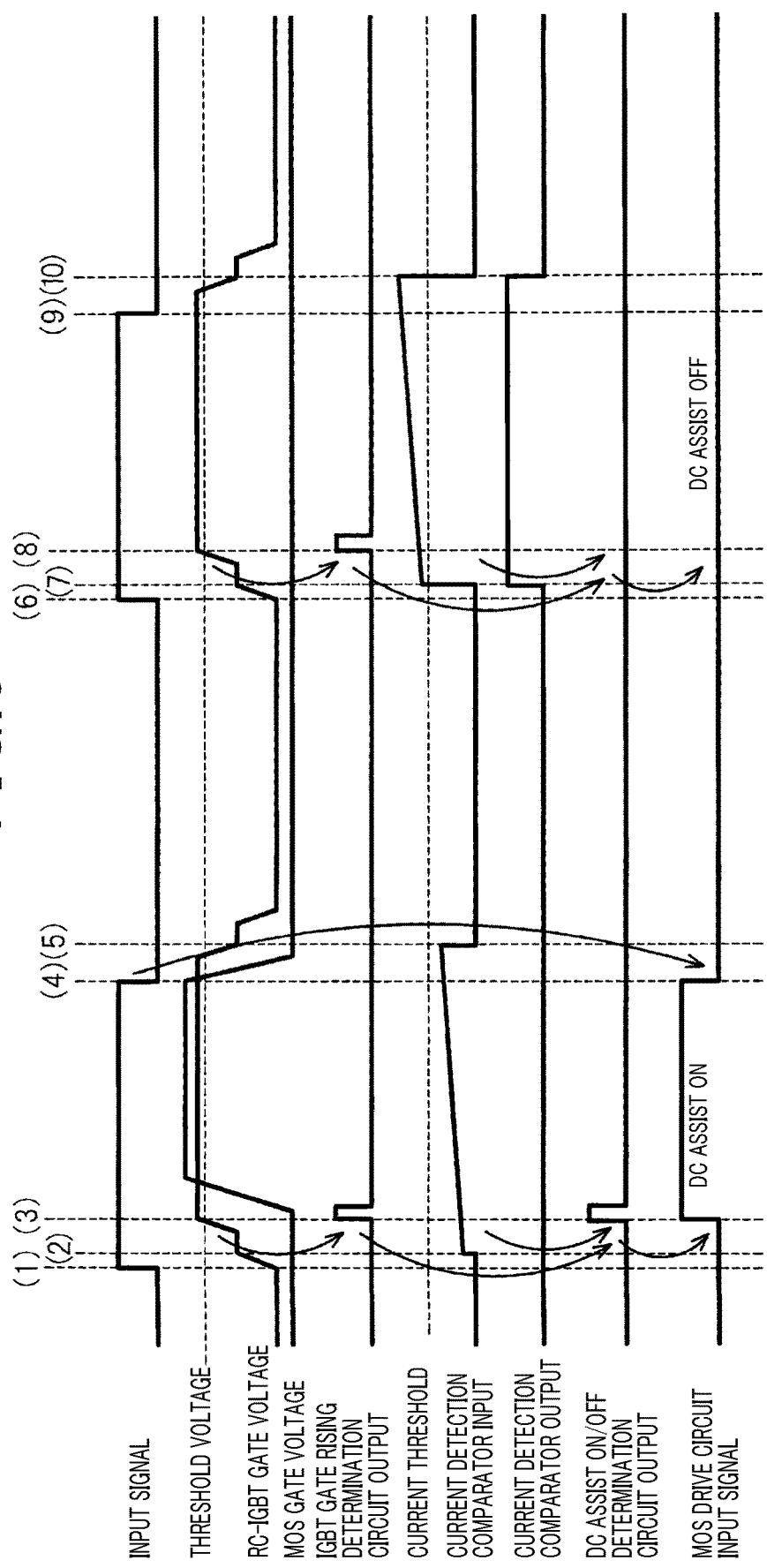
FIG. 5 is an operation timing chart of the driver IC.

Next, workings according to the second embodiment will be described. As shown in FIG. 5, when the input signal changes to high level and the gate voltage of the IGBT 1 starts to increase at time point (1), and the gate voltage reaches a Miller voltage at time point (2), the collector current starts to flow to the IGBT 1. As a result, a terminal voltage of the resistor 5 that is received by the comparator 18 increases. When the gate voltage exceeds the threshold voltage and the rising determination circuit 11 outputs the one-shot pulse at time point (3), if the terminal voltage of the resistor 5 has not reached the current threshold, the ON/OFF determination circuit 24 outputs the on-command to the MOS drive circuit 10. As a result, the FET 2 is turned on simultaneously with the IGBT 1, and "DC assist" is performed.

Subsequently, when the input signal of the driver IC 21 becomes low level at time point (4), the input signal of the MOS drive circuit 10 becomes low level. As a result, when the gate voltage of the IGBT 1 reaches the Miller voltage at time point (5) after turn-off of the IGBT 1 is started, conduction of the collector current is stopped.

At time point (6), the turn-on operation of the IGBT 1 of the next cycle is started and the gate voltage increases again. When the gate voltage reaches the Miller voltage at time point (7), the collector current starts to flow. When the rising determination circuit 11 outputs the one-shot pulse at time point (8), if the terminal voltage of the resistor 5 exceeds the current threshold, the ON/OFF determination circuit 24 does not output the on-command to the MOS drive circuit 10. Therefore, "DC assist" is not performed.

Figure 6:
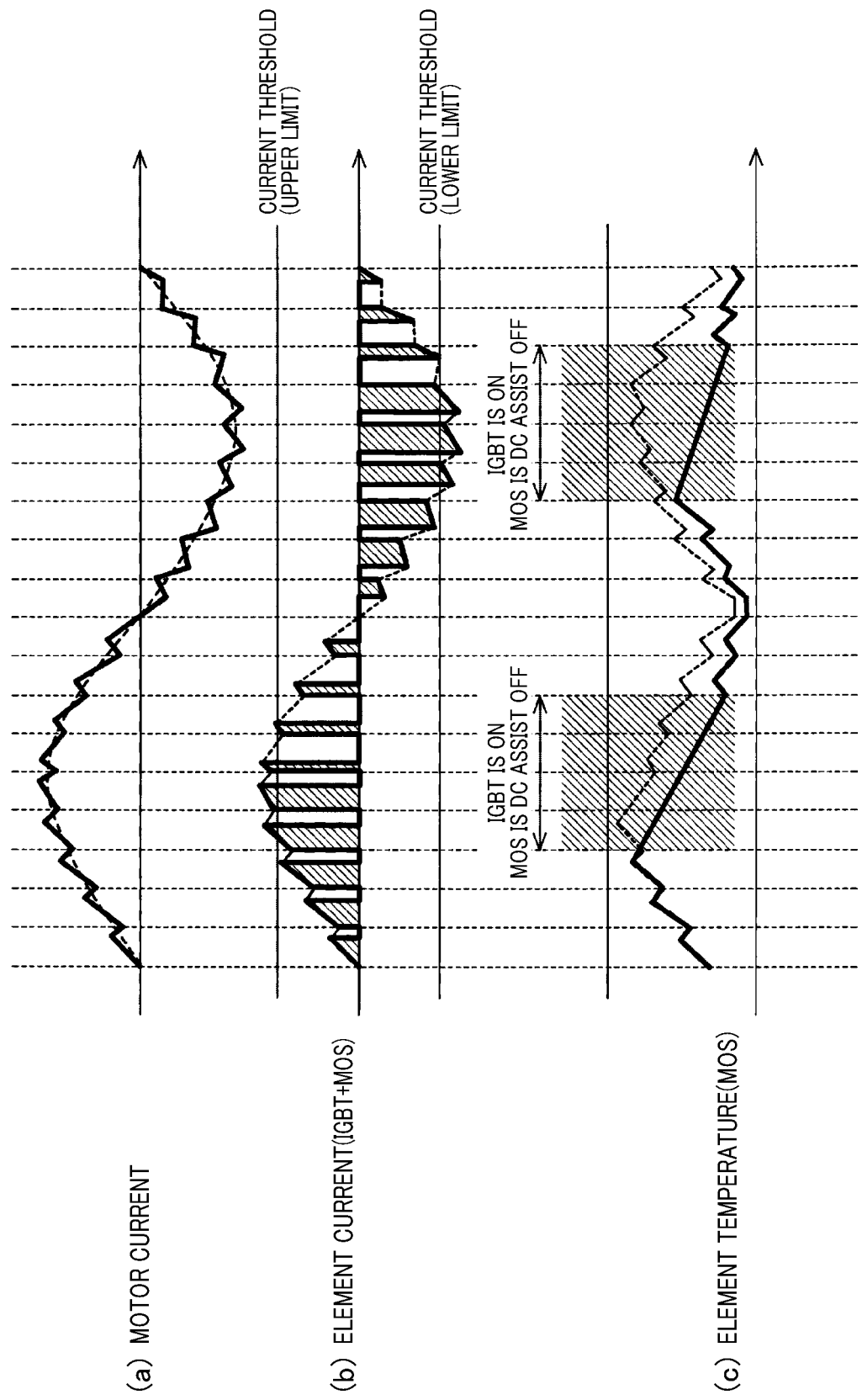
FIG. 6 is a waveform diagram of changes in currents and temperatures.

As shown in FIG. 6, when the sine-wave-like current is sent to the motor in a manner similar to that according to the first embodiment, as a result of the driver IC 21 operating as according to the second embodiment, DC assist is not performed when the collector current flowing to the IGBT 1 exceeds a current conversion value that corresponds to a temperature limit of the FET 2. Therefore, temperature increase in the FET 2 can be suppressed. In addition, according to the second embodiment, the current threshold (upper limit) and the current threshold (lower limit) are respectively set in the comparators 22 and 23. Therefore, the ON/OFF determination circuit 24 can similarly determine whether or not to perform DC assist regardless of whether the polarity of the collector current is positive or negative.

As described above, according to the second embodiment, the current that flows via the IGBT 1 is detected by the resistor 5. When the current is equal to or less than a threshold, the FET 2 and the IGBT 1 are both turned on. When the current exceeds the threshold, only the IGBT 1 is turned on. Specifically, the comparators 22 and 23 that compare the terminal voltage of the resistor 5 to a threshold, the rising determination circuit 11 that outputs a trigger signal when the gate drive voltage exceeds the threshold voltage during the period in which the IGBT 1 is turned on, and the ON/OFF determination circuit 24 that determines whether or not to turn on the FET 2 based on the comparison results of the comparators 22 and 23 are provided. As a result of a configuration such as this, when an assumption that the temperature of the FET 2 is increasing is made as a result of the current flowing via the IGBT 1 exceeding the threshold, DC assist is not performed and only the IGBT 1 is turned on.

The FET 2 can be prevented from reaching an overheating state and loss can be reduced.

Third Embodiment

Figure 7:
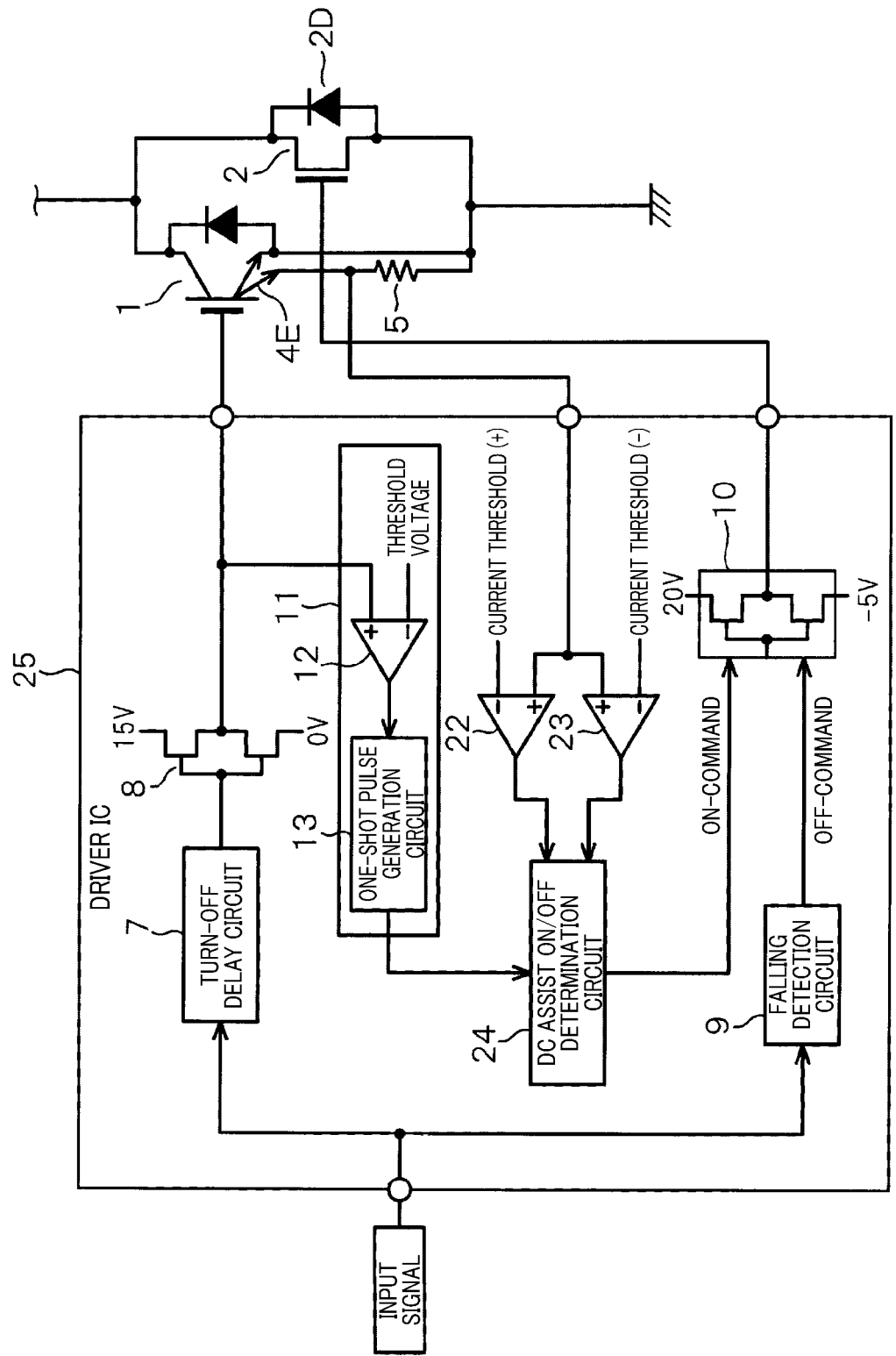
FIG. 7 is a third embodiment and a functional block diagram of a configuration of a driver IC.

As shown in FIG. 7, a driver IC 25 according to a third embodiment basically has the same configuration as the driver IC 21 according to the second embodiment. However, the current thresholds applied to the inverting input terminals of the comparators 22 and 23 differ from those according to the second embodiment. A current threshold (+) is applied to the inverting input terminal of the comparator 22 and a current threshold (−) is applied to the inverting input terminal of the comparator 23.

The current threshold (+) is a threshold that corresponds to when the polarity of the detection current is positive and is a value that corresponds to the current threshold (upper limit) according to the second embodiment. Meanwhile, the current threshold (−) is a threshold that corresponds to when the polarity of the detection current is negative. When absolute values of both thresholds are compared,

|current threshold(+)|<|current threshold(−)| is established. In this case, the current threshold (+) corresponds to a first threshold and the current threshold (−) corresponds to a second threshold.

Next, workings according to the third embodiment will be described. According to the second embodiment, as shown in FIG. 6, the absolute values of the current threshold (upper limit) corresponding to the positive side and the current threshold (lower limit) corresponding to the negative side are the same. In contrast, according to the third embodiment, as a result of the difference in absolute value being provided between the current threshold (+) and the current threshold (−), workings based on current polarity are asymmetrical.

Figure 8:
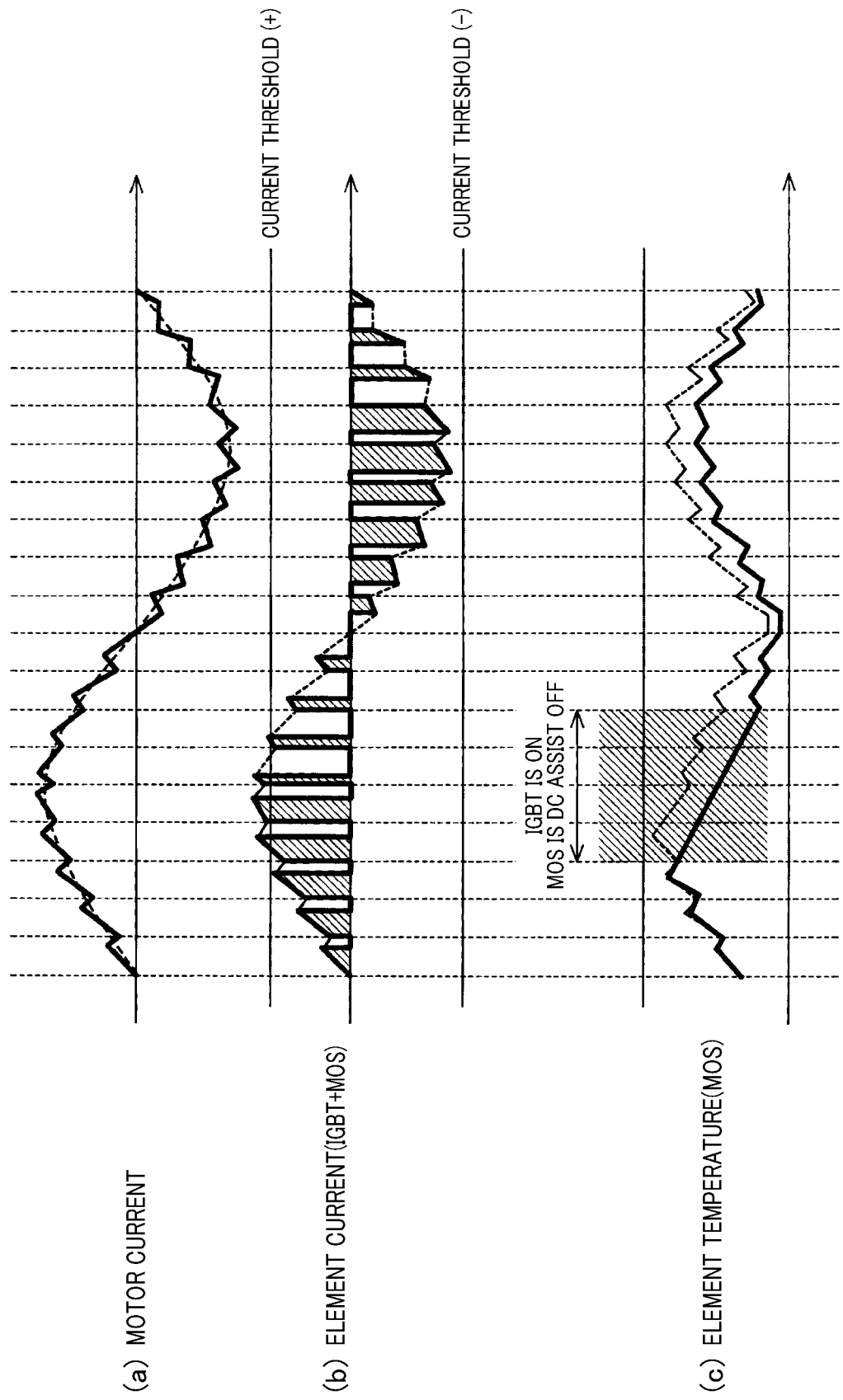
FIG. 8 is a waveform diagram of changes in currents and temperatures.

That is, as shown in FIG. 8, in the case in which the polarity of the current is negative, DC assist is performed up to an area in which the current value is higher than that in the case in which the polarity is positive. That is, in the case in which the polarity of the current is negative, opportunities to perform "DC assist" increase by an amount amounting to the difference in absolute value {|current threshold (−)|−|current threshold (+)|} between both cases.

As described above, according to the third embodiment, the current that flows via the IGBT 1 is detected by the resistor 5. (1) When the current is equal to or less than the first threshold in one polarity, the MOSFET and the IGBT 1 are both turned on. (2) When the current is equal to or less than the second threshold that is set to be higher than the value corresponding to the first threshold in the other polarity, the IGBT 1 and the FET 2 are simultaneously turned on. (3) When the current exceeds the second threshold, only the IGBT 1 is turned on. In addition, when the current exceeds the first threshold when one polarity is indicated, only the IGBT 1 is turned on.

That is, in response to cases in which the current amount that flows via the IGBT 1 differs such as in (1) to (3), described above, switching in stages is performed such as by (1) parallel drive, (2) parallel drive only when the current indicates one polarity, and (3) driving of the IGBT 1 alone. As a result, the FET 2 can be prevented from reaching an overheating state. Here, as a result of the relationship between the absolute values of the two thresholds being reversed,

|current threshold(+)|>|current threshold(−)| the current threshold (−) may correspond to the first threshold and the current threshold (+) may correspond to the second threshold.

Fourth Embodiment

Figure 9:
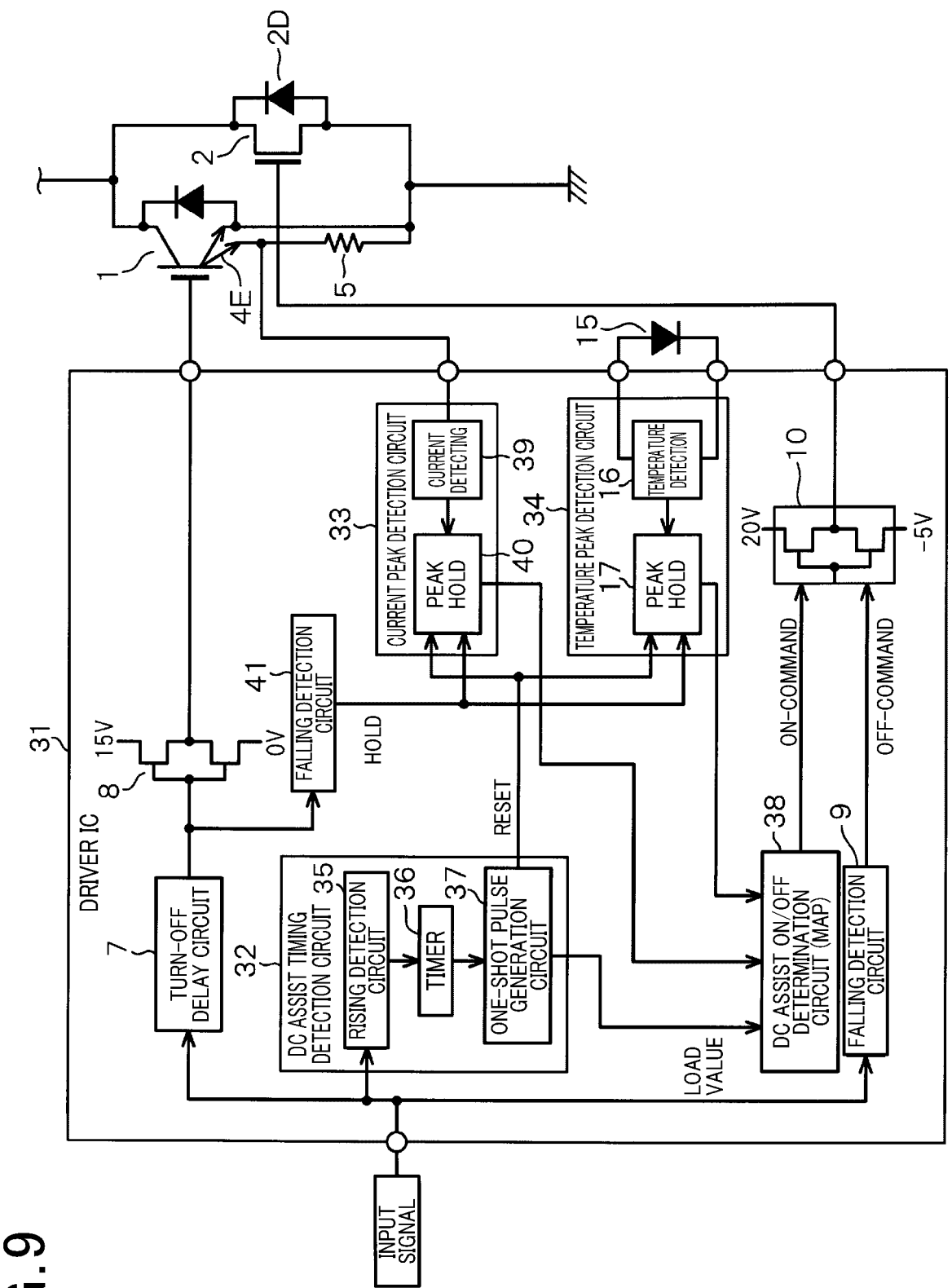
FIG. 9 is a fourth embodiment and a functional block diagram of a configuration of a driver IC.

As shown in FIG. 9, a driver IC 31 according to a fourth embodiment includes the temperature-sensitive diode 15, the temperature detecting unit 16, and the peak hold circuit 17 used according to the first embodiment. The driver IC 31 also includes a DC assist timing detection circuit 32 and a current peak detection circuit 33. However, according to the fourth embodiment, the temperature of the IGBT 1 is detected by the temperature-sensitive diode 15. In addition, the temperature-sensitive diode 15, the temperature detecting unit 16, and the peak hold circuit 17 configure a temperature peak detection circuit 34.

The DC assist timing detection circuit 32 has a rising detection circuit 35, a timer 36, and a one-shot pulse generation circuit 37. An input signal from an external source is received by the rising detection circuit 35. In the DC assist timing detection circuit 32, when the rising detection circuit 35 detects the rising of the input signal, the timer 36 starts counting. When the timer 36 counts a fixed amount of time, a trigger signal is received by the one-shot pulse generation circuit 37. Then, the one-shot pulse generation circuit 37 inputs a one-shot pulse signal to a DC assist ON/OFF determination circuit 38.

The current peak detection circuit 33 has a current detecting unit 39 and a peak hold circuit 40. An input terminal of the current detecting unit 39 is connected to the emitter terminal 4E. The current detecting unit 39 detects the terminal voltage of the resistor 5 that reflects the collector current value of the IGBT 1 and inputs the terminal voltage to the peak hold circuit 40. The peak hold circuit 40 holds the peak value of the received voltage level and inputs the held value to the DC assist ON/OFF determination circuit 38. The peak value of the voltage level held by the peak hold circuit 17 in the temperature peak detection circuit 34 is also similarly received by the DC assist ON/OFF determination circuit 38.

When the falling edge of an input signal that is received via the turn-off delay circuit 7 is detected, a falling detection circuit 41 inputs a trigger signal for holding the peak value to the peak hold circuits 17 and 40. Then, the one-shot pulse signal that is outputted from the one-shot pulse generation circuit 37 is received by the peak hold circuits 17 and 40 as a reset signal.

Figure 10:
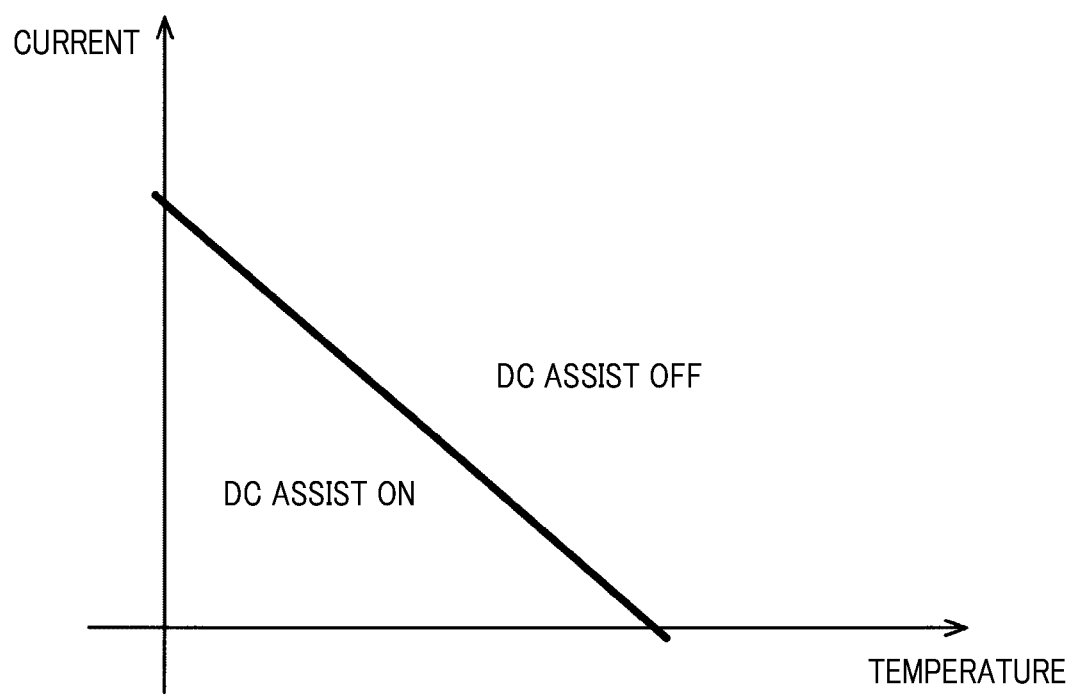
FIG. 10 is a diagram of an example of a determination map used by a DC assist ON/OFF determination circuit.

The DC assist ON/OFF determination circuit 38 holds a determination map shown in FIG. 10 to determine whether or not to output the on-command to the MOS drive circuit 10. The determination map is that in which a threshold for determining whether or not to perform DC assist is set by, for example, a linear function on a two-dimensional coordinate in which the temperature is a horizontal axis and the current is a vertical axis. The ON/OFF determination circuit 38 outputs the on-command and performs DC assist when a two-dimensional coordinate value prescribed by the peak values of the current and the temperature received by the current peak detection circuit 33 and the temperature peak detection circuit 34 is within a range that is equal to or less than a linear threshold, and determines that DC assist is not performed when the threshold is exceeded.

Figure 11:
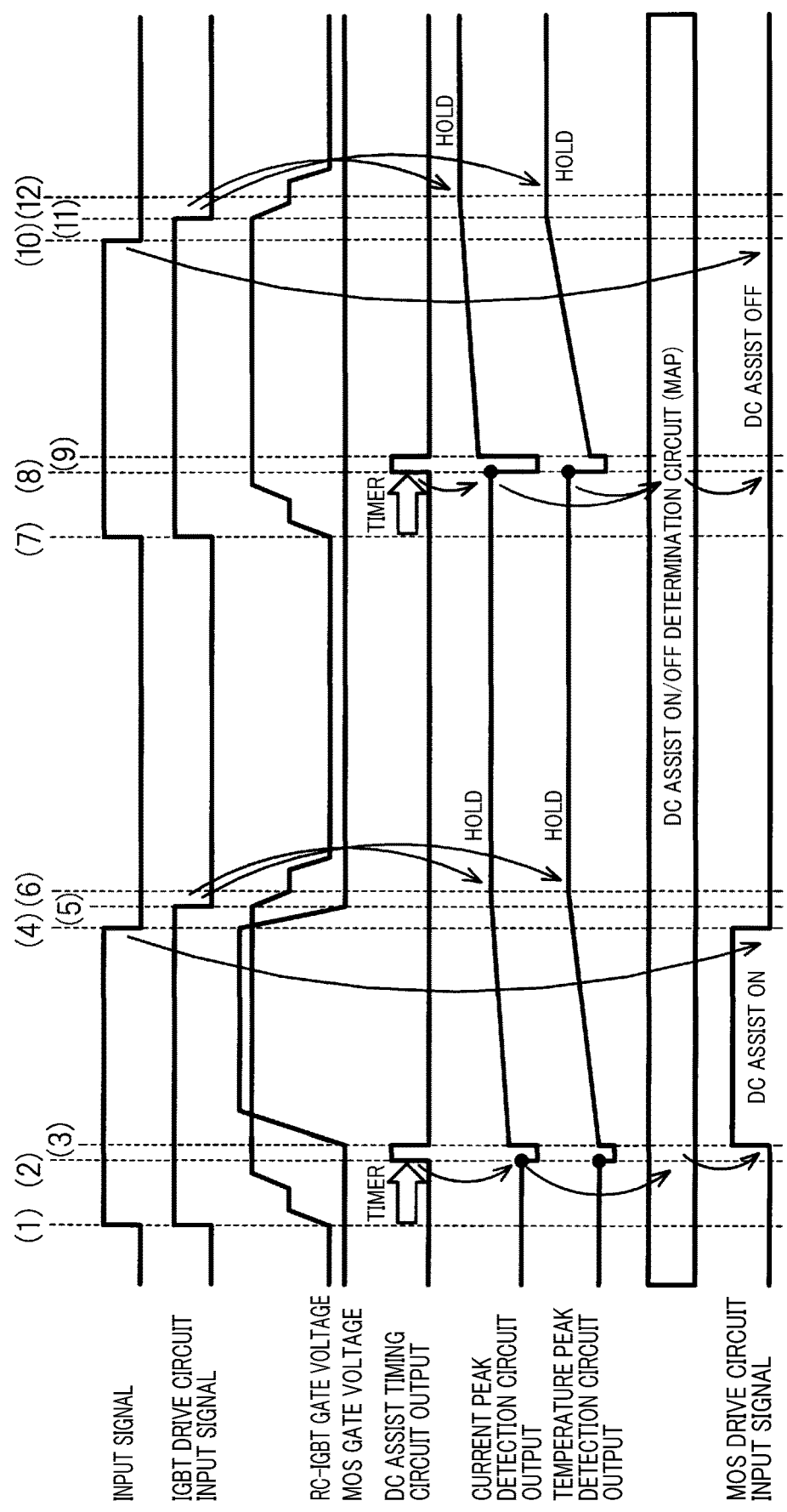
FIG. 11 is an operation timing chart of the driver IC.

Next, workings according to the fourth embodiment will be described. As shown in FIG. 11, when the input signal changes to high level and turn-on of the IGBT 1 is started at time point (1), the timer 36 of the DC assist timing detection circuit 32 starts counting. After turn-on of the IGBT 1 is completed, when the fixed amount of time is counted at time point (2), the one-shot pulse generation circuit 37 outputs the one-shot pulse signal. Then, the DC assist ON/OFF determination circuit 38 determines whether or not to perform DC assist based on the current value and the temperature value that is received at this time, that is, already being held, based on the above-described map. In addition, the peak holds 17 and 40 are reset. In this case, the current value and the temperature value are both small, and the two-dimensional coordinate value falls below the threshold. Therefore, at time point (3), the FET 2 is turned on and DC assist is performed.

As a result of turn-on of the IGBT 1 being completed and the collector current flowing, the current and the temperature detected by the current peak value detection circuit 33 and the temperature peak value detection 34 increase. Subsequently, when the input signal becomes low level at time point (4), at the falling of the input signal, the off-command is received by the MOS drive circuit 10. When turn-off of the IGBT 1 is started at the next time point (5), the peak hold circuits 40 and 17 of the current peak value detection circuit 33 and the temperature peak value detection circuit 34 perform peak hold at the falling of the gate signal (time point (6)).

At time point (7), turn-on of the IGBT 1 of the next cycle is started. After turn-on is completed, when the fixed amount of time is counted at time point (8), the one-shot pulse generation circuit 37 outputs the one-shot pulse signal. Then, the DC assist ON/OFF determination circuit 38 determines whether or not to perform DC assist based on the current value and the temperature value received at this time. In this case, the current value and the temperature value are both large, and the two-dimensional coordinate value exceeds the threshold. Therefore, DC is not performed at time point (9).

As described above, according to the fourth embodiment, the temperature of the IGBT 1 is detected by the temperature-sensitive diode 15. The current corresponding to the collector current that flows via the IGBT 1 is detected by the resistor 5. In addition, when the two-dimensional coordinate value that is determined based on the temperature and the current is equal to or less than the threshold that is set on the coordinate, the FET 2 and the IGBT 1 are both turned on. When the two-dimensional coordinate value exceeds the threshold, only the IGBT 1 is turned on.

Specifically, when the falling detection circuit 41 detects the falling of the signal that is received via the turn-off delay circuit 7, the temperature peak detection circuit 34 detects the peak value of the temperature detected by the temperature-sensitive diode 15. The current peak detection circuit 33 detects the peak value of the current detected by the resistor 5. In the DC assist timing detection circuit 32, when the rising detection circuit 35 detects the rising of the input signal and outputs the trigger signal, the timer 36 starts counting of the fixed amount of time. When the fixed amount of time is counted, the one-shot pulse generation circuit 37 outputs the one-shot pulse signal. Then, when the one-shot pulse signal is received, the DC assist ON/OFF determination circuit 38 compares the two-dimensional coordinate value determined by the peak values of the temperature and the current and the threshold, and determines whether or not to turn on the FET 2. As a result of a configuration such as this, whether or not to perform DC assist can be more precisely determined based on the two parameters that are the temperature and the current of the IGBT 1.

Fifth Embodiment

Figure 12:
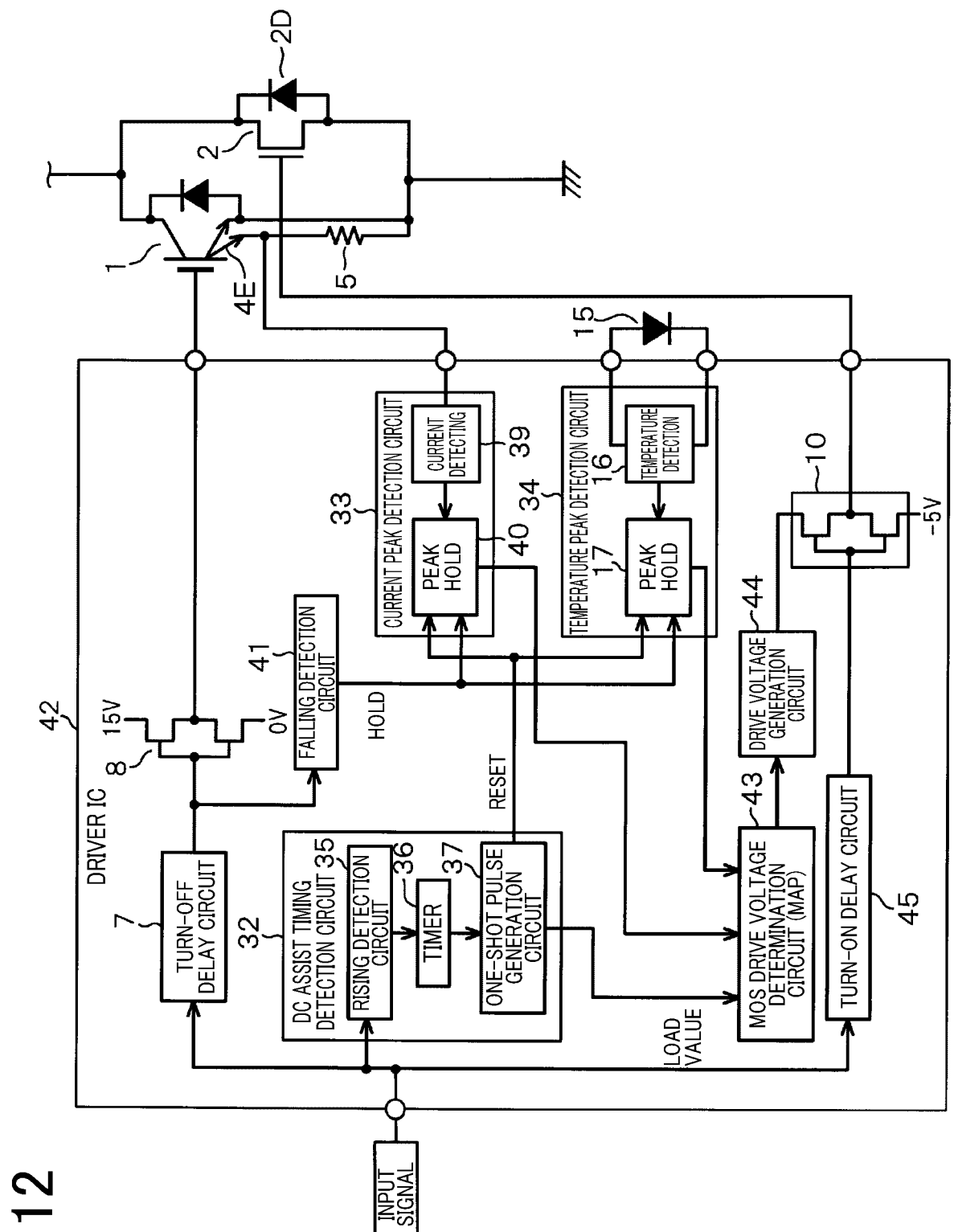
FIG. 12 is a fifth embodiment and a functional block diagram of a configuration of a driver IC.

As shown in FIG. 12, in a driver IC 42 according to a fifth embodiment, the DC assist ON/OFF determination circuit 38 provided in the driver IC 31 according to the fourth embodiment is replaced by a MOS drive voltage determination circuit 43. In addition, a high-level drive voltage to the MOS drive circuit 10 is supplied by a drive voltage generation circuit 44. Furthermore, the on/off-command to the MOS drive circuit 10 is provided by an input signal via a turn-on delay circuit 45 that replaces the rising detection circuit 9.

Figure 13:
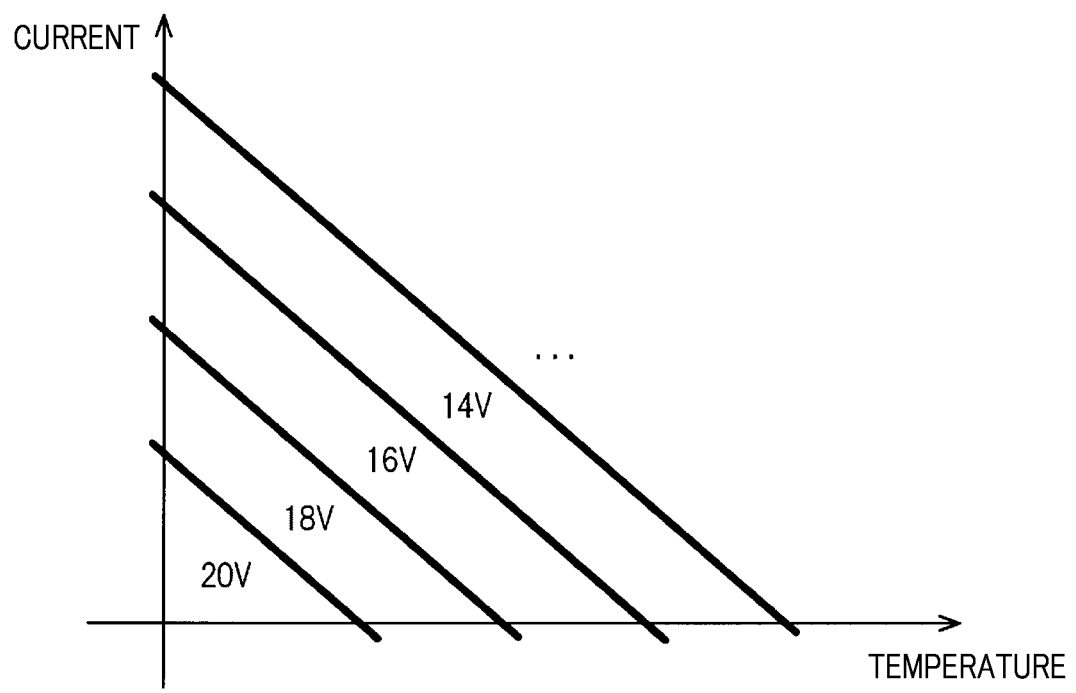
FIG. 13 is a diagram of an example of a determination map used by an MOS drive voltage determination circuit.

The drive voltage generation circuit 44 is configured to be capable of changing the high-level drive voltage that is supplied to the MOS drive circuit 10. The MOS drive voltage determination circuit 43 holds a determination map shown in FIG. 13 to determine the high-level drive voltage to be supplied to the MOS drive circuit 10. In a manner similar to the map according to the fourth embodiment, this determination map sets thresholds for changing the drive voltage level in stages, such as by 2 V, on a two-dimensional coordinate in which the temperature is the horizontal axis and the current is the vertical axis. A maximum voltage that corresponds to an area in which the temperature and the current are the lowest is 20 V. From 20 V, the drive voltage decreases in stages, such as 18 V, 16 V, 14 V, . . . , as the temperature and the current increase.

Figure 14:
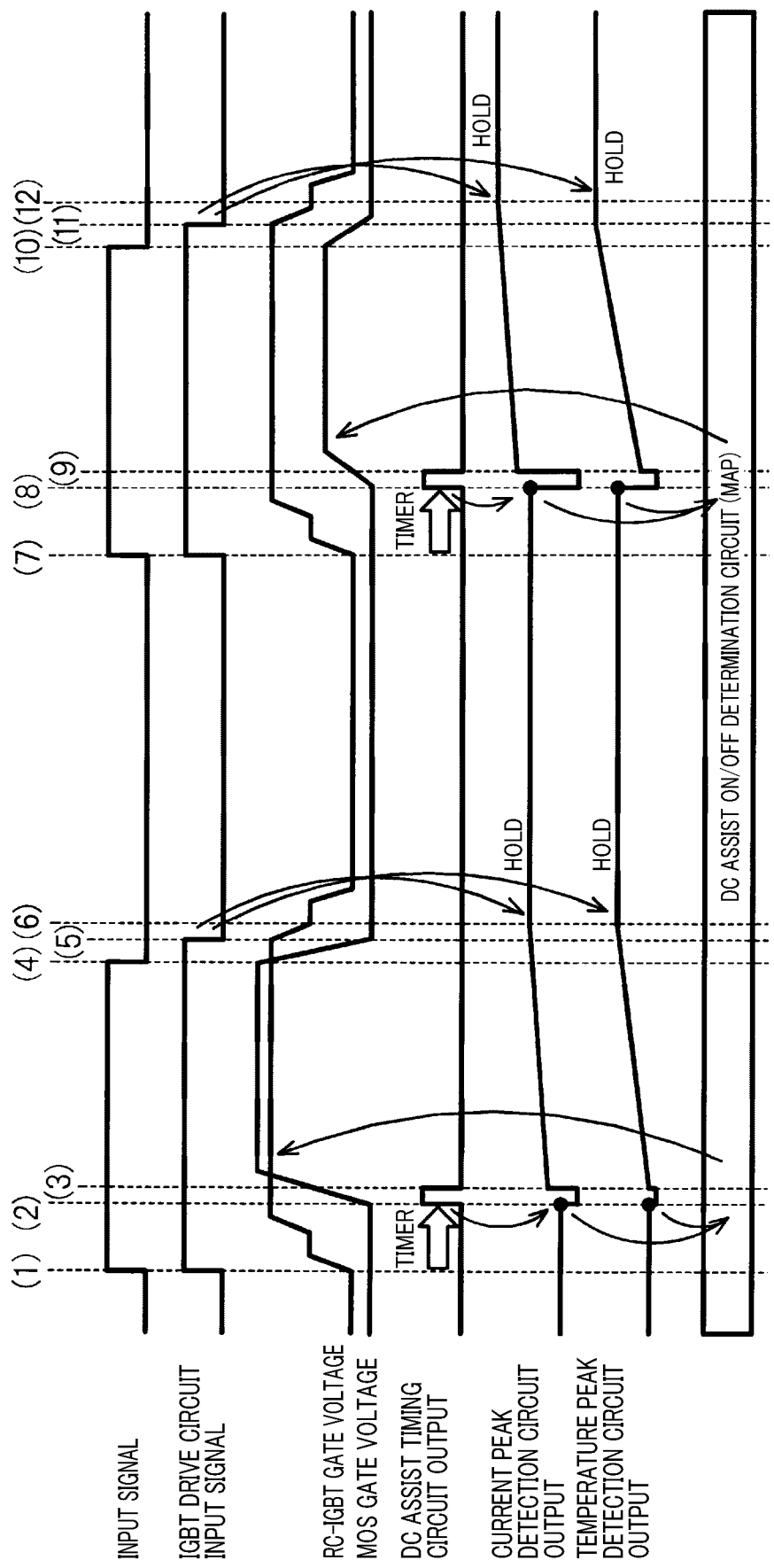
FIG. 14 is an operation timing chart of the driver IC.

Next, workings according to the fifth embodiment will be described. According to the fifth embodiment, as shown in FIG. 14, when the input signal changes to high level and turn-on of the IGBT 1 is started at time point (1), after turn-on is completed, in a manner similar to that according to the fourth embodiment, at time point (2), the one-shot pulse generation circuit 37 outputs the one-shot pulse signal. Then, the MOS drive voltage determination circuit 43 determines the gate drive voltage of the FET 2 based on the map shown in FIG. 13, based on the current value and the temperature value received at this time. In addition, the peak holds 17 and 40 are reset. Then, at time point (3), the FET 2 is turned on and DC assist is performed with the determined gate drive voltage.

As a result of turn-on of the IGBT 1 being completed and the collector current flowing, the current and the temperature detected by the current peak value detection circuit 33 and the temperature peak value detection circuit 34 increase. Operations corresponding to time points (4) to (6) are similar to those according to the fourth embodiment.

At time point (7), turn-on of the IGBT 1 of the next cycle is started. At time point (8) after turn on is completed, the one-shot pulse generation circuit 37 outputs the one-shot pulse signal. Then, the MOS drive voltage determination circuit 43 determines the gate drive voltage of the FET 2 based on the current value and the temperature value received at this time. In this case, in accompaniment with the increase in the current value and the temperature value as a result of previous conduction, the gate drive voltage in DC assist that is performed at time point (9) and thereafter is lower than the previous gate drive voltage.

As described above, according to the fifth embodiment, a plurality of thresholds are set on the two-dimensional coordinate map of the temperature and the current. The MOS drive voltage determination circuit 43 performs DC assist by reducing the drive voltage applied to the gate of the FET 2 in stages as the threshold exceeded by the two-dimensional coordinate value determined based on the peak value of the temperature and the peak value of the current detected regarding the IGBT 1 increases. As a result of a configuration such as this, the on-state of the FET 2 when DC assist is performed can be precisely controlled based on the two parameters, i.e., the temperature and the current of the IGBT 1.

Sixth Embodiment

Figure 15:
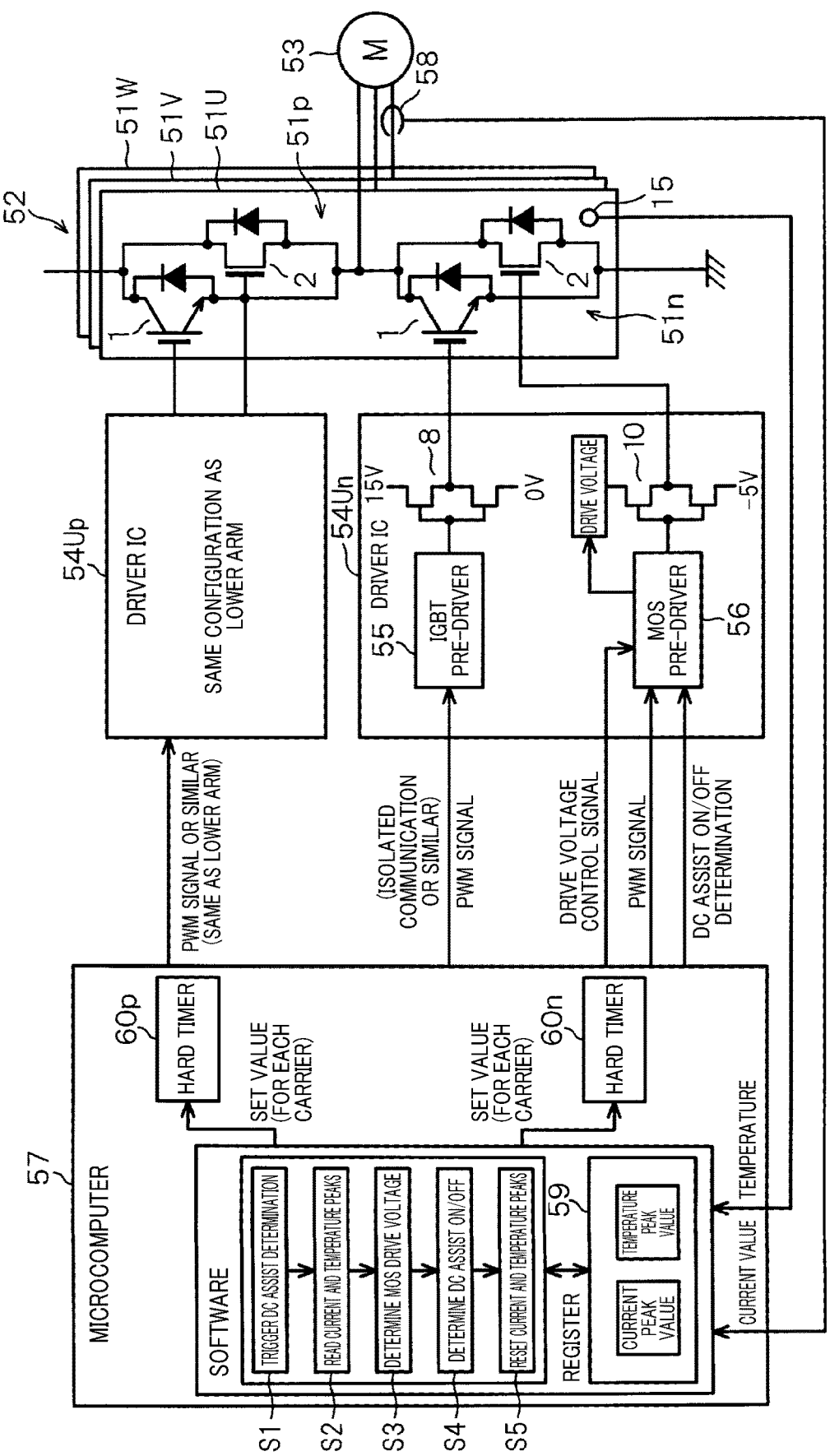
FIG. 15 is a sixth embodiment, and a functional block diagram of configurations of a microcomputer, a driver IC, and an inverter.

According to a sixth embodiment shown in FIG. 15, a single arm 51 is configured by that in which the IGBT 1 and the FET 2 are connected in parallel. Phase arms 51U, 51V and 51W are each configured by a positive-side arm 51p and a negative-side arm 51n being connected in series. In addition, an inverter circuit 52 is configured by the phase arms 51U, 51V, and 51W being connected in parallel. Each phase output terminal of the inverter circuit 52 is connected to a phase stator winding (not shown) of a three-phase motor 53. The inverter circuit 52 corresponds to a motor drive circuit.

Each arm 51 is driven by corresponding driver ICs 54. However, in FIG. 15, only driver ICs 54Up and 54Un that correspond to the U-phase arm 51U are shown. The driver IC 54 includes the IGBT drive circuit 8, an IGBT pre-driver 55, the MOS drive circuit 10, and an MOS pre-driver 56. A drive control signal, such as a PWM signal, is received by each driver IC 54 by a microcomputer 57 that is a control circuit.

In a manner similar to that according to the first embodiment and the like, the temperature-sensitive diode 15 is disposed in each arm 51. A temperature signal outputted by the temperature-sensitive diode 15 is received by the microcomputer 57. Here, in FIG. 15, only a single temperature-sensitive diode 15 is shown. In addition, for example, a Hall-type current sensor 58 is interposed between one of the phase output terminals of the inverter circuit 52 and the corresponding stator winding of the motor 53. A current signal outputted by the current sensor 58 is also received by the microcomputer 57.

The microcomputer 57 includes each functional unit actualized by software, a resistor 59, and hardware timers 60p and 60n for generating the PWM signal. In addition, the microcomputer 57 performs the processes performed by the driver ICs 31 and 42 according to the fourth and fifth embodiments by software. Furthermore, the microcomputer 57 performs analog-to-digital (A/D) conversion on the signals outputted by the temperature-sensitive diode 15 and the current sensor 58 at an interval that is faster than a carrier period in PWM control and performs peak value detection for each at all times by a function provided by software (not shown). The peak values that are continually updated are stored in the register 59.

Next, workings according to the sixth embodiment will be described. As shown in FIG. 15, the microcomputer 57 performs the function of the DC assist timing detection circuit (S1) and acquires peak value data of the current and the temperature from the register 59 (S2). Then, the microcomputer 57 performs the functions of the DC assist ON/OFF determination circuit 38 and the MOS drive voltage determination circuit 43, and outputs the drive voltage control signal that is the determination result to the driver IC 54 (S3, S4). Then, the microcomputer 57 resets the peak value data stored in the register 59 (S5).

Signal transmission between the microcomputer 57 and the driver IC 54 is performed by, for example, isolated communication via a photocoupler or the like. Then, the MOS pre-driver 56 of the driver IC 54 that receives the above-described determination result determines whether or not to perform DC assist based on the result. When DC assist is performed, the gate drive voltage level of the FET 2 is variably set as according to the fifth embodiment.

As described above, according to the sixth embodiment, the microcomputer 57 determines whether or not to perform DC assist based on the two-dimensional coordinate value determined based on the temperature and the current detected regarding the IGBT 1. When DC assist is performed, the drive voltage that is applied to the gate of the FET 2 is reduced in stages based as the threshold exceeded by the two-dimensional coordinate value increases. Therefore, a part of the workings according to the fourth and fifth embodiments can be actualized by software in the microcomputer 57.

Other Embodiments

According to the first embodiment, the temperature of the IGBT 1 may be detected by the temperature-sensitive diode 15. The drive voltages of the IGBT 1 and the FET 2 may be changed as appropriate based on individual design. The bipolar-type transistor is not limited to the RC-IGBT. In addition, the MOSFET is not limited to the SiC-MOSFET.

According to the fourth and fifth embodiments, the temperature of the FET 2 may be detected by the temperature-sensitive diode 15.

According to the fifth embodiment, the gate drive voltage when DC assist is performed is merely required to be changed in two stages or more. In addition, a width value by which the gate voltage is reduced may be changed as appropriate. Furthermore, a minimum value of the negative gate voltage may be 0 V or may not be 0 V.

According to the sixth embodiment, only the functions of either of the fourth and fifth embodiments may be performed. In addition, instead of the current sensor 58, the current may be detected by the microcomputer 57 reading the terminal voltage of the resistor 5.

The motor drive circuit according to the sixth embodiment is not limited to the three-phase inverter circuit 52 and may be a half-bridge circuit or a full-bridge circuit.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

<Second Disclosure>

Figure 16:
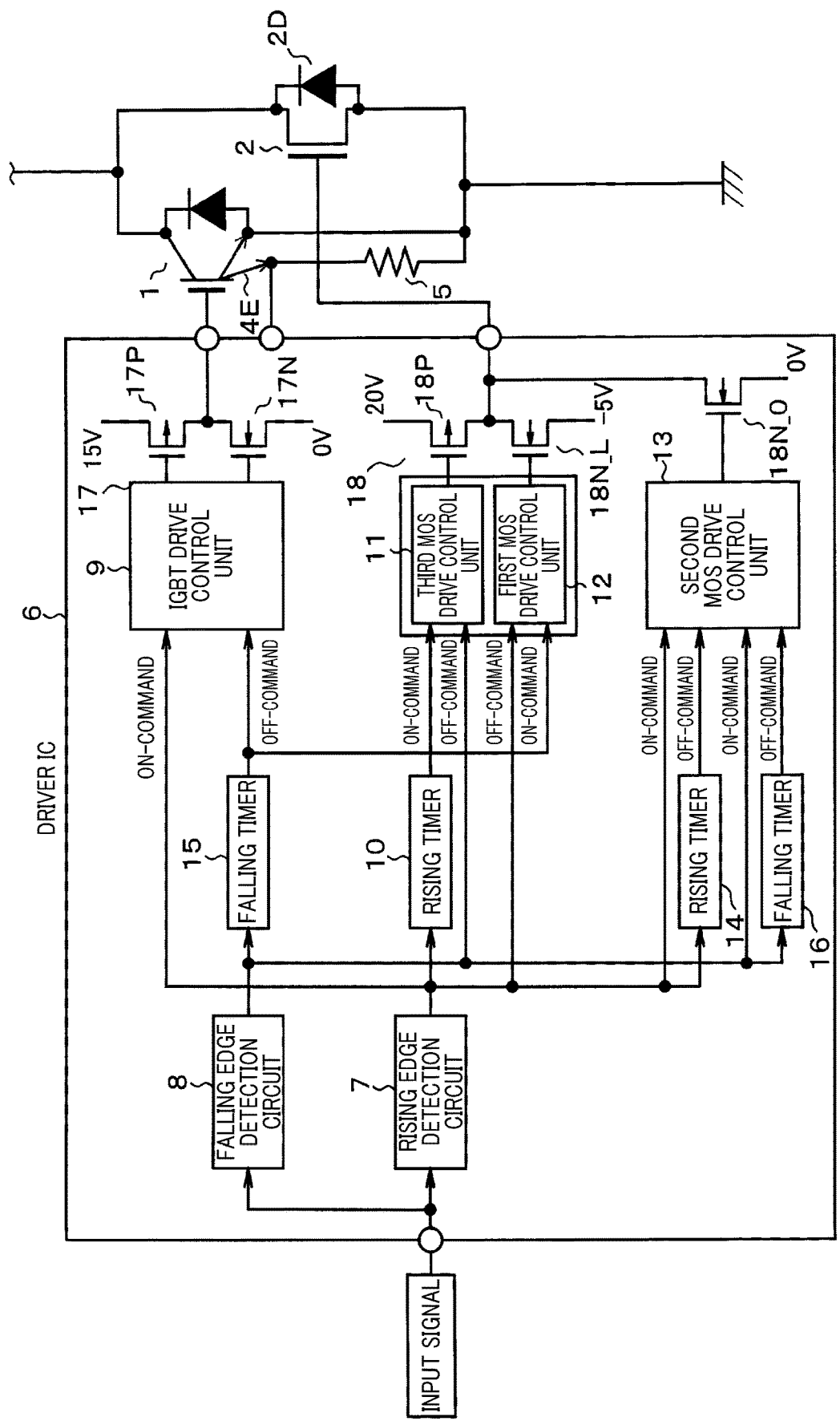
FIG. 16 is a functional block diagram of a configuration of a driver IC according to an embodiment corresponding to a second disclosure.

As shown in FIG. 16, the collector and the emitter of the RC-IGBT 1 and the drain and the source of the SiC-MOSFET 2 are respectively commonly connected. For example, the collector of the IGBT 1 and the drain of the FET 2 are connected to an element on the upper arm side (not shown) that is configured by elements that are similarly connected in parallel. The emitter of the IGBT 1 and the source of the FET 2 are connected to the ground.

A detection element for dividing the flow of the collector current and detecting the collector current is provided in the IGBT 1. However, in FIG. 16, only the emitter terminal 4E of the detection element is shown. The emitter terminal 4E is connected to the ground by the resistor 5. A signal that controls driving of the IGBT 1 is received by the driver IC 6 from a control circuit (not shown). The input signal is received by a rising edge detection circuit 7 and a falling edge detection circuit 8. The rising edge detection circuit 7 detects a rising edge of the input signal and outputs a trigger signal. The falling edge detection circuit 8 detects a falling edge of the input signal and outputs a trigger signal.

An output signal of the rising edge detection circuit 7 is received as an on-command to an IGBT drive control unit 9, a third MOS drive control unit 11 via a rising timer 10, and a second MOS drive control unit 13. In addition, the output signal is received as an off-command to a first MOS drive control unit 12, and the second MOS drive control unit 13 via a rising timer 14.

Meanwhile, an output signal of the falling edge detection circuit 8 is received as an off-command to the IGBT drive control unit 9 via a falling timer 15, the third MOS drive control unit 11, and the second MOS drive control unit 13 via a falling timer 16. In addition, the output signal is received as an on-command to the second MOS drive control unit 13, and the first MOS drive control unit 12 via the falling timer 15.

The IGBT drive control unit 9 inputs a drive control signal to an IGBT drive circuit 17 based on the received on-command and off-command. For example, the IGBT drive circuit 17 is configured by a series circuit of two MOSFETs 17P and 17N. For example, the IGBT drive circuit 17 outputs 15 V as a high-level drive voltage, that is, a turn-on level voltage to the gate of the IGBT 1, and outputs 0 V as a low-level drive voltage, that is, a turn-off level voltage to the gate of the IGBT 1.

Meanwhile, a MOS drive circuit 18 is configured by a series circuit of two MOSFETs 18P and 18 N_L, and a MOSFET 18N_0 that is connected between a shared connection point of the two MOSFETs 18P and 18 N_L and the ground. The FETs 18P and 18N_L are respectively driven by the third MOS drive control unit 11 and the first MOS drive control unit 12. The FET 18N_0 is driven by the second MOS drive control unit 13. In addition, for example, the MOS drive circuit 18 outputs 20 V as a high-level drive voltage and −5 V as a low-level drive voltage to the gate of the FET 2 by the series circuit of the FETs 18P and 18N_L, and outputs 0 V as an intermediate-level drive voltage to the gate of the FET 2 by the FET 18N_0. The series circuit of the FETs 18P and 18N_L corresponds to a high-level application circuit and a low-level application circuit. The FET 18N_0 corresponds to an intermediate-level application circuit.

Here, the IGBT drive control unit 9 outputs the high-level drive voltage to the gate of the IGBT 1 by turning on the FET 17P and the turning off the FET 17N when the on-command is received, and maintains this state until the off-command is subsequently received. In addition, the third MOS drive control unit 11, the first MOS drive control unit 12, and the second MOS drive control unit 13 output the drive voltages to turn on each drive subject element, the FETs 18P, 18N_L, and 18N_0, configuring the MOS drive circuit 18, when each are provided with the on-command, and maintain this state until the off-command is subsequently received.

Figure 17:
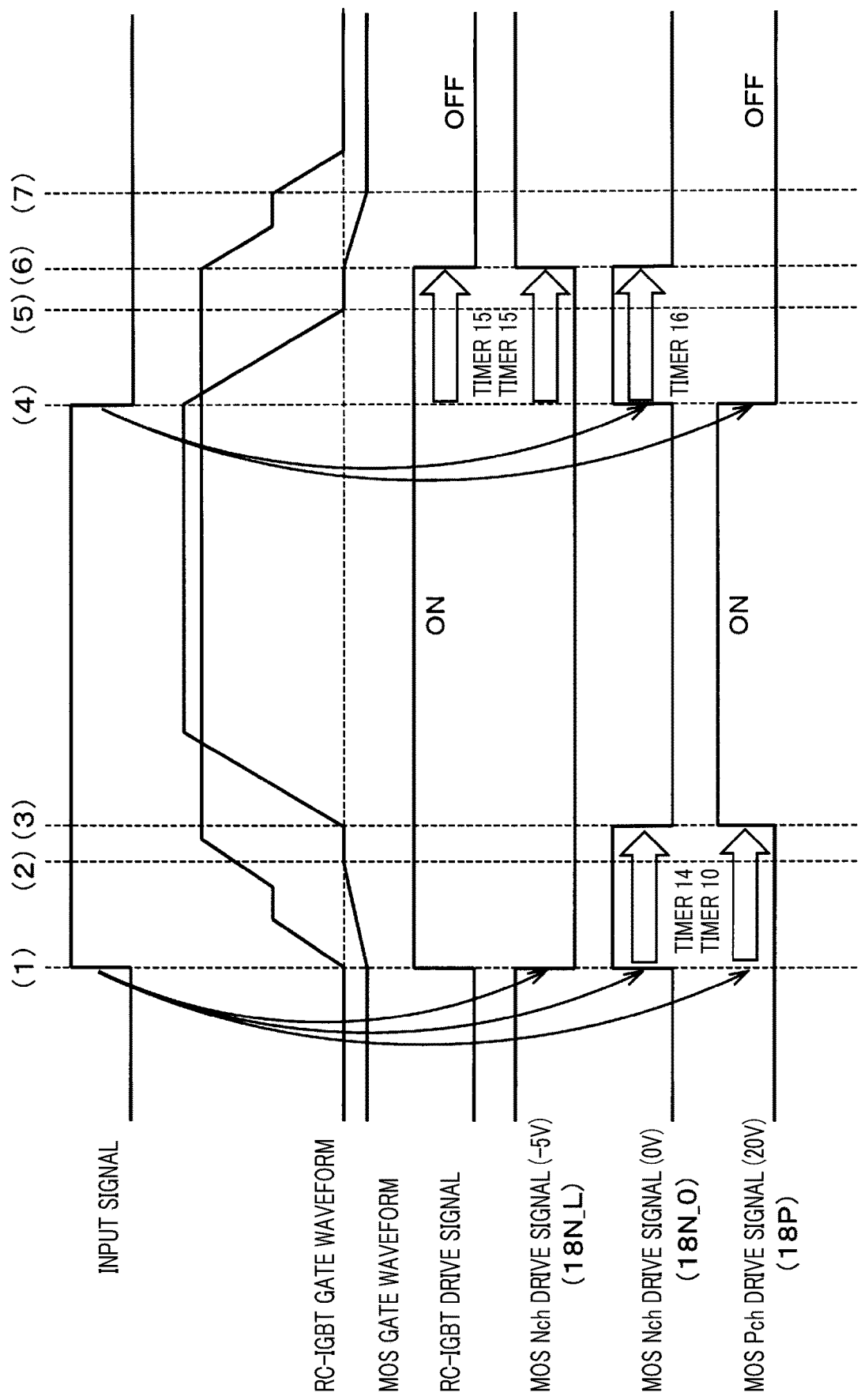
FIG. 17 is a timing chart of operations of the driver IC.

Next, workings according to the present embodiment will be described. Here, "RC-IGBT" indicated in FIG. 17 refers to the IGBT 1 and "MOS" refers to the FET 2. In an initial state in which the input signal is low level, as described hereafter, the on-command and the-off command are provided to the IGBT drive control unit 9, the third MOS drive control unit 11, the first MOS drive control unit 12, and the second MOS drive control unit 13 in the following manner at a previous falling timing of the input signal and thereafter.

IGBT drive control unit 9: off-command
Third MOS drive control unit 11: off-command
First MOS drive control unit 12: on-command
Second MOS drive control unit 13: off-command As a result, the low-level drive voltage of 0 V is applied to the gate of the IGBT 1 and the low-level drive voltage of −5 V is also applied to the gate of the FET 2.

From this state, when the level of the input signal changes from low to high at time point (1), the on-command is received by the IGBT drive control unit 9 at the rising timing of the input signal. Therefore, the IGBT 1 immediately starts turn-on.

Meanwhile, on the FET 2 side, the off-command is received by the first MOS drive control unit 12 and the on-command is received by the second MOS drive control unit 13 at the above-described rising timing. As a result, the FET 18N_L is turned off and the FET 18 N_0 is turned on. The gate drive voltage of the FET 2 starts to increase from −5 V towards 0 V. Then, at time point (2), the gate drive voltage reaches the intermediate-level drive voltage of 0V.

In addition, at the above-described rising timing, the timers 10 and 14 start counting. If the fixed amounts of time counted by the timers 10 and 14 identically are up to time point (3), at this time, the on-command is received by the third MOS drive control unit 11 and the off-command is received by the second MOS drive control unit 13. As a result, the gate drive voltage of the FET 2 starts to increase from 0 V towards 20 V.

Subsequently, after turn-on of both the IGBT 1 and the FET 2 is completed, when the level of the input signal changes to low at time point (4), the off-command is received by the third MOS drive control unit 11 and the on-command is received by the second MOS drive control unit 13. As a result, the FET 2 starts turn-off first, and the gate drive voltage of the FET 2 decreases from 20 V towards 0 V. Then, at time point (5), the gate drive voltage reaches the intermediate-level drive voltage of 0 V.

In addition, at the above-described falling timing, the timers 15 and 16 start counting. If the fixed amounts of time counted by the timers 15 and 16 identically are up to time point (6), at this time, the off-command is received by the IGBT drive control unit 9 and the IGBT 1 starts turn-off. At the same time, the off-command is received by the second MOS drive control unit 13 and the on-command is received by the first MOS drive control unit 12. As a result, the gate drive voltage of the FET 2 starts to decrease from 0 V towards −5 V, and reaches the low-level drive voltage of −5 V at time point (7). Then, the initial state before time point (1) is reached. Here, periods in which the second MOS drive control unit 13 turns on the FET 18 N_0 while the timers 14 and 16 are counting respectively correspond to a first period and a second period.

As described above, according to the present embodiment, when the IGBT 1 and the FET 2 are driven in parallel, in order to turn on and turn off the FET 2, while the voltage applied to the gate of the FET 2 is changed between the positive-polarity high level of 20 V and the negative-polarity low level of −5 V, a period during which the intermediate level of 0 V that is between the two levels is applied is provided.

As a result of a configuration such as this, when the FET 2 is turned on, the voltage that is applied to the gate is changed from −5 V to 20 V by passing through a fixed period in which the voltage becomes 0 V. When the FET 2 is turned off, the voltage is changed from 20 V to −5 V by passing through a fixed period in which the voltage becomes 0 V. That is, drive loss can be reduced by an amount amounting to the relative decrease in potential difference between the intermediate level and high level.

In this case, the rising edge and the falling edge of the input signal are respectively edge-detected by the rising edge detection circuit 7 and the falling edge detection circuit 8. The rising timers 10 and 14 and the falling timers 15 and 16 respectively count a fixed amount of time from the time at which the rising edge and the falling edge are detected. The IGBT drive control unit 9 applies the high-level drive voltage to the gate of the IGBT 1 using the IGBT drive circuit 17 from the time at which the rising edge of the input signal is detected, and applies the low-level drive voltage after the elapse of the fixed amount of time counted by the timer 15 from the time at which the falling edge is detected.

The first MOS drive control unit 12 applies the low-level voltage of −5 V to the gate of the FET 2 by the FET 18N_L during the period in which the IGBT drive circuit 17 is applying the low-level voltage. The second MOS drive control unit 13 applies the intermediate-level voltage of 0 V by the FET 18N_0 during the first period from the time at which the rising edge is detected until the elapse of the fixed amount of time counted by the timer 14 and the second period from the time at which the falling edge is detected until the elapse of the fixed amount of time counted by the falling timer 16. In addition, the third MOS drive control unit 11 applies the high-level voltage by the FET 18P between the above-described first period and second period.

As a result of a configuration such as this, the first period and the second period during which the MOS drive circuit 18 applies the intermediate-level voltage to the gate of the FET 2 can be respectively set within the period in which the IGBT 1 starts turn-on and within the period in which the IGBT 1 starts turn-off. Therefore, even when there is a likelihood that the FET 2 is turned on as a result of the intermediate-level voltage being applied, no issues arise whatsoever.

In addition, the falling timer 15 that is referenced by the IGBT drive circuit 17 and the falling timer 16 that is referenced by the MOS drive circuit 18 are individually provided. Therefore, the timing at which the IGBT 1 starts turn-off and the timing at which the FET 2 starts turn-off can be individually set.

Other Embodiments

The drive voltages of the IGBT 1 and the FET 2 may be changed as appropriate based on individual design. In addition, the intermediate-level voltage is not limited to 0 V and is merely required to be a voltage between the high-level drive voltage and the low-level drive voltage and a voltage that enables the FET 2 to be turned off. Furthermore, even when the voltage is that at which the FET 2 may be erroneously operated and turned on, as described above, if the setting is such that turn-on of the IGBT 1 is started first, no issues arise.

The falling timers 15 and 16 may be shared. The bipolar-type transistor is not limited to be an RC-IGBT. In addition, the MOSFET is not limited to be an SiC-MOSFET.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

<Third Disclosure>

First Embodiment

Figure 18:
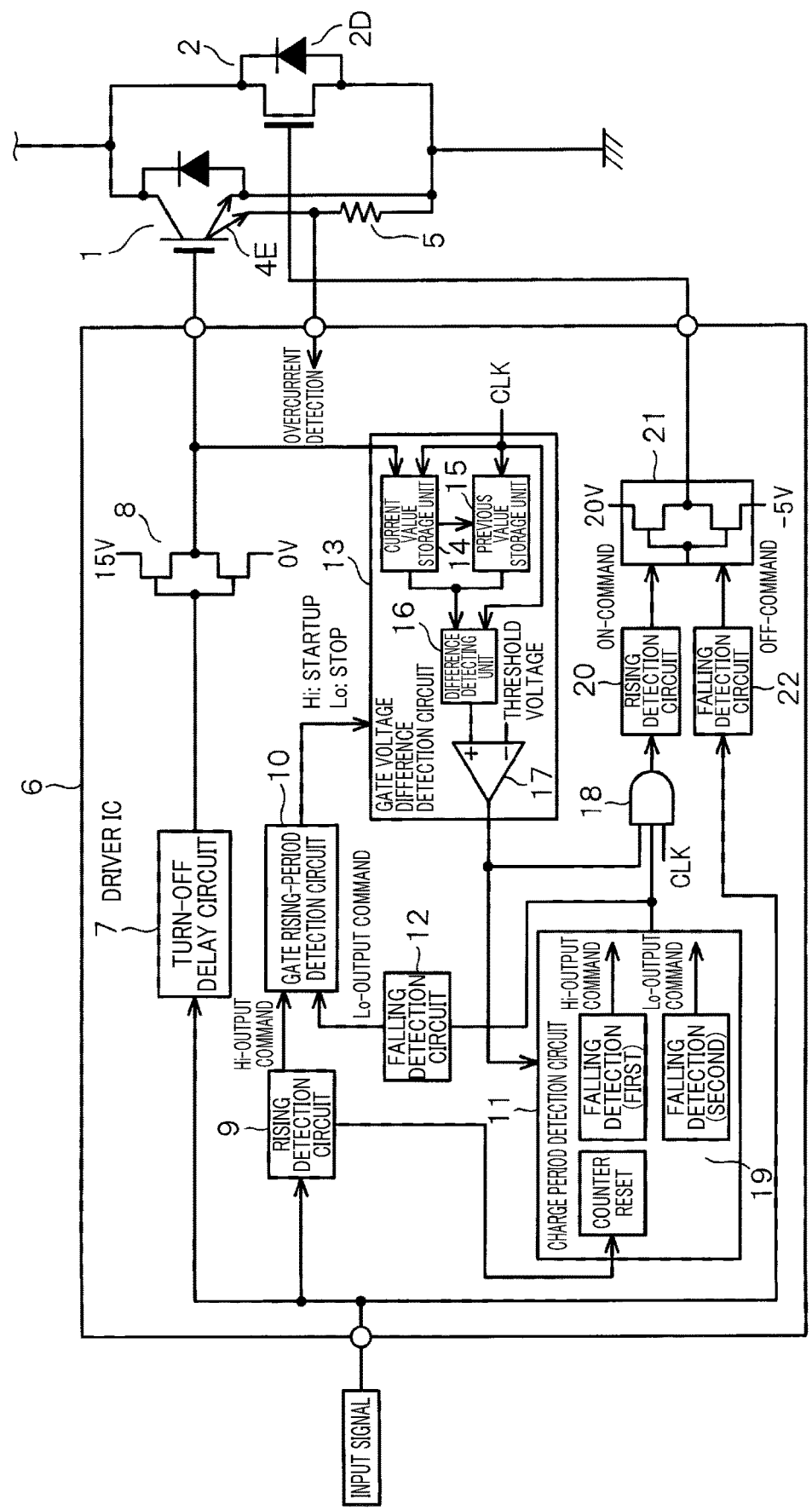
FIG. 18 is a diagram of a configuration of a transistor drive circuit according to a first embodiment corresponding to a third disclosure.

As shown in FIG. 18, the collector and the emitter of the RC-IGBT 1 and the drain and the source of the SiC-MOSFET 2 are respectively commonly connected. For example, the collector of the IGBT 1 and the drain of the FET 2 are connected to an element on the upper arm side (not shown) that is configured by elements that are similarly connected in parallel. The emitter of the IGBT 1 and the source of the FET 2 are connected to the ground.

A detection element for dividing the flow of the collector current and detecting the collector current is provided in the IGBT 1. However, in FIG. 18, only the emitter terminal 4E of the detection element is shown. The emitter terminal 4E is connected to the ground by the resistor 5. In addition, the reverse-direction parasitic diode 2D is connected between the drain and the source of the FET 2. The emitter terminal 4E is connected to the input terminal of the driver IC 6. For example, the terminal voltage of the resistor 5 is used to detect an abnormal current. However, according to the present embodiment, details thereof are omitted.

A signal that controls driving of the IGBT 1 is received by the driver IC 6 from a control circuit (not shown). The input signal is received by the IGBT drive circuit 8 via the turn-off delay circuit 7. When the level of the input signal changes from high to low that is a turn-off level, the turn-off delay circuit 7 changes the signal that is outputted to the IGBT drive circuit 8 to low level upon elapse of a fixed delay time.

For example, the IGBT drive circuit 8 is configured by a series circuit of two MOSFETs. For example, the IGBT drive circuit 8 outputs 15 V as the high-level drive voltage and 0 V as the low-level drive voltage to the gate of the IGBT 1. Here, for convenience of description, the IGBT drive circuit 8 is that which outputs the low-level drive voltage when the input signal is low level and outputs the high-level drive voltage when the input signal is high level.

In addition, the input signal is received by the rising detection circuit 9. The output signal of the rising detection circuit 9 is received by a gate rising-period detection circuit 10 and a charge period detection circuit 11. When the rising of the input signal is detected, the rising detection circuit 9 inputs a Hi-output command to the gate rising-period detection circuit 10. In addition, a Lo-output command from a falling detection circuit 12 is also received by the gate rising-period detection circuit 10. Furthermore, the gate rising-period detection circuit 10 inputs a high-active startup command to a gate voltage difference detection circuit 13 from the time at which the Hi-output command is received until the time at which the Lo-output command is received.

An input terminal of the gate voltage difference detection circuit 13 is connected to the gate of the IGBT 1. The gate voltage difference detection circuit 13 includes a current value storage unit 14, a previous value storage unit 15, and a difference detecting unit 16. The current value storage unit 14, the previous value storage unit 15, and the difference detecting unit 16 operate synchronously with a received clock signal CLK. The current gate voltage of the IGBT 1 is stored in the current value storage unit 14. The gate voltage at the cycle before the current cycle is stored in the previous value storage unit 15. The difference detecting unit 16 detects the difference between the previous value and the current value of the gate voltage, and inputs the detection value to the non-inverting input terminal of a comparator 17. The detection value is updated at every clock cycle. The comparator 17 compares the received difference value to a threshold voltage that is applied to the inverting input terminal and inputs the comparison result to a charge period detection circuit 11 and an AND gate 18. The output signal of the comparator 17 corresponds to a difference detection signal and the difference detection signal is high-active.

The charge period detection circuit 11 includes a counter 19 that counts a number of times of the detection of the falling edge of the signal received by the gate voltage difference detection circuit 13. The counter is reset to zero when the rising edge of the input signal is detected. Subsequently, when the first falling edge is received by the gate voltage difference detection circuit 13, the output signal is set to high level and when the next second falling edge is received, the output signal is changed to low level. The output signal is received by the AND gate 18.

The AND gate 18 has three inputs. The clock signal CLK is applied to the remaining input terminal. Therefore, the AND gate 18 sets an output signal to high level when the clock signal CLK indicates high level during the period in which the input signals from the charge period detection circuit 11 and the gate voltage difference detection circuit 13 indicate high level. The output signal is received by a rising detection circuit 20.

The rising detection circuit 20 outputs the on-command to a MOS drive circuit 21 when the rising edge of the signal received by the AND gate 18 is detected. In addition, a falling detection circuit 22 outputs the off-command to the MOS drive circuit 21 when the falling edge of the input signal is detected. The MOS drive circuit 21 is also similarly configured by a series circuit of two MOSFETs. For example, the MOS drive circuit 21 outputs 20 V as the high-level drive voltage and −5 V as the low-level drive voltage to the gate of the FET 2. The MOS drive circuit 21 outputs the high-level drive voltage when the on-command is received and maintains this state until the off-command is received. When the off-command is received, the MOS drive circuit 21 outputs the low-level drive voltage.

Figure 19:
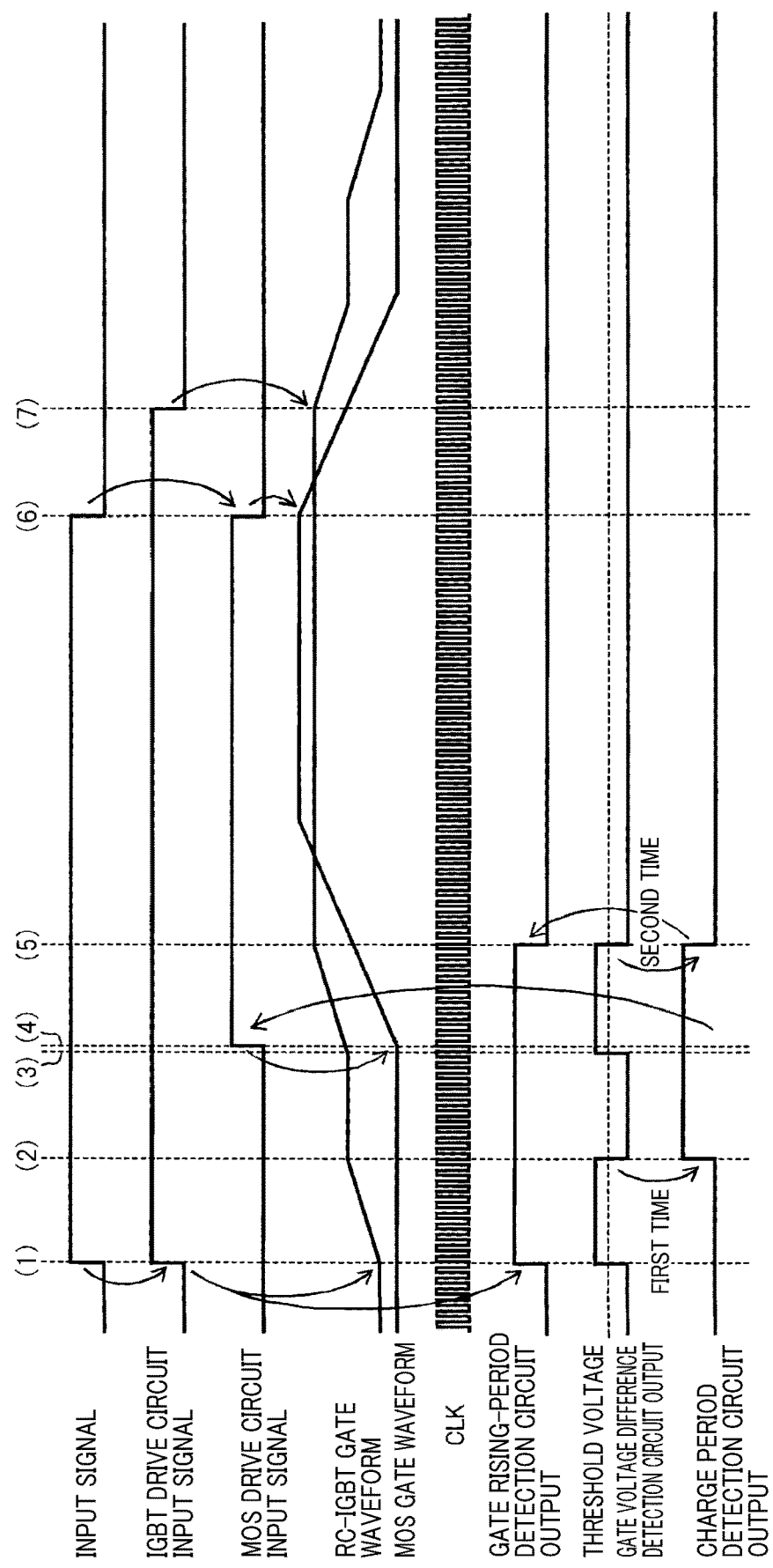
FIG. 19 is an operation timing chart.

Next, workings according to the present embodiment will be described. As shown in FIG. 19, when the level of the input signal changes from low to high at time point (1), the IGBT 1 immediately starts turn-on and the gate voltage increases. In addition, at this time, the output signal of the gate rising-period detection circuit 10 becomes high level. With the increase in the gate voltage, the output signal of the gate voltage difference detection circuit 13 becomes high level.

When the gate voltage of the IGBT 1 reaches the Miller voltage at time point (2), the increase in the voltage temporarily stops. As a result, the output signal of the gate voltage difference detection circuit 13 changes to low level and the output signal of the charge period detection circuit 11 changes to high level.

When the Miller period ends and the gate voltage starts to increase again at time point (3), in accompaniment, the output signal of the gate voltage difference detection circuit 13 also becomes high level. Then, the output signal of the AND gate 10 becomes high level at time point (4) that is the rising of the next clock signal CLK. The rising detection circuit 20 detects the rising edge of the output signal and outputs the on-command to the MOS drive circuit 21. As a result, the MOS drive circuit 21 sets the gate voltage of the FET 2 to high level and turn-on of the FET 2 is started.

When the gate voltage of the IGBT 1 reaches the high-level voltage at time point (5), the increase in the voltage stops. Therefore, the output signal of the gate voltage difference detection circuit 13 changes to low level again. As a result, the output signal of the charge period detection circuit 11 becomes low level and the output signal of the gate rising-period detection circuit 10 also becomes low level. The period during which the output signal indicates high level corresponds to a rising-period. In addition, the output signal of the charge period detection circuit 11 corresponds to the charge period detection signal. The charge period detection signal is high-active.

When the level of the input signal changes to low at time point (6), the falling detection circuit 22 detects the falling edge of the input signal and outputs the off-command to the MOS drive circuit 21. As a result, the MOS drive circuit 21 sets the gate voltage of the FET 2 to low level and turn-off of the FET 2 is started. Meanwhile, the IGBT 1 starts turn-off from time point (7) at which the delay time applied by the turn-off delay circuit 7 elapses.

Here, in the series of operations described above, to prevent erroneous operation, regarding the end of the Miller period, for example, a counter may be provided on the input side or the output side of the AND gate 18, and determination may be made upon confirmation that the output signal of the gate voltage difference detection circuit 13 has become high level being performed at a plurality of cycles of the clock signal CLK.

As described above, according to the present embodiment, when the IGBT 1 is turned on, after the drive voltage of the IGBT 1 has reached the Miller voltage, turn-on of the FET 2 is started subsequent to the end of the Miller period. Specifically, the rising-period until the drive voltage of the IGBT 1 rises to the turn-on level is detected by the gate rising-period detection circuit 10. During the rising-period, the gate voltage difference detection circuit 13 operates synchronously with the clock signal CLK and determines the difference between the current value of the drive voltage and the value at the cycle before the cycle of the current value. When the difference is greater than a threshold voltage, the gate voltage difference detection circuit 13 sets the output signal to high level and outputs the difference detection signal.

In addition, during the rising-period, the charge period detection circuit 11 outputs the charge period detection signal during a capacity charge period of the IGBT 1 from the first falling edge to the second falling edge indicated by the difference detection signal. Then, when the difference detection signal and the charge period detection signal are both outputted by the AND gate 18, turn-on of the FET 2 is started synchronously with the clock signal CLK.

That is, when the IGBT 1 is turned on, a period during which the drive voltage is the Miller voltage level occurs in the process of increasing from low level to high level. The drive voltage subsequently increases again towards high level. At this time, the time at which the increase starts is immediately before the completion of turn-on of the IGBT 1. Therefore, if turn-on of the FET 2 is started subsequent to this time, the time of turn-on can be reliably made earlier than that in conventional technology. Consequently, the loss reduction effect can be improved.

Second Embodiment

Figure 20:
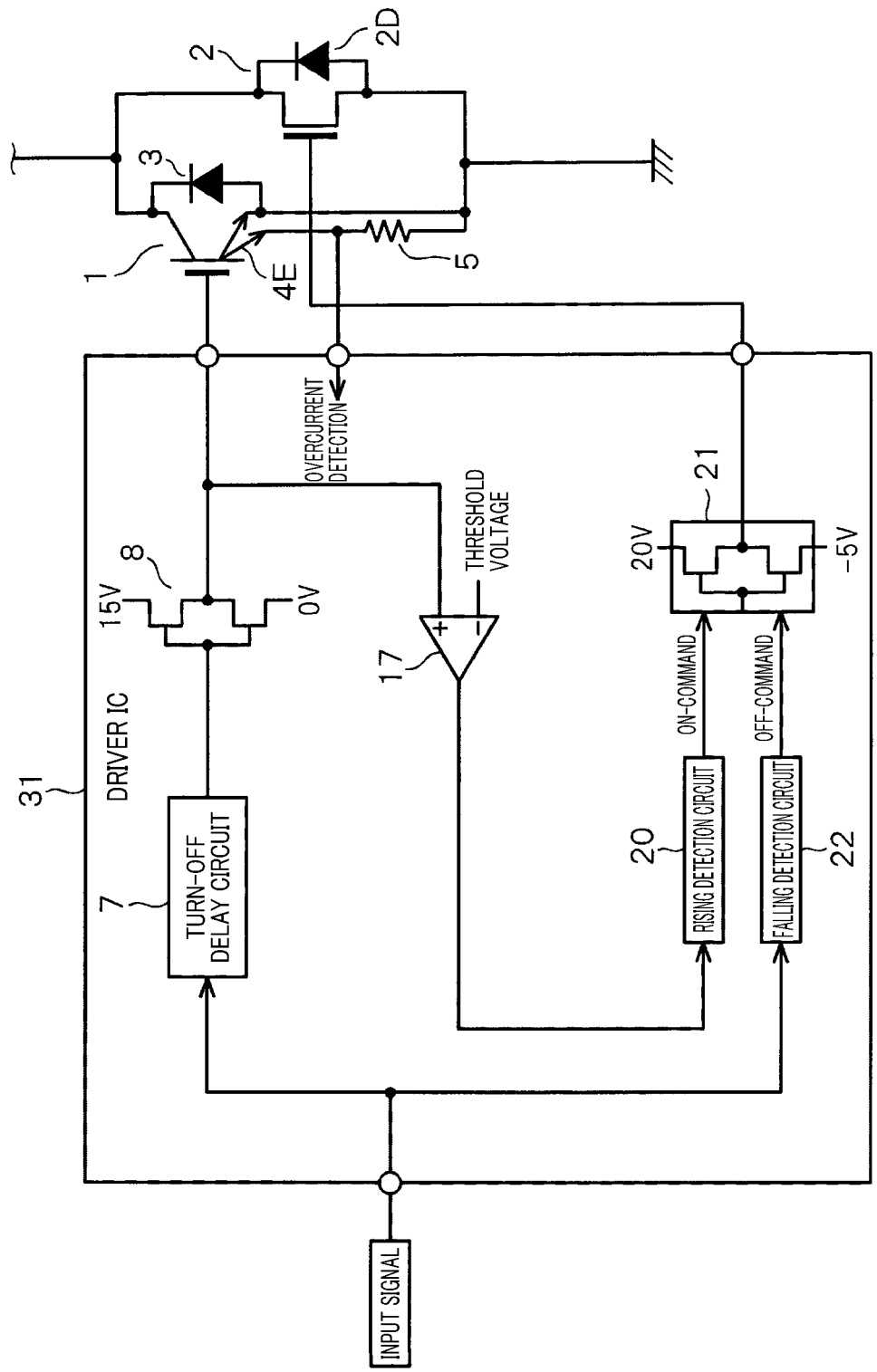
FIG. 20 is a diagram of a configuration of a transistor drive circuit according to a second embodiment.

Hereafter, sections that are identical to those according to the first embodiment are given the same reference numbers and the descriptions are omitted. Differing sections will be described. As shown in FIG. 20, a driver IC 31 according to a second embodiment is a configuration in which the rising detection circuit 9, the gate rising-period detection circuit 10, the charge period detection circuit 11, the falling detection circuit 12, and the AND gate 18 are eliminated from the driver IC 6. In addition, regarding the gate voltage difference detection circuit 13 as well, configurations other than the comparator 17 are eliminated.

Furthermore, the non-inverting input terminal of the comparator 17 is directly connected to the gate of the IGBT 1. The output terminal of the comparator 17 is connected to the input terminal of the rising detection circuit 20. Moreover, a threshold voltage that is higher than the Miller voltage and lower than the high-level drive voltage of the IGBT 1 is applied to the inverting input terminal of the comparator 17.

Figure 21:
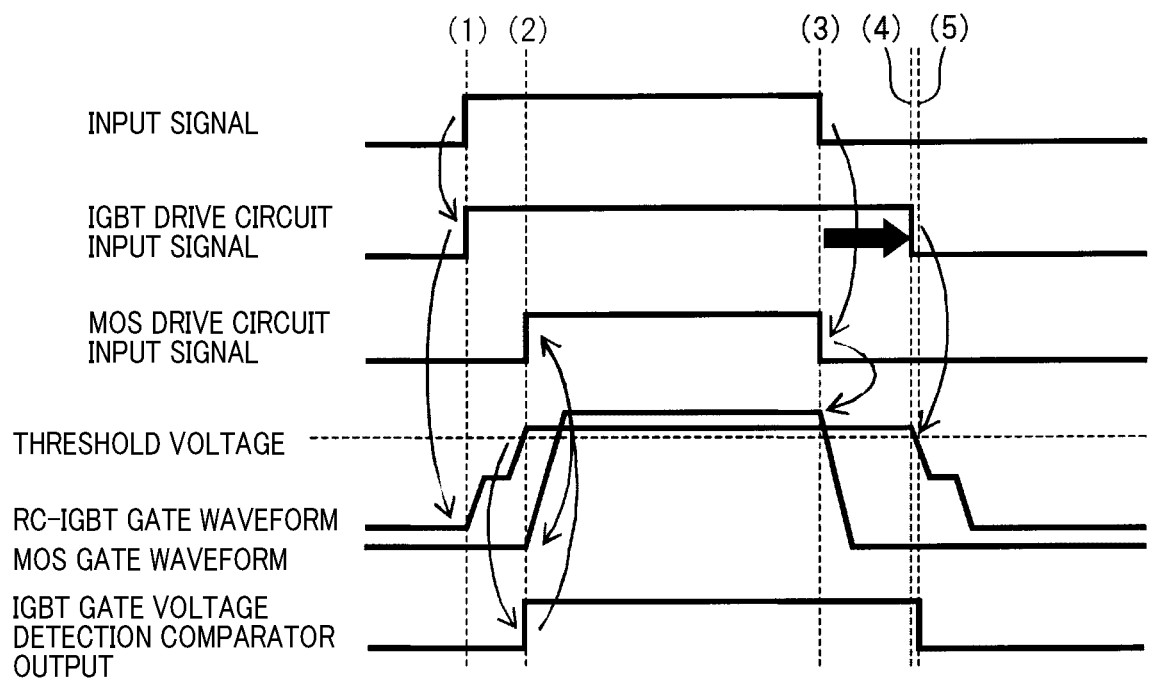
FIG. 21 is an operation timing chart.

Next, workings according to the second embodiment will be described. As shown in FIG. 21, in a manner similar to that according to the first embodiment, the IGBT 1 starts turn-on at time point (1) and the gate voltage increases. Then, at time point (2), when the gate voltage exceeds the threshold voltage immediately before reaching the high-level drive voltage, the output signal of the comparator 17 changes to high level. Then, the rising detection circuit 20 detects the rising edge of the output signal and outputs the on-command to the MOS drive circuit 21. As a result, the MOS drive circuit 21 sets the gate voltage of the FET 2 to high level and turn-on of the FET 2 is started.

When the level of the input signal changes to low at time point (3), the falling detection circuit 22 detects the falling edge of the input signal and outputs the off-command to the MOS drive circuit 21. As a result, the MOS drive circuit 21 sets the gate voltage of the FET 2 to low level and turn-off of the FET 2 is started. Meanwhile, the IGBT 1 starts turn-off from time point (4) at which the delay time applied by the turn-off delay circuit 7 elapses. Then, when the gate voltage becomes less than the threshold voltage at time point (5), the output signal of the comparator 17 changes to low level.

As described above, according to the second embodiment, the comparator 17 outputs the result of the comparison between the drive voltage of the IGBT 1 and the threshold voltage that is set to be higher than the Miller voltage. The rising detection circuit 20 detects the rising of the output signal of the comparator 17. Then, when the rising detection circuit 20 detects the rise, the MOS drive circuit 21 applies the turn-on level voltage to the gate of the FET 2. When the falling detection circuit 22 detects the falling of the input signal, the MOS drive circuit 21 applies the turn-off level voltage to the gate of the FET 2. As a result, after turn-on of the IGBT 1 is started, when the gate voltage of the IGBT 1 exceeds the threshold voltage that is set to be higher than the Miller voltage, turn-on of the FET 2 is started. Therefore, the turn-on start timing of the FET 2 can be made earlier than in conventional technology by a configuration that is simpler than that according to the first embodiment.

Other Embodiments

The bipolar-type transistor is not limited to an RC-IGBT. In addition, the MOSFET is not limited to an SiC-MOSFET.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.
<Fourth Disclosure>

Figure 22:
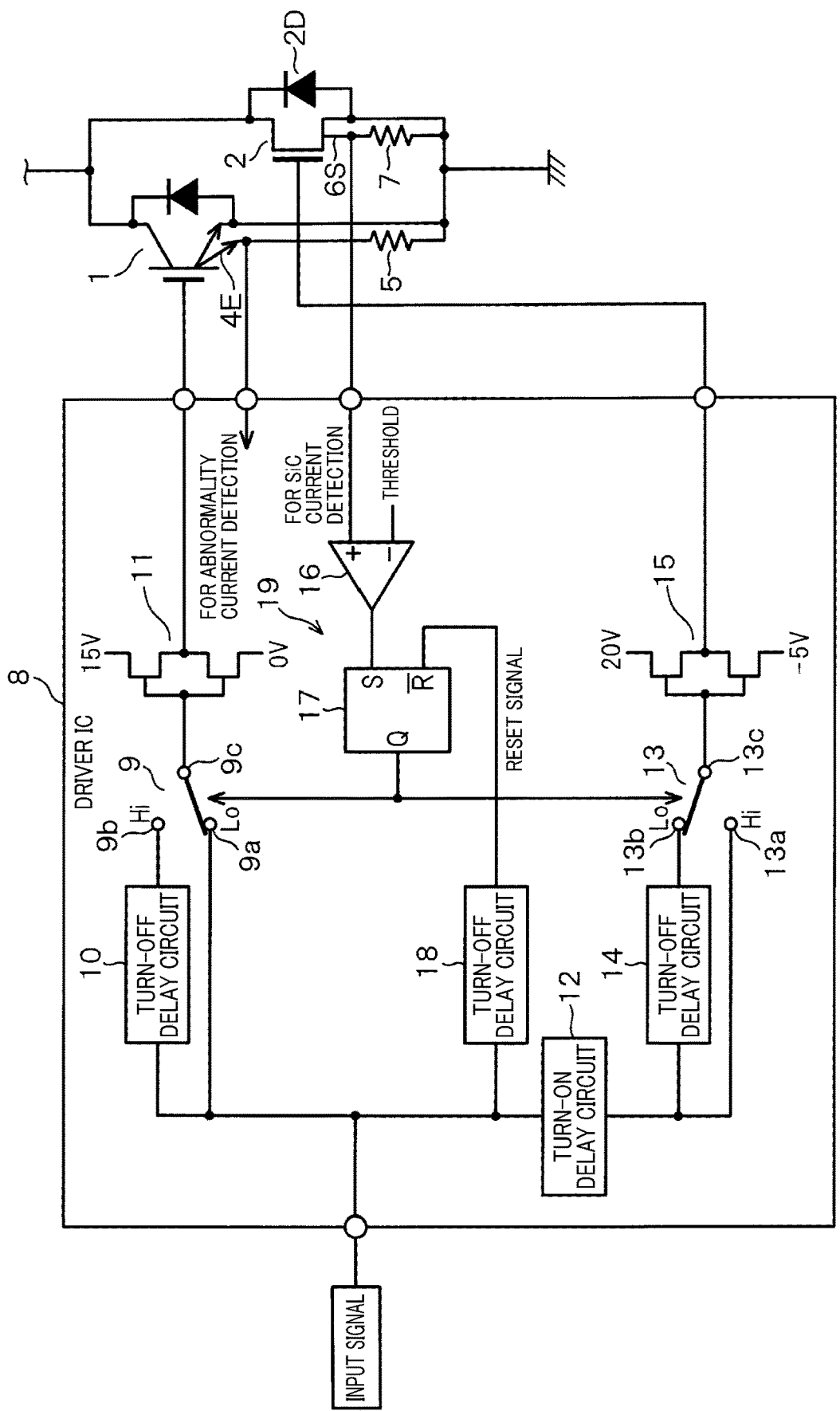
FIG. 22 is a functional block diagram of a configuration of a driver IC according to an embodiment corresponding to a fourth disclosure.

As shown in FIG. 22, the collector and the emitter of the RC-IGBT 1 and the drain and the source of the SiC- MOSFET 2 are respectively commonly connected. For example, the collector of the IGBT 1 and the drain of the FET 2 are connected to an element on the upper arm side (not shown) that is configured by elements that are similarly connected in parallel. The emitter of the IGBT 1 and the source of the FET 2 are connected to the ground.

A detection element for dividing the flow of the collector current and detecting the collector current is provided in the IGBT 1. However, in FIG. 22, only the emitter terminal 4E of the detection element is shown. The emitter terminal 4E is connected to the ground by the resistor 5. In addition, the reverse-direction parasitic diode 2D is connected between the drain and the source of the FET 2. In a manner similar to the IGBT 1, the FET 2 is also provided with a detection element for dividing the flow of the current and detecting the current. However, in FIG. 22, only a source terminal 6S of the detection element is shown. The source terminal 6S is connected to the ground via a resistor 7. The resistor 7 corresponds to a current detection element.

A signal that controls driving of the IGBT 1 is received by the driver IC 8 from a control circuit (not shown). The input signal is provided to an input terminal 9a of a first selector 9 and also provided to an input terminal 9b of the first selector 9 via a turn-off delay circuit 10. An output terminal 9c of the selector 9 is connected to the input terminal of an IGBT drive circuit 11.

Figure 24:
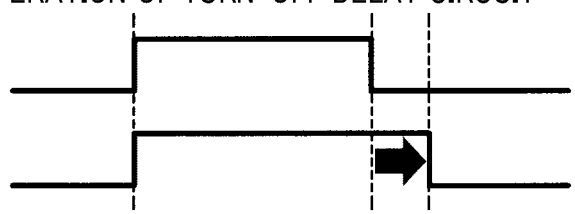
FIG. 24 is a timing chart of operations of a turn-off delay circuit.

As shown in FIG. 24, when the level of the input signal changes from high to low that is the turn-off level, the turn-off delay circuit 10 changes the signal outputted to the IGBT drive circuit 11 to low level upon elapse of a fixed delay time. For example, the IGBT drive circuit 11 is configured by a series circuit of two MOSFETs. For example, the IGBT drive circuit 8 outputs 15 V as the high-level drive voltage and 0 V as the low-level drive voltage to the gate of the IGBT 1.

Figure 23:
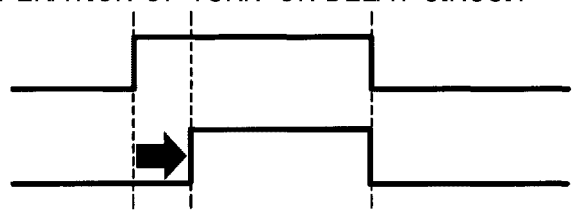
FIG. 23 is a timing chart of operations of a turn-on delay circuit.

In addition, after passing through a turn-on delay circuit 12, the input signal is provided to an input terminal 13a of a second selector 13. The input signal is also provided to an input terminal 13b of the second selector 13 via a turn-off delay circuit 14. As shown in FIG. 23, when the level of the input signal changes from low to high, i.e., the turn-on level, the turn-on delay circuit 12 changes the signal outputted to a MOS drive circuit 15 to high level upon elapse of a fixed delay time. The turn-on delay circuit 12 corresponds to a turn-on delay circuit. The operation of the turn-off delay circuit 14 is similar to that of the turn-off delay circuit 10.

An output terminal 13c of the selector 13 is connected to an input terminal of the MOS drive circuit 15. The MOS drive circuit 15 is also similarly configured by a series circuit of two MOSFETs. For example, the MOS drive circuit 15 outputs 20 V as the high-level drive voltage and −5 V as the low-level drive voltage to the gate of the FET 2. Here, for convenience of description, the IGBT drive circuit 11 and the MOS drive circuit 15 are both that which outputs the low-level drive voltage when the input signal is low level and outputs the high-level drive voltage when the input signal is high level.

The emitter terminal 4E of the detection element on the IGBT 1 side and the source terminal 6S of the detection element on the FET 2 side are each connected to the input terminal of the driver IC 8. For example, the terminal voltage of the resistor 5 detected by the former is used to detect abnormal current. However, according to the present embodiment, details thereof are omitted. Meanwhile, the terminal voltage of the resistor 7 detected by the latter is applied to the non-inverting input terminal of a comparator 16. A threshold voltage is applied to the inverting input terminal of the comparator 16.

The output terminal of the comparator 16 is connected to a set terminal S of an RS flip-flop 17. The input signal is provided to a negative-logic reset of the RS flip-flop 17 via a turn-off delay circuit 18. The operation of the turn-off delay circuit 18 is also similar to that of the turn-off delay circuit 10. The comparator 16 and the RS flip-flop 17 configure a switch (SW) element determination circuit 19. The output signal of the SW element determination circuit 19 controls switching of the selectors 9 and 13. The turn-off delay circuits 10, 14, and 18 respectively correspond to first, second, and third turn-off delay circuits.

When the control signal is low level, the selector 9 selects the input terminal 9a side and the selector 13 selects the input terminal 13b side. Then, when the control signal level is inverted, the selectors 9 and 13 each select the opposite side.

Figure 27:
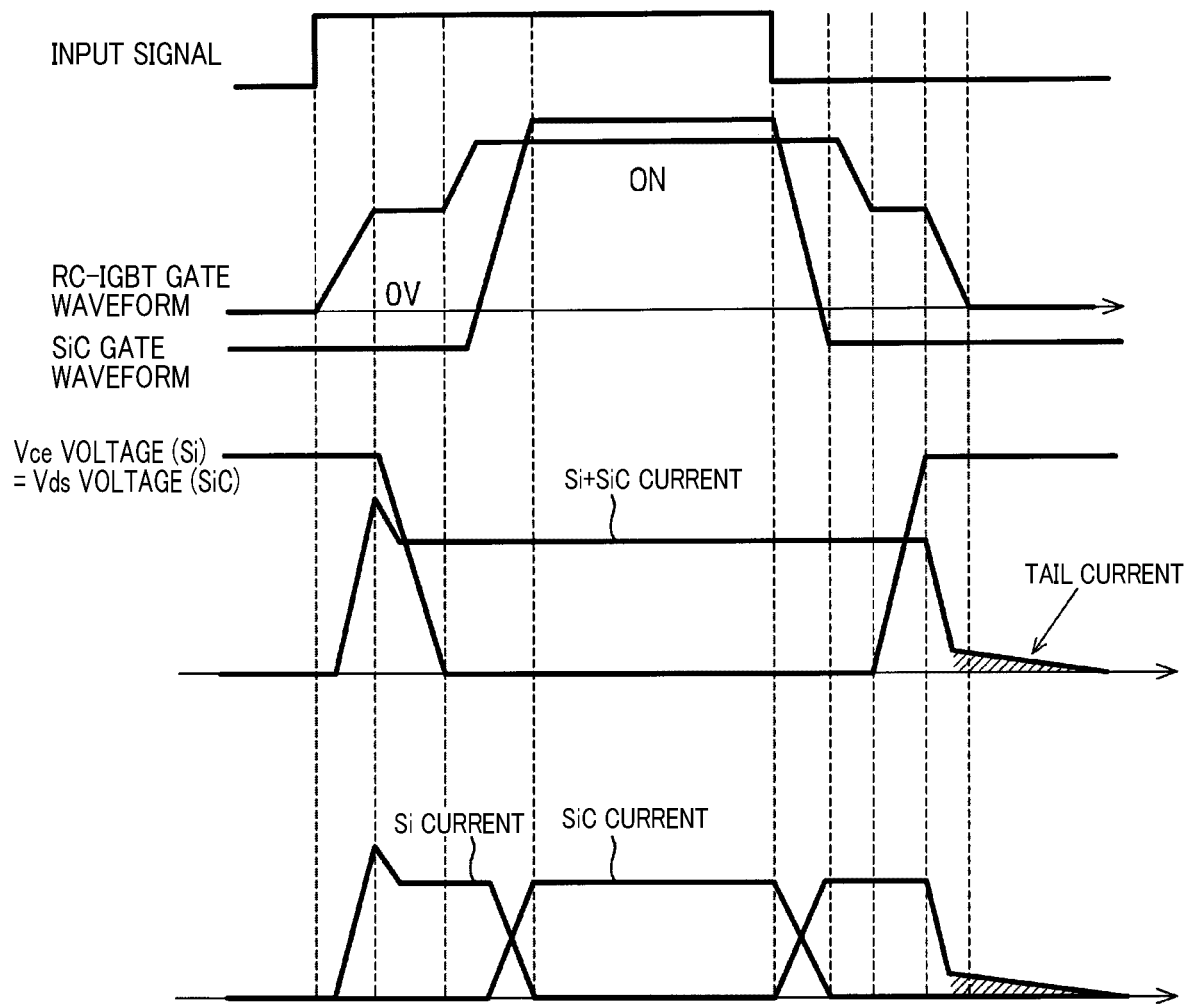
FIG. 27 is a timing chart of conventional operations when a load current is small.
Figure 28:
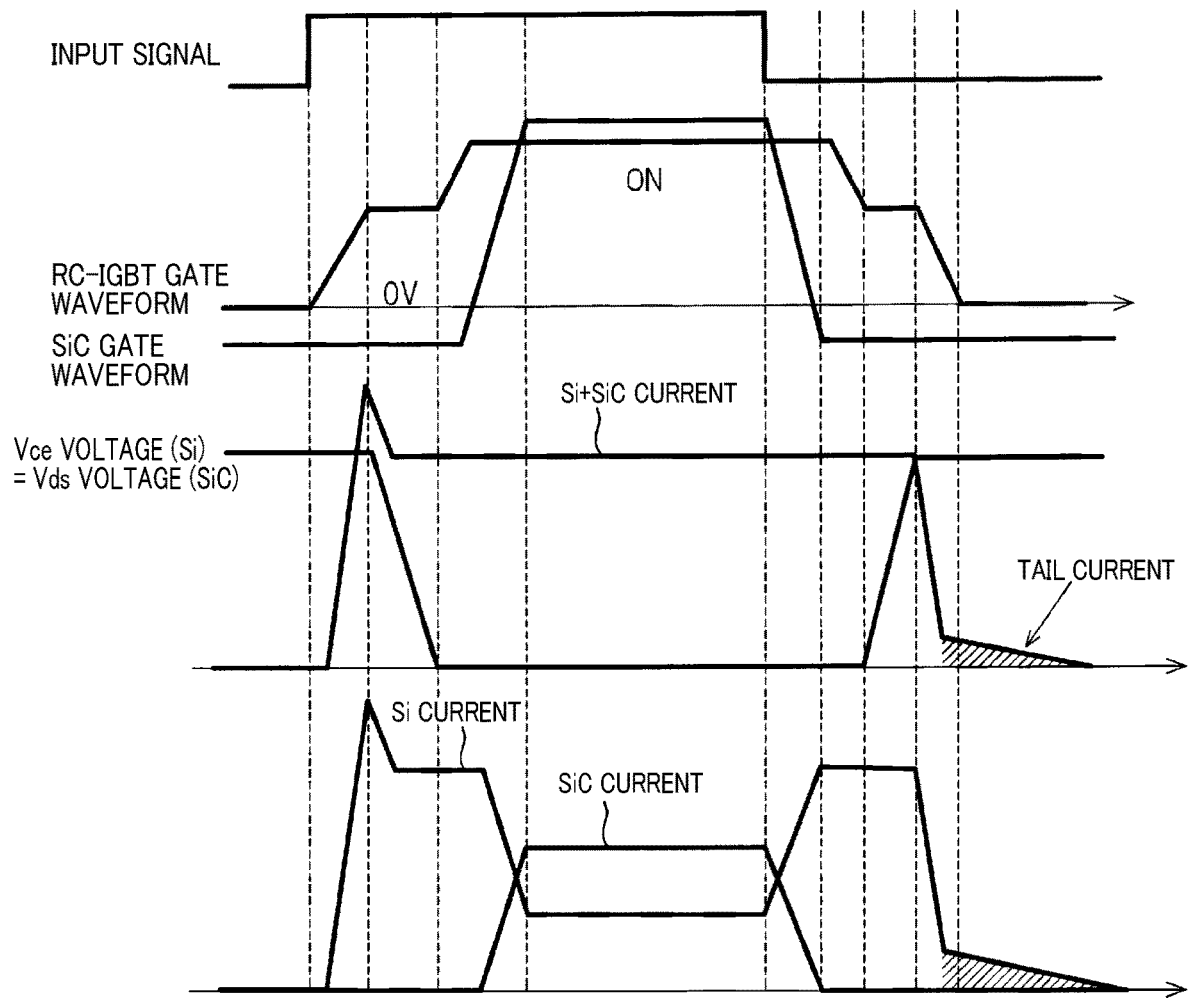
FIG. 28 is a timing chart of conventional operations when a load current is large.

Next, workings according to the present embodiment will be described. First, FIG. 27 and FIG. 28 show a case in which typical DC assist that is conventionally performed is performed. An operation principle according to the present embodiment will be described. As shown in FIG. 28, in a state in which the IGBT 1 and the FET 2 are both turned on, when the currents flowing to both elements are large, the load current exceeds current capability of the FET 2. Therefore, the current cannot be sent by only the FET 2. Consequently, DC assist in the conventional manner is unavoidably performed. The tail current starts to flow in the midst of the start of decrease in the gate voltage of the IGBT 1 from the Miller voltage.

Figure 26:
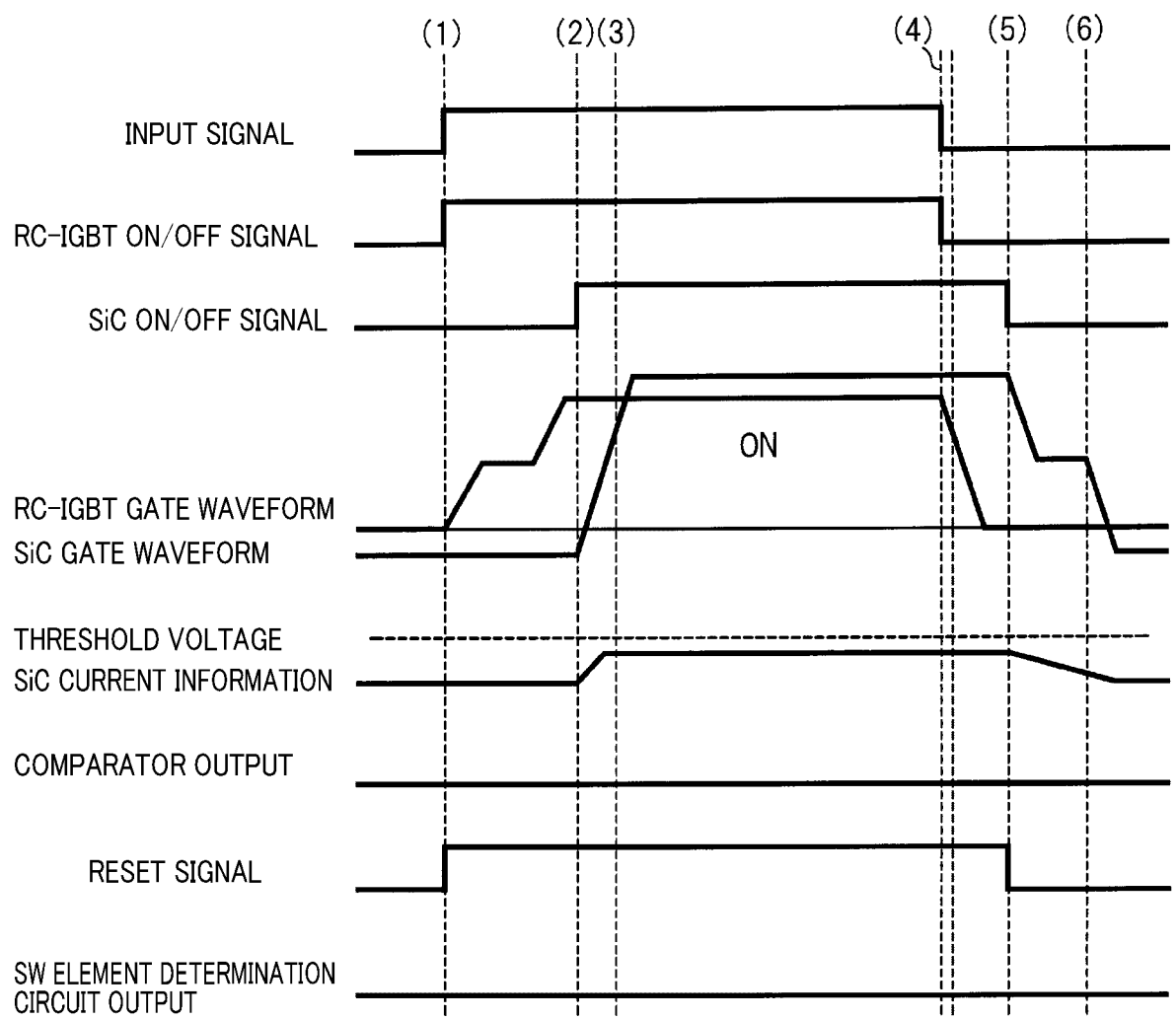
FIG. 26 is a timing chart of operations when a load current is large.

Meanwhile, FIG. 27 shows a case in which the load current is equal to or less than the current capability of the FET 2 when the IGBT 1 and the FET 2 are both turned on. However, when the IGBT 1 and the FET 2 are both turned on, the current flows to only the FET 2, and current hardly flows to the IGBT 1. However, in a manner similar to that in FIG. 28, the FET 2 is turned off first and the IGBT 1 is turned off thereafter. Therefore, the tail current is still generated. According to the present embodiment, control timings shown in FIG. 26 are actualized in response to the case shown in FIG. 27.

Figure 25:
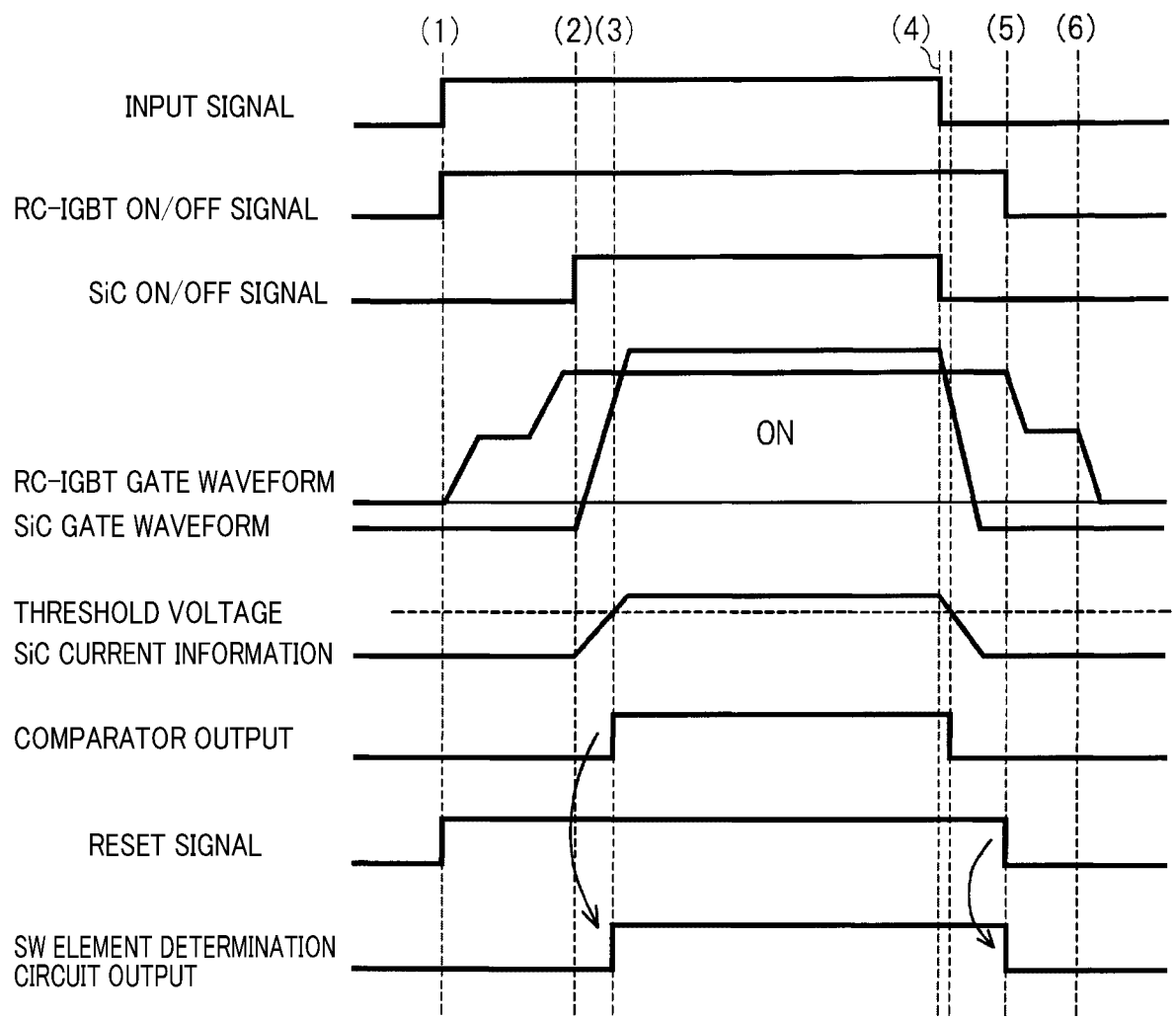
FIG. 25 is a timing chart of operations when a load current is small.

FIG. 25 corresponds to the case shown in FIG. 28. When the level of the input level is low, and the IGBT 1 and the FET 2 are both in the off-state, the terminal voltage of the resistor 7 detected by the comparator 16 is 0 V and is less than the threshold voltage. At this time, the selector 9 selects the input terminal 9a side and the selector 13 selects the input terminal 13b side. From this state, when the level of the input signal changes from low to high at time point (1), the IGBT 1 immediately starts turn-on.

Meanwhile, on the FET 2 side, the input signal is received by the MOS drive circuit 15 via the turn-on delay circuit 12 and the turn-off delay circuit 14. However, during turn-on, only the turn-on delay circuit 12 is working. Therefore, the FET 2 starts turn-on from time point (2) at which the delay time applied by the turn-on delay circuit 12 elapses.

In the state in which the IGBT 1 and the FET 2 are both turned on at time point (3), when the currents flowing to both elements are large and the terminal voltage of the resistor 7 detected by the comparator 16 exceeds the threshold voltage, the output signal of the comparator 16 becomes high level. As a result, the RS flip-flop 17 is set and the output signal of the SW element determination circuit 19 becomes high level. The selector 9 selects the input terminal 9b side and the selector 13 selects the input terminal 13a side. Then, the FET 2 starts turn-off from time point (4) at which the level of the input signal changes to low. The IGBT 1 starts turn-off from time point (5) at which the delay time applied by the turn-off delay circuit 10 elapses.

In addition, the delay time applied by the turn-off delay circuit 18 also elapses at time point (5). Therefore, the reset signal becomes low level and the RS flip-flop 17 is reset. As a result, the output signal of the SW element determination circuit 19 becomes low level, and the selectors 9 and 13 return to the state before time point (1).

In the case shown in FIG. 25, the load current exceeds the current capability of the FET 2. Therefore, the current cannot be sent by only the FET 2. Consequently, the turn-off operation by conventional parallel-drive control is performed. As a result, at time point (6), the tail current starts to flow in the midst of the start of decrease in the gate voltage of the IGBT 1 from the Miller voltage.

Meanwhile, FIG. 26 corresponds to the case shown in FIG. 27. When the FET 2 starts turn-on at time point (2), the level of "SiC current information" indicated in the FIG. 26 that is the terminal voltage of the resistor 7 starts to increase. However, because the terminal voltage of the resistor 7 is equal to or less than the threshold voltage at time point (3), the output signals of the comparator 16 and the SW element determination circuit 19 remain low level. Therefore, the selector 9 continues to select the input terminal 9a side and the selector 13 continues to select the input terminal 13b side.

Then, in relation to time point (4) at which the input signal falls, because the falling of an ON/OFF signal that is received by the IGBT drive circuit 11 also starts at time (4), the turn-off timing on the IGBT 1 side becomes earlier. In addition, the falling of an ON/OFF signal received by the MOS drive circuit 15 is delayed from time point (4) to time point (5). As a result, the turn-off start timings of the IGBT 1 and the FET 2 are interchanged from the case shown in FIG. 25. Turn-off of the FET 2 is completed after turn-off of the IGBT 1 is completed. Consequently, generation of the tail current is suppressed.

As described above, according to the present embodiment, the current that flows via the FET 2 is detected by the resistor 7 that is connected to the source terminal 6S. Then, when the IGBT 1 and the FET 2 are turned off, if the current is equal to or less than the threshold, the FET is turned off after the IGBT 1 is turned off. When the current exceeds the threshold, the IGBT 1 is turned off after the FET 2 is turned off.

Specifically, the IGBT drive circuit 11 and the MOS drive circuit 15 each apply the turn-on level voltage and the turn-off level voltage to the gate of the corresponding element based on the level change in the input signal. The turn-on delay circuit 12 is arranged on a path in which the input signal is received by the MOS drive circuit 15 and delays the rising timing of the input signal. The turn-off delay circuits 10 and 14 are respectively arranged on a path that branches from a path in which the input signal is directly received by the drive circuits 11 and 15, and delay the falling timing of the input signal.

The comparator 16 compares the terminal voltage of the resistor 5 and the voltage corresponding to the current threshold. The selector 9 is arranged on the input side of the IGBT drive circuit 11, and switches between a path in which the turn-off delay circuit 10 is interposed and a path in which the turn-off delay circuit 10 is not interposed. The selector 13 is arranged on the input side of the MOS drive circuit 15, and switches between a path in which the turn-off delay circuit 14 is interposed and a path in which the turn-off delay circuit 14 is not interposed. The RS flip-flop 17 is set by the output signal of the comparator 16 and reset by the output signal of the turn-off delay circuit 18. In addition, switching of the selectors 9 and 13 is performed by the output signal of the RS flip-flop 17.

In general, between the IGBT 1 and the FET 2, the current capability of the former is higher. Therefore, turn-off in a state in which a large current is flowing is basically required to be carried out by the IGBT 1. Here, the current that flows via the FET 2 is detected and the magnitude of the detected current is evaluated based on a threshold with reference to the current capability of the FET 2. Then, turn-off is performed as described above. When a current that falls within a range that can be handled by the current capability of the FET 2 is flowing, the IGBT 1 is turned off first, and the FET 2 is turned off thereafter. Consequently, generation of the tail current can be prevented and electric power loss can be reduced.

Other Embodiments

The non-inverting input terminal of the comparator 16 may be connected to the emitter terminal 4E and a collector current correspondence value of the IGBT 1 may be detected.

The turn-off delay circuit 18 may be eliminated and the output signal of the turn-off delay circuit 10 may be used.

The drive voltages of the IGBT 1 and the FET 2 may be changed as appropriate based on individual design.

The bipolar-type transistor is not limited to the RC-IGBT. In addition, the MOSFET is not limited to the SiC-MOSFET.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

<Fifth Disclosure>

Figure 29:
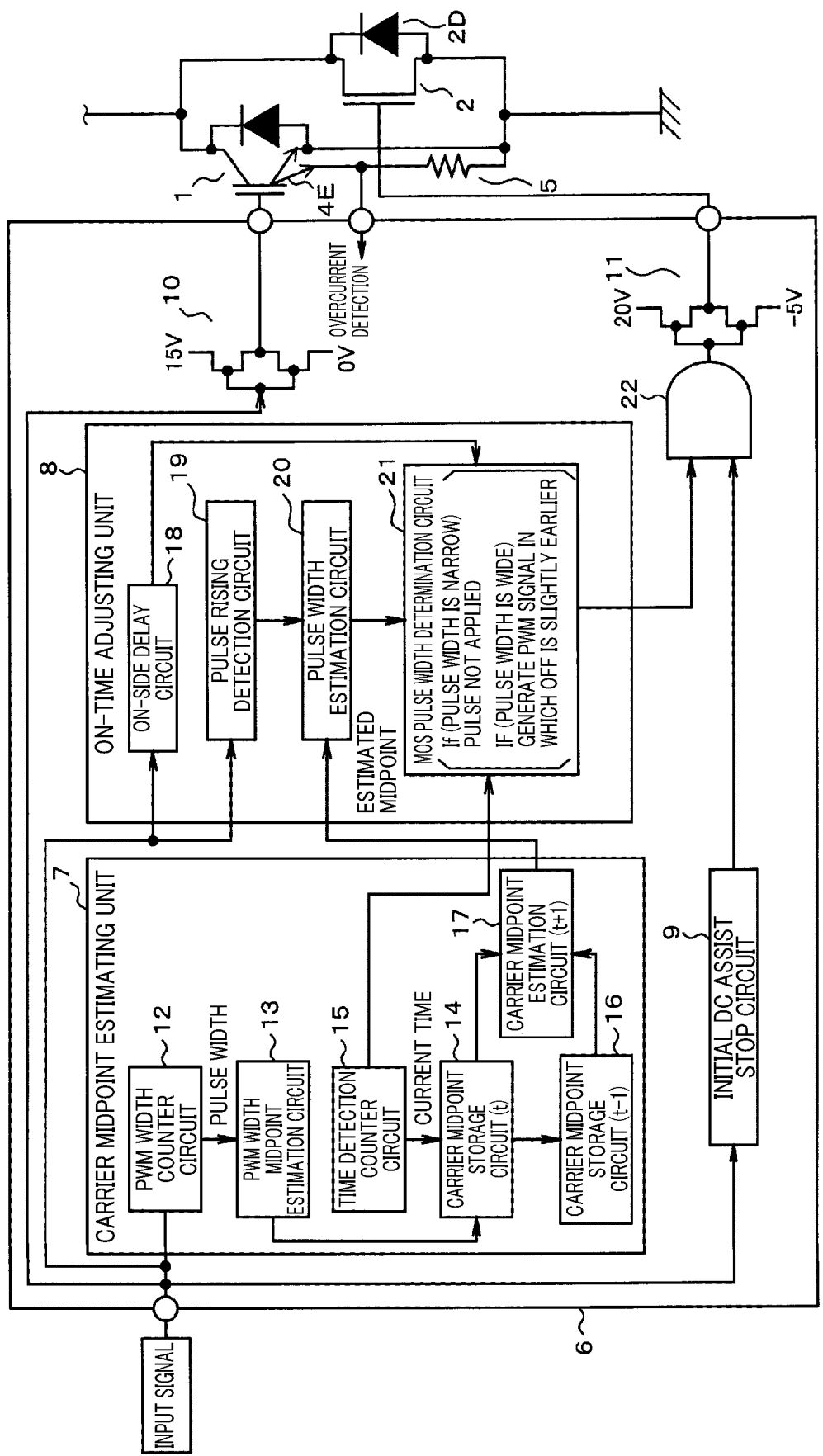
FIG. 29 is a functional block diagram of a configuration of a driver IC according to an embodiment corresponding to a fifth disclosure.

As shown in FIG. 29, the collector and the emitter of the RC-IGBT 1 and the drain and the source of the SiC-MOSFET 2 are respectively commonly connected. For example, the collector of the IGBT 1 and the drain of the FET 2 are connected to an element on the upper arm side (not shown) that is configured by elements that are similarly connected in parallel. The emitter of the IGBT 1 and the source of the FET 2 are connected to the ground.

A detection element for dividing the flow of the collector current and detecting the collector current is provided in the IGBT 1. However, in FIG. 29, only the emitter terminal 4E of the detection element is shown. The emitter terminal 4E is connected to the ground by the resistor 5. In addition, the reverse-direction parasitic diode 2D is connected between the drain and the source of the FET 2. The emitter terminal 4E is connected to the input terminal of the drive IC 6. For example, the terminal voltage of the resistor is used to detect an overcurrent.

A PWM signal that controls driving of the IGBT 1 is received by the driver IC 6 from a control circuit (not shown). The driver IC 6 includes a carrier midpoint estimating unit 7, an on-time adjusting unit 8, an initial DC assist stop circuit 9, an IGBT drive circuit 10, and a MOS drive circuit 11. The PWM signal is received by each of the circuits 7 to 10 among the foregoing. For example, the IGBT drive circuit 10 is configured by a series circuit of two MOSFETs. For example, the IGBT drive circuit 10 outputs 15 V as the high-level drive voltage and 0 V as the low-level drive voltage to the gate of the IGBT 1.

Figure 30:
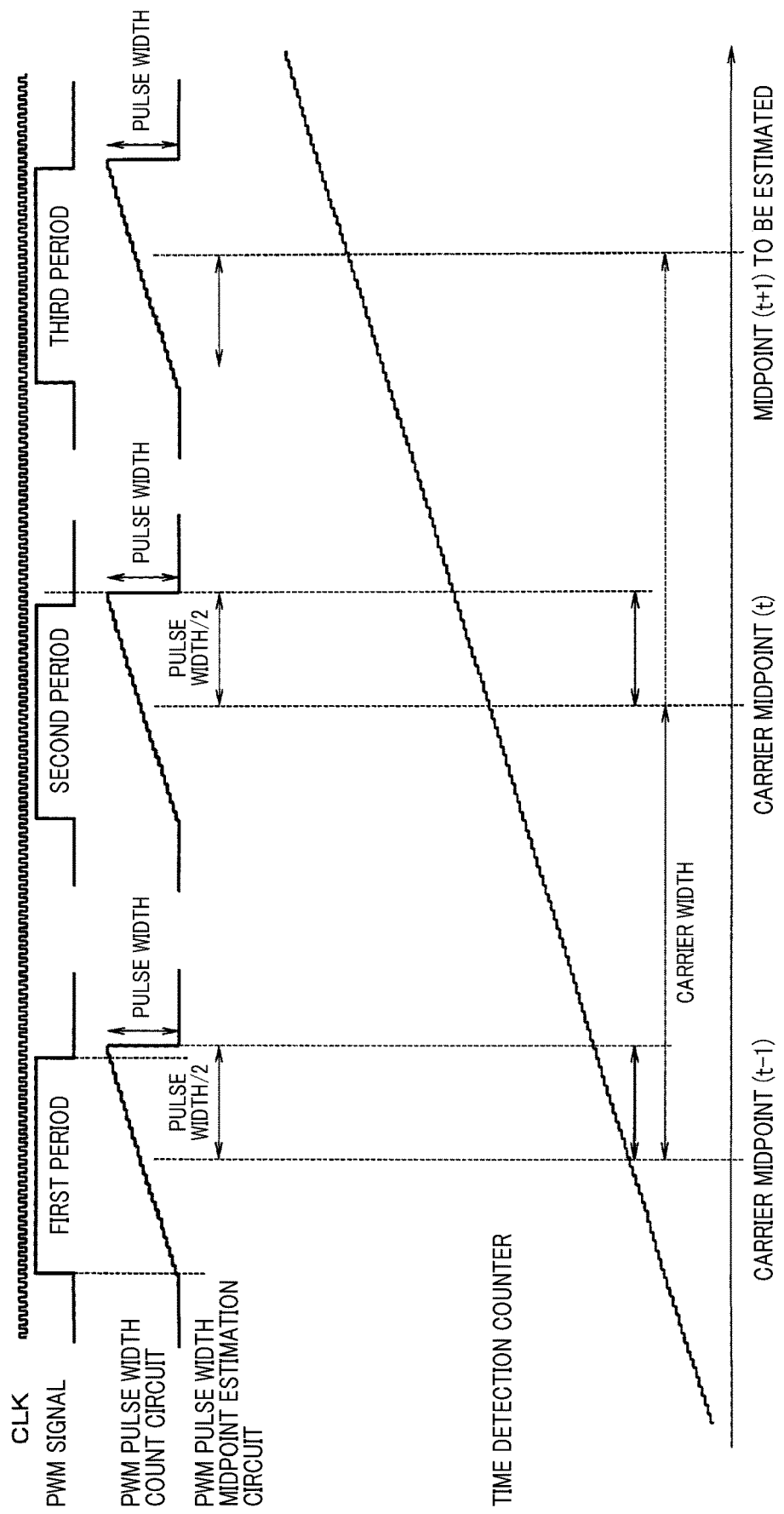
FIG. 30 is a timing chart for explaining a method for estimating an intermediate time point of a PWM carrier period.

As shown in FIG. 30 as well, in the carrier midpoint estimating unit 7, a PWM width counter circuit 12 counts a pulse width of the PWM signal by a clock signal CLK of which the period is shorter than that of the carrier of the PWM signal. The count value is received by a PWM width midpoint estimation circuit 13. The PWM width counter circuit 12 corresponds to a timer. The PWM width midpoint estimation circuit 13 inputs a value that is half the received count value to a carrier midpoint storage circuit 14 at time (t).

For example, a time detection counter circuit 15 is a free-running timer that performs a counting operation based on the clock signal CLK. The current time that is the timer value of the time detection counter circuit 15 is received by the carrier midpoint storage circuit 14 at time (t). In addition, the above-described current time is also received by the on-time adjusting unit 8. The carrier midpoint storage circuit 14 at time (t) stores a value that is the current time to which the above-described halved count value is added as second data that corresponds to a second period. In addition, every time the carrier period elapses, the carrier midpoint storage circuit 14 at time (t) transfers the above-described stored value to a carrier midpoint storage circuit 16 at time (t−1) and stores the stored value as first data that corresponds to a first period.

The stored values of the carrier midpoint storage circuits 14 and 16 are both received by a carrier midpoint estimation circuit 17 at time (t+1). The carrier midpoint estimation circuit 17 at time (t+1) estimates an intermediate time of the carrier in a third period that follows the second period in the following manner.

$$\text{Intermediate time } (t+1) = (\text{second data}) + \{(\text{second data}) - (\text{first data})\}$$

The data on the estimated intermediate time is received by the on-time adjusting unit 8. The carrier midpoint estimation circuit 17 corresponds to a subtractor and an adder. Here, the first to third periods are relative designations. When a PWM period at a certain time point is the "first cycle," the following cycle is the "second cycle" and the cycle further following the second cycle is the "third cycle."

The on-time adjusting unit 8 includes an on-side delay circuit 18, a pulse rising detection circuit 19, a pulse width estimation circuit 20, and a MOS pulse width determination circuit 21. The on-side delay circuit 18 delays only the rising timing of the received PWM signal by a fixed amount of time and inputs the PWM signal to the MOS pulse width determination circuit 21. The pulse rising detection circuit 19 detects the rising timing of the PWM signal and inputs the rising timing to the pulse width estimation circuit 20.

Figure 31:
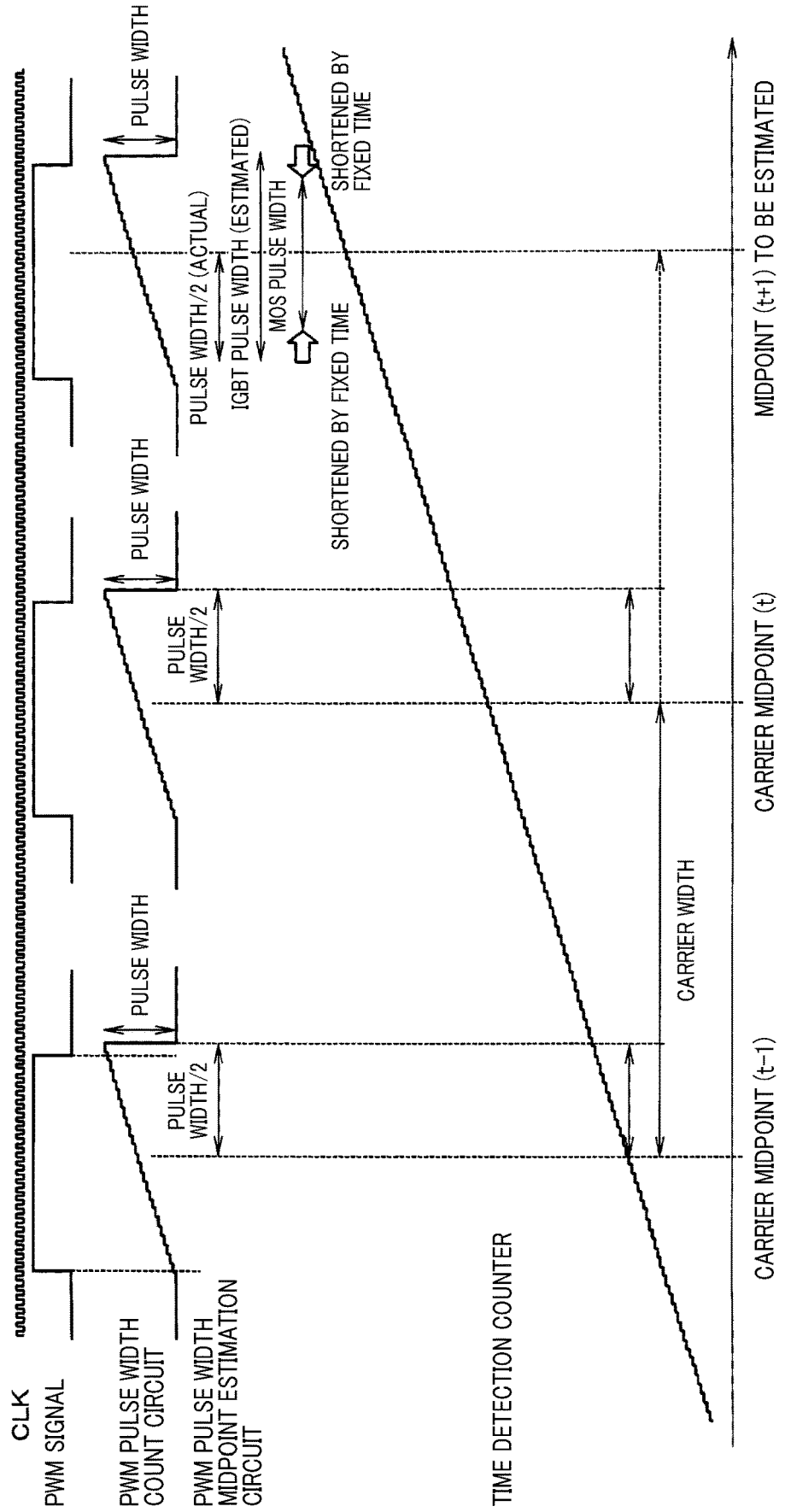
FIG. 31 is a timing chart for explaining a method for determining an on-time of a FET.

As shown in FIG. 31, the pulse width estimation circuit 20 estimates the pulse width of the PWM signal outputted to the IGBT 1 from the rising timing of the PWM signal and the intermediate time (t+1) provided by the carrier midpoint estimating unit 7, and inputs the pulse width to the MOS pulse width determination circuit 21.

In the MOS pulse width determination circuit 21, an on-time width of the FET 2 in the third period is determined in the following manner. When the IGBT pulse width is equal to or greater than a predetermined amount of time, as shown in FIG. 3 FIG. 31, a pulse width that is adjusted such that the rising timing of the IGBT pulse width is delayed by a fixed amount of time and the falling timing is made earlier by a fixed amount of time is determined as the on-time width of the FET 2. Meanwhile, when such an adjustment is made when the IGBT pulse width is less than the predetermined amount of time, the on-time width of the FET 2 becomes zero. Therefore, in this case, the output of the PWM signal is stopped.

The PWM signal determined by the MOS pulse width determination circuit 21 is received by the MOS drive circuit 11 via an AND gate 22. The MOS drive circuit 11 is also similarly configured by a series circuit of two MOSFETs. For example, the MOS drive circuit 11 outputs 20 V as the high-level drive voltage and −5 V as the low-level drive voltage to the gate of the FET 2. Here, the IGBT drive circuit 10 and the MOS drive circuit 11 are both that which outputs the low-level drive voltage when the input signal is low level and outputs the high-level drive voltage when the input signal is high level.

However, according to the present embodiment, the on-time adjusting unit 8 determines the duty of the PWM signal provided to the FET 2 as described above. Therefore, regarding a period that corresponds to two consecutive periods of the carrier when the output of the PWM signal is started during startup of the driver IC 6, the initial DC assist stop circuit 9 inputs a low-level signal to the AND gate 22 to stop parallel drive of the FET 2, that is, to stop DC assist. Then, the signal is changed to high level from the following third period and thereafter, and the signal outputted by the MOS pulse width determination circuit 21 is made valid.

Figure 32:
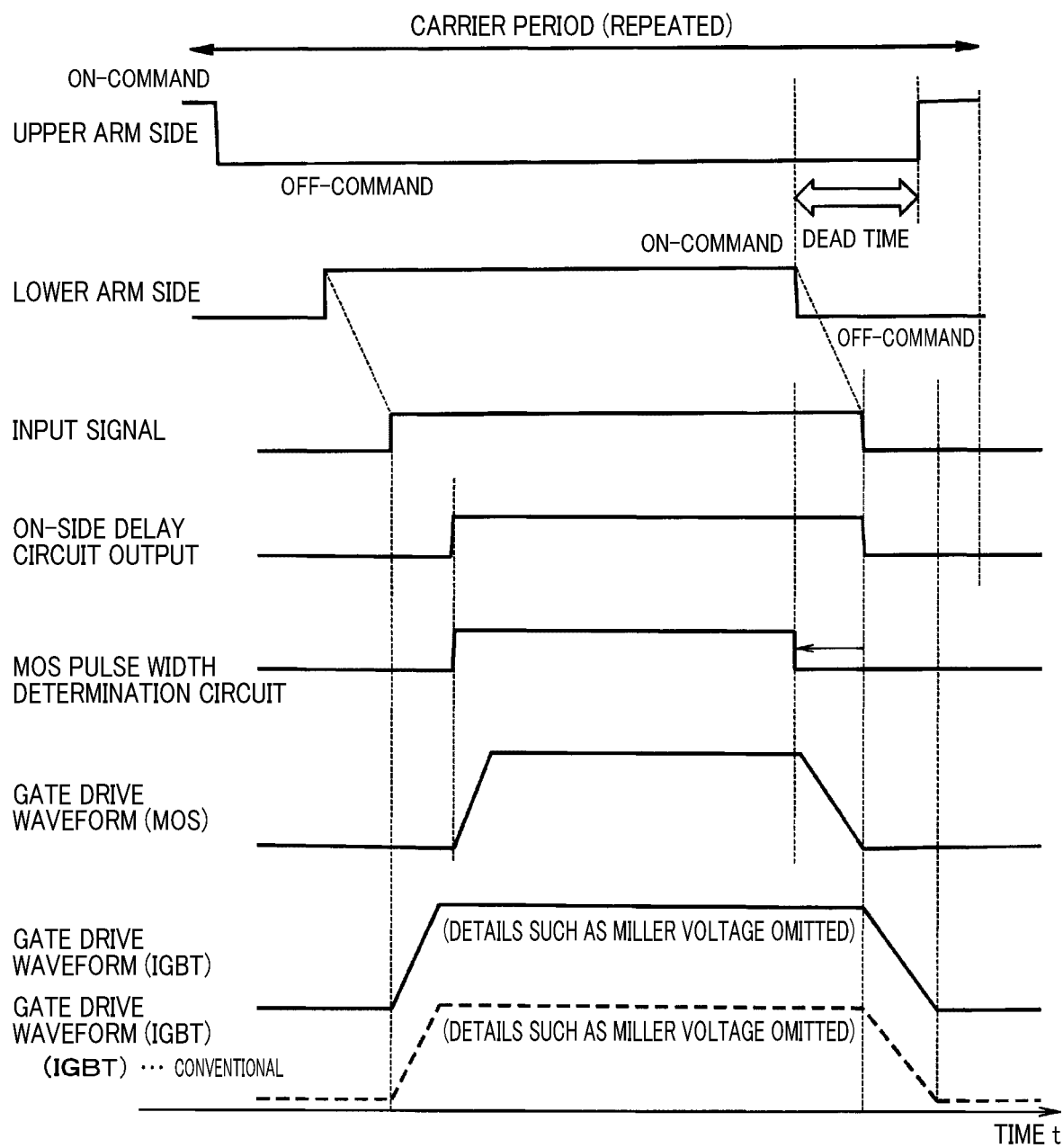
FIG. 32 is an operation timing chart of a driver IC.

As a result, as shown in FIG. 32, the turn-off start timing of the FET 2 can be made earlier than the falling timing of the signal received by isolated communication via a coupler or the like to the driver IC 6. Consequently, even when the IGBT 1 is driven simultaneously with the FET 2 connected in parallel to the the IGBT 1, the timing at which turn-off of the IGBT 1 is started becomes equal to that when only the IGBT 1 is driven.

As described above, according to the present embodiment, the carrier midpoint estimating unit 7 estimates the intermediate time of the period of the carrier generating the received PWM signal. Then, the on-time adjusting unit 8 adjusts the on-time of the FET 2 by the MOS drive circuit 11 based on the estimated intermediate time. As a result of a configuration such as this, the timing at which turn-off of the FET 2 is started can be determined with the estimated intermediate time of the carrier period as a starting point. Therefore, the timing can be made earlier than that based on the PWM signal that is actually received by the IC 6. Consequently, the amount of time until turn-off is completed can be made equal to that when only the IGBT 1 is driven. Controllability can be improved.

In addition, the carrier midpoint estimating unit 7 counts the period from rising to falling of the PWM signal by the PWM width counter circuit 12. The PWM width midpoint estimation circuit 13 halves the counted timer value. Regarding consecutive first and second periods, the carrier midpoint storage circuits 14 and 16 add the value of the halved counter value to the current time that is the timer value of the time detection counter circuit 15, and respectively store the values as first and second data. Then, the carrier midpoint estimation circuit 17 determines the difference between the first data and the second data, and sets the result of the second data being added to the difference as an estimation value of the intermediate time of the carrier period. In the third period following the second period, the MOS pulse width determination circuit 21 uses the estimation value when turning on the FET 2. As a result of a configuration such as this, the intermediate time of the carrier period can be appropriately estimated and the timing at which turn-off of the FET 2 is started can be made earlier.

In addition, when the pulse width estimation circuit 20 estimates the on-time of the IGBT 1 based on the rising timing of the PWM signal and the estimation value of the intermediate time, the MOS pulse width determination circuit 21 sets the result of a predetermined value being subtracted from the on-time estimated from the rising timing that is delayed by the on-side delay circuit 18 as the on-time of the FET 2, and turns on the FET 2 within a period before and after the intermediate time. As a result of a configuration such as this, the on-time of the FET 2 can be shortened compared to the time based on the PWM signal that is actually received. Consequently, DC assist can be reliably performed and the time until turn-off is completed can be made equal to that when only the IGBT 1 is driven.

In addition, regarding the period that corresponds to two consecutive periods of the carrier when the output of the PWM signal is started during startup of the driver IC 6, the initial DC assist stop circuit 9 inputs the low-level signal to the AND gate 22 and stops DC assist. The initial DC assist stop circuit 9 changes the output signal to high level from the following third period and thereafter, and the signal outputted by the MOS pulse width determination circuit 21 is made valid. As a result of a configuration such as this, the FET 2 being turned on during a period in which the intermediate time of the carrier period cannot be estimated can be prevented.

Other Embodiments

The drive voltages of the IGBT 1 and the FET 2 may be changed as appropriate based on individual design.

The bipolar-type transistor is not limited to the RC-IGBT. In addition, the MOSFET is not limited to the SiC-MOSFET.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.
<Sixth Disclosure>

First Embodiment

Figure 33:
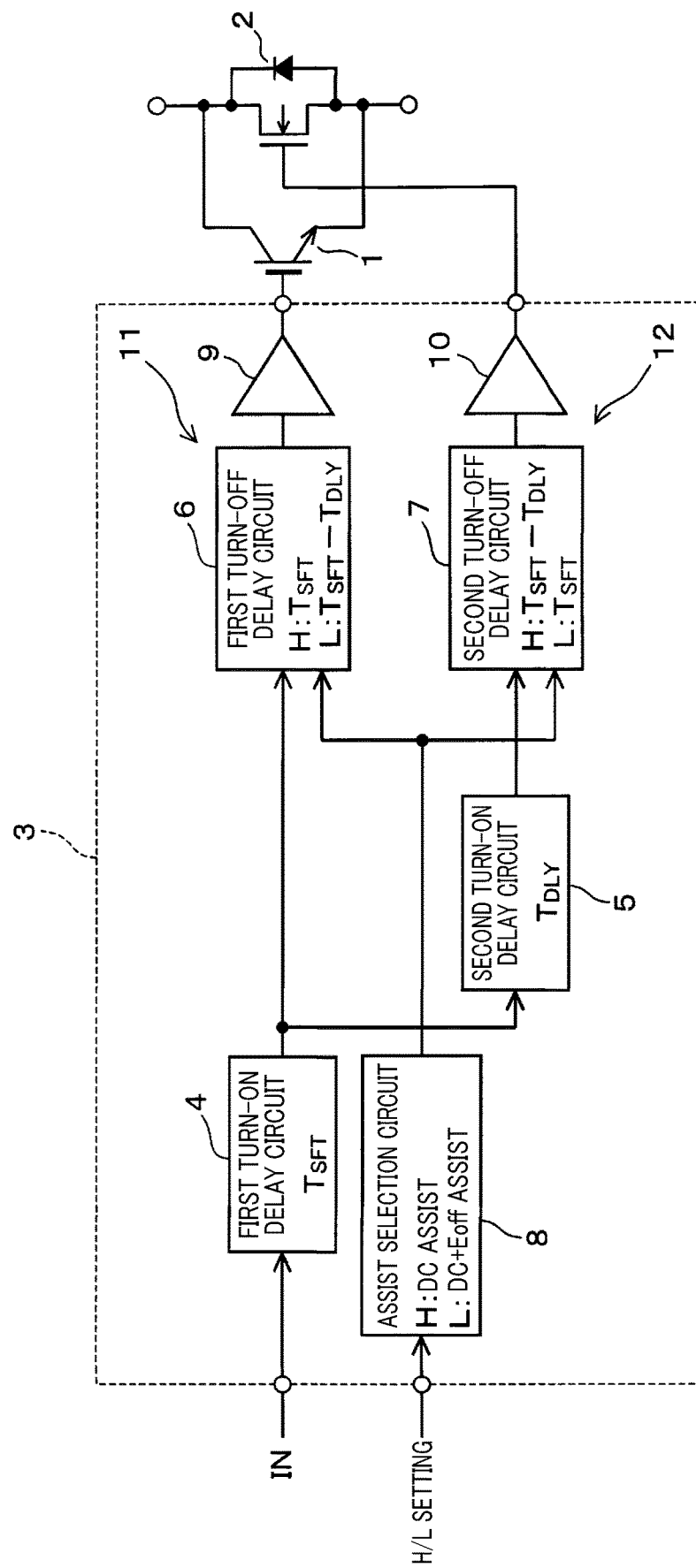
FIG. 33 is a functional block diagram of a configuration of a driver IC according to a first embodiment corresponding to a sixth disclosure.

As shown in FIG. 33, the collector and the emitter of the RC-IGBT 1 and the drain and the source of the SiC-MOSFET 2 are respectively commonly connected. For example, the collector of the IGBT 1 and the drain of the FET 2 are connected to an element on the upper arm side (not shown) that is configured by elements that are similarly connected in parallel. For example, the emitter of the IGBT 1 and the source of the FET 2 are connected to the ground.

A PWM signal that controls driving of the IGBT 1 is received by the driver IC 3 from a control circuit (not shown). The driver IC 3 includes a first turn-on delay circuit 4, a second turn-on delay circuit 5, a first turn-off delay circuit 6, a second turn-off delay circuit 7, an assist selection circuit 8, and drivers 9 and 10. The PWM signal is received by the first turn-on delay circuit 4.

The output terminal of the first turn-on delay circuit 4 is connected to the input terminals of the second turn-on delay circuit 5 and the first turn-off delay circuit 6. The output terminal of the second turn-on delay circuit 5 is connected to the input terminal of the second turn-off delay circuit 7. The output terminals of the first turn-off delay circuit 6 and the second turn-off delay circuit 7 are respectively connected to the input terminals of the driver 9 and the driver 10. The output terminals of the driver 9 and the driver 10 are respectively connected to the gates of the IGBT 1 and the FET 2.

The assist selection circuit 8 is a one-bit register to which a binary level of high or low is written and set by an external source. The output terminal of the assist selection circuit 8 is connected to respective control input terminals of the first turn-off delay circuit 6 and the second turn-off delay circuit 7.

The turn-on delay circuits 4 and 5 work on only the rising edge of the received signal and apply a delay time. The delay times applied by the delay circuits 4 and 5 are respectively $T_{SFT}$ and $T_{DLY}$ ($<T_{SFT}$). Therefore, the delay time applied when the IGBT 1 is turned on is $T_{SFT}$. The delay time applied when the FET 2 is turned on is ($T_{SFT}+T_{DLY}$). $T_{SFT}$ and $T_{DLY}$ respectively correspond to first and second delay times.

The turn-off delay circuits 6 and 7 work on only the falling edge of the received signal and apply delay times. The delay times change based on the setting in the assist selection circuit 8. The delay circuit 6 sets the delay time to $T_{SFT}$ when the setting is high level and sets the delay time to ($T_{SFT}-T_{DLY}$) when the setting is low level. The delay time ($T_{SFT}-T_{DLY}$) corresponds to a difference time.

Conversely, the delay circuit 7 sets the delay time to ($T_{SFT}-T_{DLY}$) when the setting is high level and sets the delay time to $T_{SFT}$ when the setting is low level. Hereafter, a drive mode when the setting in the assist selection circuit 8 is high level is referred to as "DC assist." A drive mode when the setting is low level is referred to as "DC+Eoff assist." "DC assist" corresponds to a first drive method and "DC+Eoff assist" corresponds to a second drive method.

In addition, hereafter, the delay circuits 4 and 6 and the driver 9 configure the IGBT drive circuit 11. The delay circuits 4, 5, and 7 and the driver 10 configure a MOS drive circuit 12. The IGBT drive circuit 11 corresponds to a bipolar drive circuit.

Figure 34:
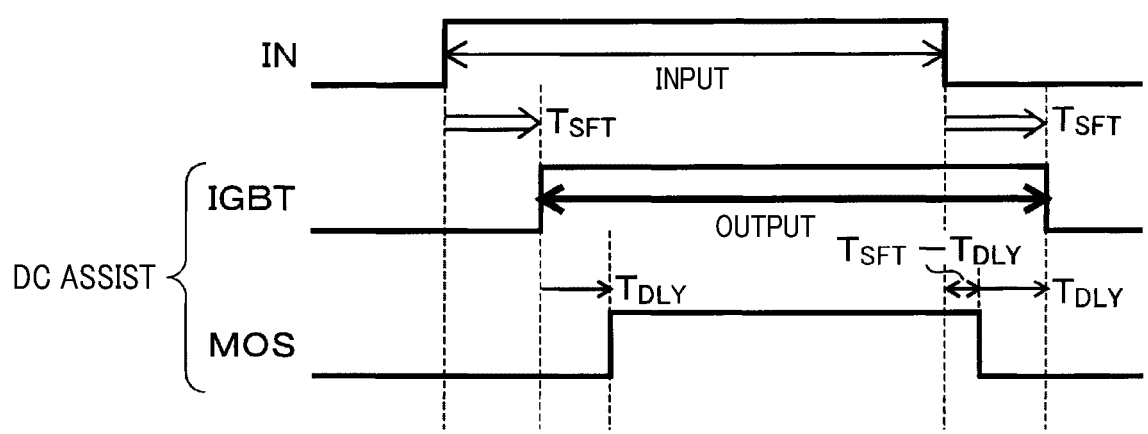
FIG. 34 is a timing chart of a driving state by "DC assist;"

Next, workings according to the present embodiment will be described. In the case of "DC assist" shown in FIG. 34, the delay time from a rising edge timing of an input signal IN until the IGBT 1 starts turn-on is $T_{SFT}$. The delay time until the FET 2 starts turn-on is ($T_{SFT}+T_{DLY}$). In addition, the delay time from a falling edge timing of the input signal IN until the FET starts turn-off is ($T_{SFT}-T_{DLY}$). The delay time until the IGBT 1 starts turn-off is $T_{SFT}$.

Figure 36:
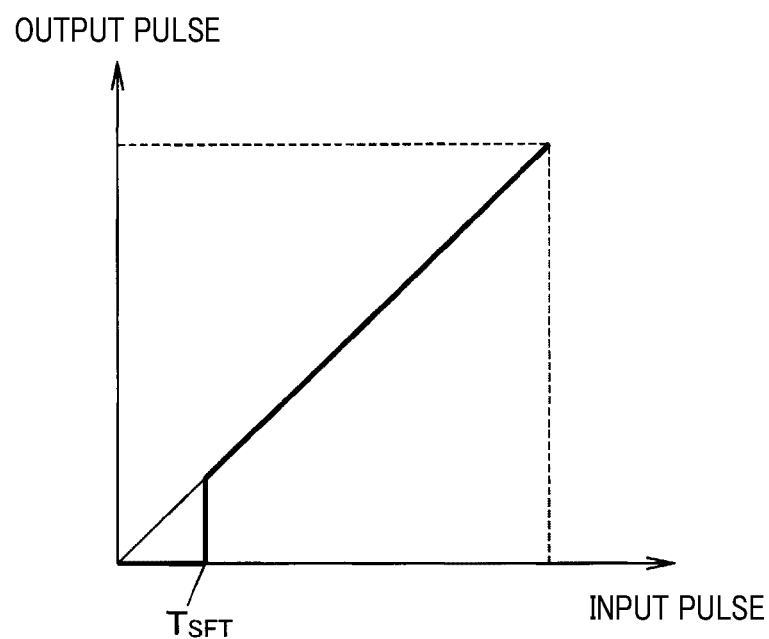
FIG. 36 is a diagram of a relationship between an input pulse width and an output pulse width in "DC assist;"

That is, the IGBT 1 is turned on after time $T_{SFT}$ elapses from the rising edge timing of the input signal IN, and turned off after time $T_{SFT}$ elapses from the falling edge timing of the input signal IN. In addition, the FET 2 is turned on and turned off during the period in which the IGBT 1 is turned on. Therefore, the period in which the IGBT 1 is turned on is the same as the high-level pulse width of the input signal IN. The relationship between the pulse width of the input signal IN in this case and an output pulse width corresponding to the period in which the IGBT 1 is turned on is as shown in FIG. 36.

Figure 35:
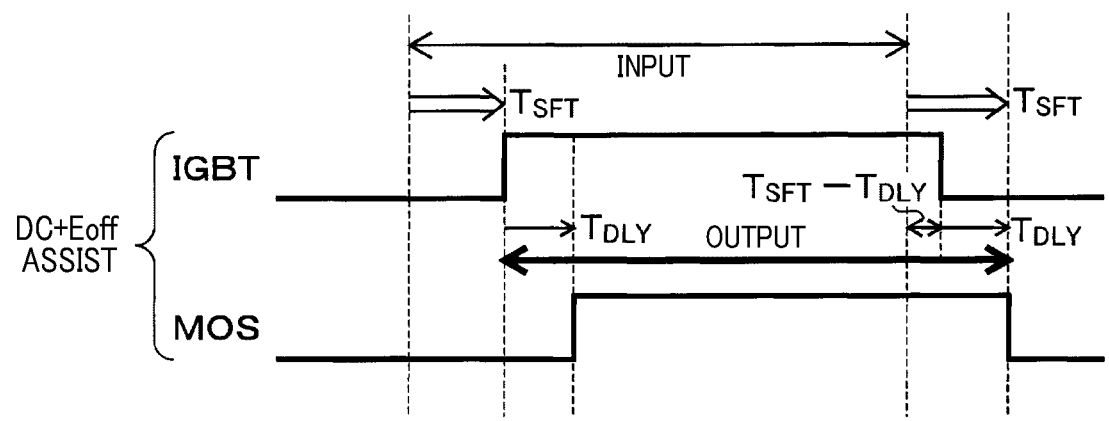
FIG. 35 is a timing chart of a driving state by "DC+Eoff assist;"
Figure 37:
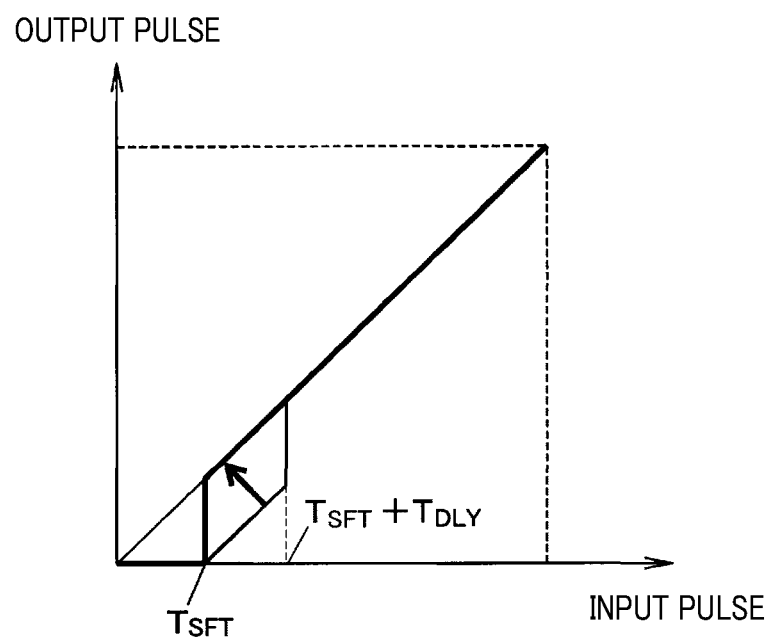
FIG. 37 is a diagram of a relationship between an input pulse width and an output pulse width in "DC+Eoff assist;"

Meanwhile, in the case of "DC+Eoff assist" shown in FIG. 35, the delay times until the IGBT 1 and the FET 2 respectively start turn-on are the same as those for "DC assist." Meanwhile, the delay times from the falling edge timing of the input signal IN until the IGBT 1 and the FET 2 respectively start turn-off are the reverse of those for "DC assist." That is, the IGBT 1 is turned off first, and the FET 2 is turned off thereafter. In this case as well, the amount of time from when the IGBT 1 is turned on until the FET 2 is turned off is the same as the high-level pulse width of the input signal IN. The relationship between the pulse width of the input signal IN in this case and the output pulse width corresponding to the period from when the IGBT 1 is turned on until the FET 2 is turned off is as shown in FIG. 37.

As described above, according to the present embodiment, when the received PWM signal becomes the turn-on level, the IGBT drive circuit 11 applies the turn-on level voltage to the gate of the IGBT 1 after the elapse of time $T_{SFT}$. Then, when the PWM signal becomes the turn-off level, in the case in which "DC assist" is selected in the assist selection circuit 8, the turn-off level voltage is applied to the gate after the elapse of time $T_{SFT}$. In the case in which "DC+Eoff assist" is selected, the turn-off level voltage is applied to the gate after the elapse of the difference time $(T_{SFT}-T_{DLY})$.

When the PWM signal becomes the turn-on level, the MOS drive circuit 12 applies the turn-on level voltage to the gate of the FET 2 after the elapse of time $T_{DLY}$ that is set to be shorter than time $T_{SFT}$, after the elapse of time $T_{SFT}$. In addition, when the PWM signal becomes the turn-off level, in the case in which "DC assist" is selected, the turn-off level voltage is applied to the gate after the elapse of the $(T_{SFT}-T_{DLY})$. In the case in which "DC+Eoff assist" is selected, the turn-off level voltage is applied to the gate after the elapse of time $T_{SFT}$.

As a result, when "DC assist" is selected, the on-period of the IGBT 1 becomes equal to the period in which the PWM signal indicates the on-level. In addition, the FET 2 is turned on in a shorter period during the on-period of the IGBT 1. As a result, on-resistance can be reduced compared that to when the IGBT 1 is singly turned on.

Meanwhile, when "DC+Eoff assist" is selected, the period from when the IGBT 1 is turned on until FET 2 is turned off is equal to the period in which the input signal indicates the on-level. In addition, because the FET 2 is turned off after the IGBT 1 is turned off, switching loss during turn-off can also be reduced. Furthermore, when the IGBT 1 and the FET 2 that are connected in parallel are considered to be a single element, because the on-period of the element is equal to the period in which the received PWM signal indicates the on-level in either drive method, decrease in controllability can be avoided.

Second Embodiment

Figure 38:
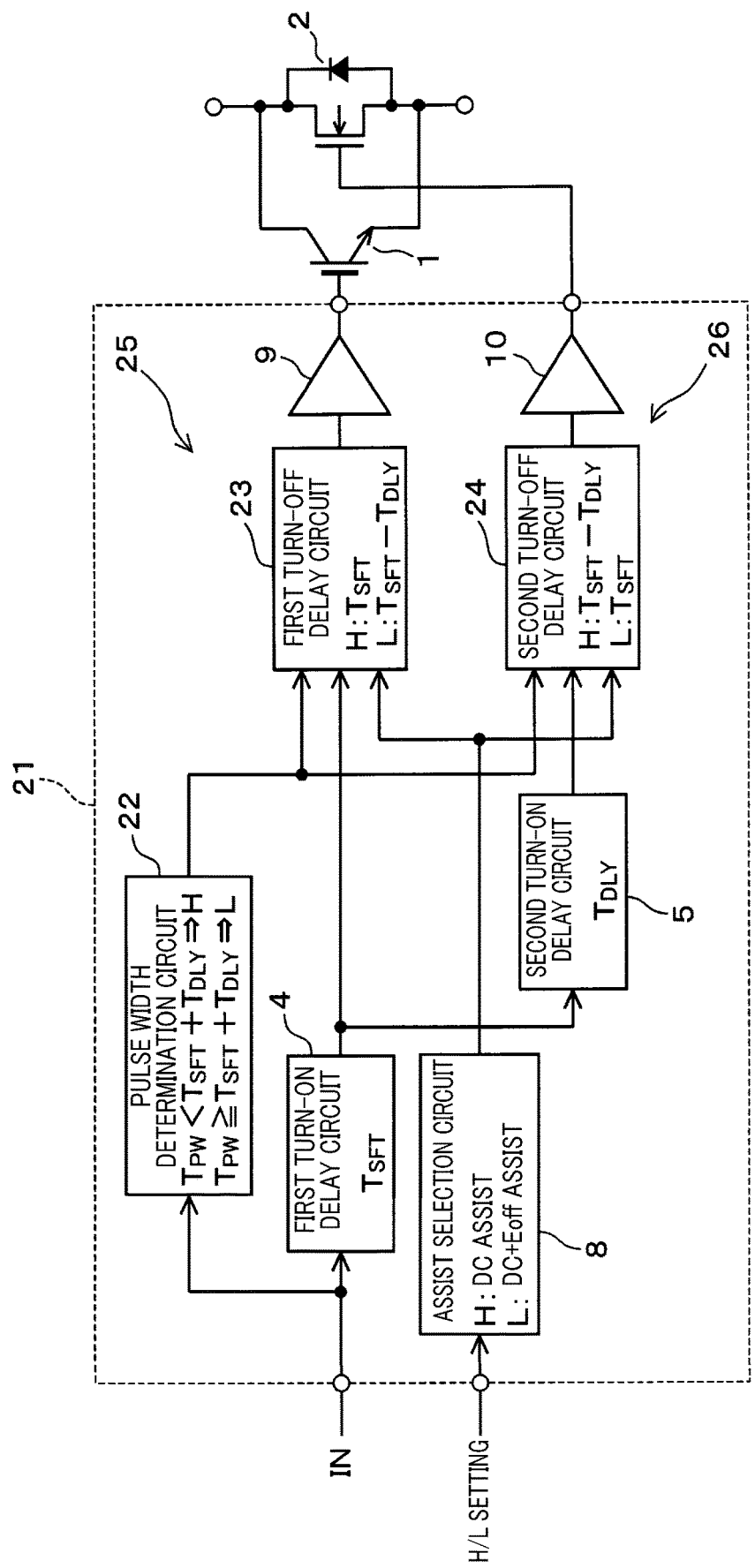
FIG. 38 is a second embodiment and a functional block diagram of a configuration of a driver IC.

Hereafter, sections that are identical to those according to the first embodiment are given the same reference numbers and the descriptions are omitted. Differing sections will be described. The driver IC 21 according to the second embodiment shown in FIG. 38 is a configuration in which a pulse width determination circuit 22 is added to the driver IC 3. In addition, the turn-off delay circuits 6 and 7 are respectively replaced by turn-off delay circuits 23 and 24. The PWM signal is received by the input terminal of the pulse width determination circuit 22. The output terminal of the pulse width determination circuit 22 is connected to the input terminals of the turn-off delay circuits 23 and 24. In addition, an IGBT drive circuit 25 and a MOS drive circuit 26 are configured instead of the IGBT drive circuit 11 and the MOS drive circuit 12.

The pulse width determination circuit 22 includes a counter (not shown) and counts a high-level pulse width $T_{PW}$ of the received PWM signal by the counter. Then, the pulse width determination circuit 22 compares the counted pulse width $T_{PW}$ with a threshold $(T_{SFT}+T_{DLY})$ and outputs a binary signal H or L in the following manner, based on a magnitude relationship therebetween.

$$T_{PW} < T_{SFT} + T_{DLY} \rightarrow H \quad (1)$$

$$T_{PW} \geq T_{SFT} + T_{DLY} \rightarrow L \quad (2)$$

Even in cases in which "DC+Eoff assist" is selected in the assist selection circuit 8, when the level of the signal received by the pulse width determination circuit 22 is H, the turn-off delay circuits 23 and 24 set the delay times that are set during turn-off to the delay times corresponding to "DC assist".

Figure 39:
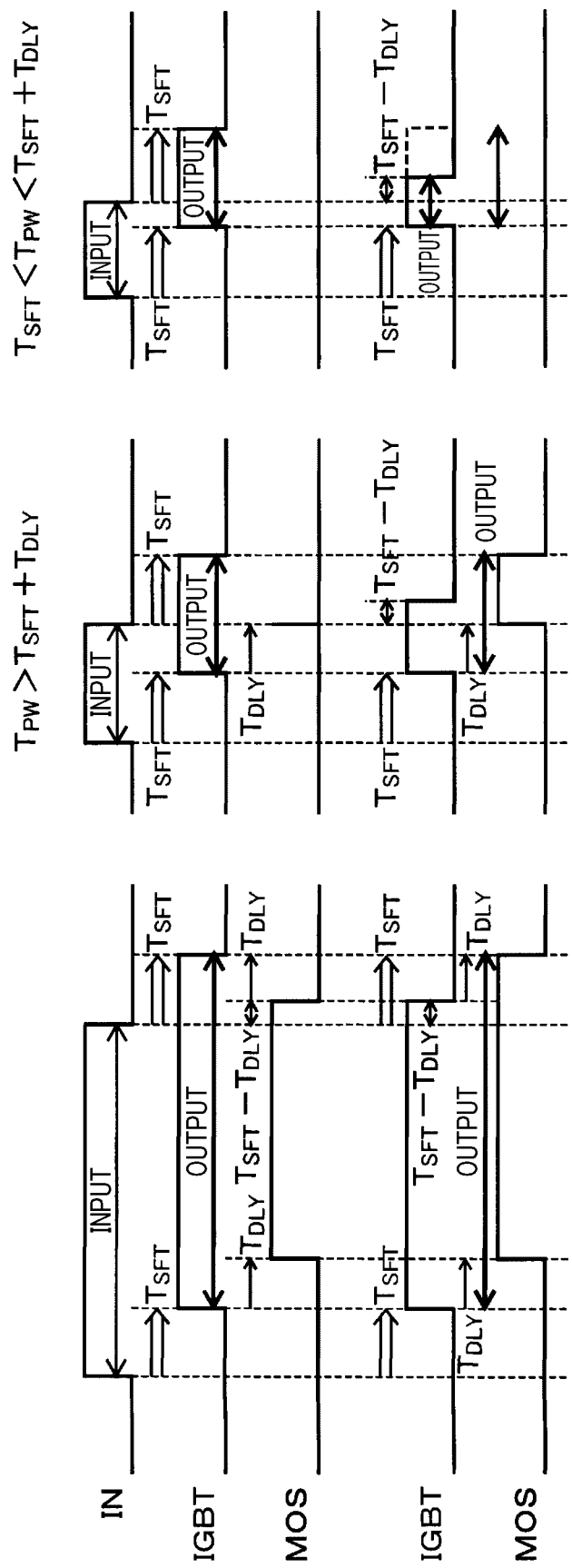
FIG. 39 is a diagram of changes in an output pulse width in "DC assist" and "DC+Eoff assist" when a pulse width of a PWM signal (IN) differs.

As shown in FIG. 39, when "$T_{PW} < T_{SFT}+T_{DLY}$", the IGBT 1 and the FET 2 can be driven such that the total on-period is equal to the pulse width $T_{PW}$ in both "DC assist" and "DC+Eoff assist". In contrast, in condition (1), when "DC+Eoff assist" is performed, the total on-period cannot maintain the pulse width $T_{PW}$. However, although FET 2 cannot be turned on in "DC assist", the on-period of the IGBT 1 alone is equal to the pulse width $T_{PW}$.

As described above, according to the second embodiment, the pulse width determination circuit 22 determines whether or not the pulse width $T_{PW}$ of the PWM signal is less than the predetermined threshold $(T_{SFT}+T_{DLY})$. In addition, even when "DC+Eoff assist" is selected in the assist selection circuit 8, the IGBT drive circuit 25 and the MOS drive circuit 26 select "DC assist" when the pulse width $T_{PW}$ is less than the threshold.

As a result, when driving in "DC+Eoff assist" becomes difficult because the pulse width $T_{PW}$ is short, controllability can be maintained by "DC assist" being applied as an alternative and the on-period of the IGBT 1 alone being made equal to the pulse width $T_{PW}$. In addition, as a result of the threshold being set to $(T_{SFT}+T_{DLY})$, the threshold can be set based on the delay times that are applied during turn-on and turn-off.

Third Embodiment

Figure 40:
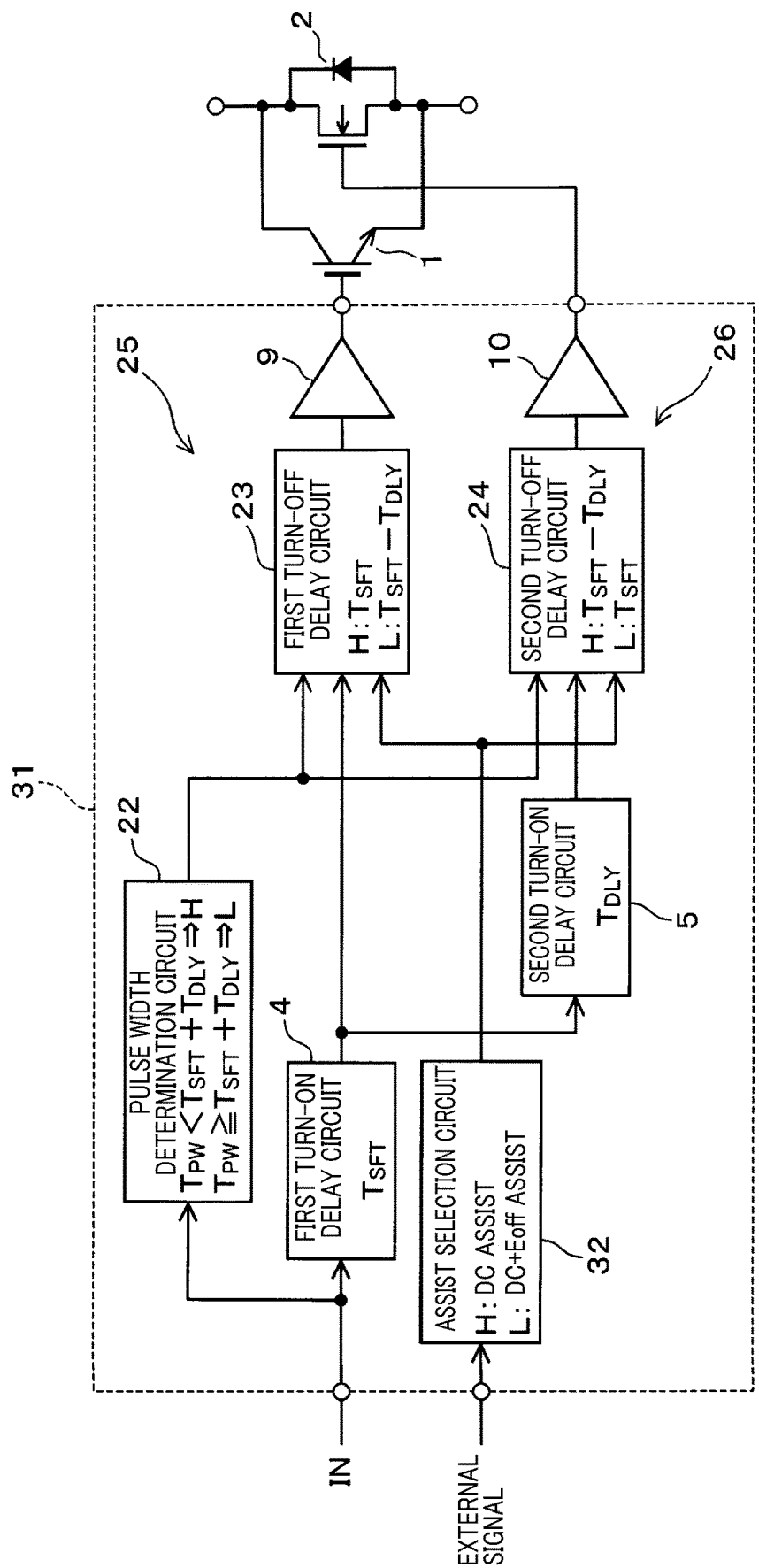
FIG. 40 is a third embodiment and a functional block diagram of a configuration of a driver IC.

The driver IC 31 according to the third embodiment shown in FIG. 40 is that in which the assist selection circuit 8 in the driver IC 3 according to the first embodiment is replaced by an assist selection circuit 32. Based on a selection signal that is received by an external source, the assist selection circuit 32 can dynamically switch the settings of H: "DC assist" and L: "DC+Eoff assist". For example, the assist selection circuit 32 is configured by a D flip-flop that latches the selection signal received by an input terminal D at an edge of a system clock.

Fourth Embodiment

Figure 41:
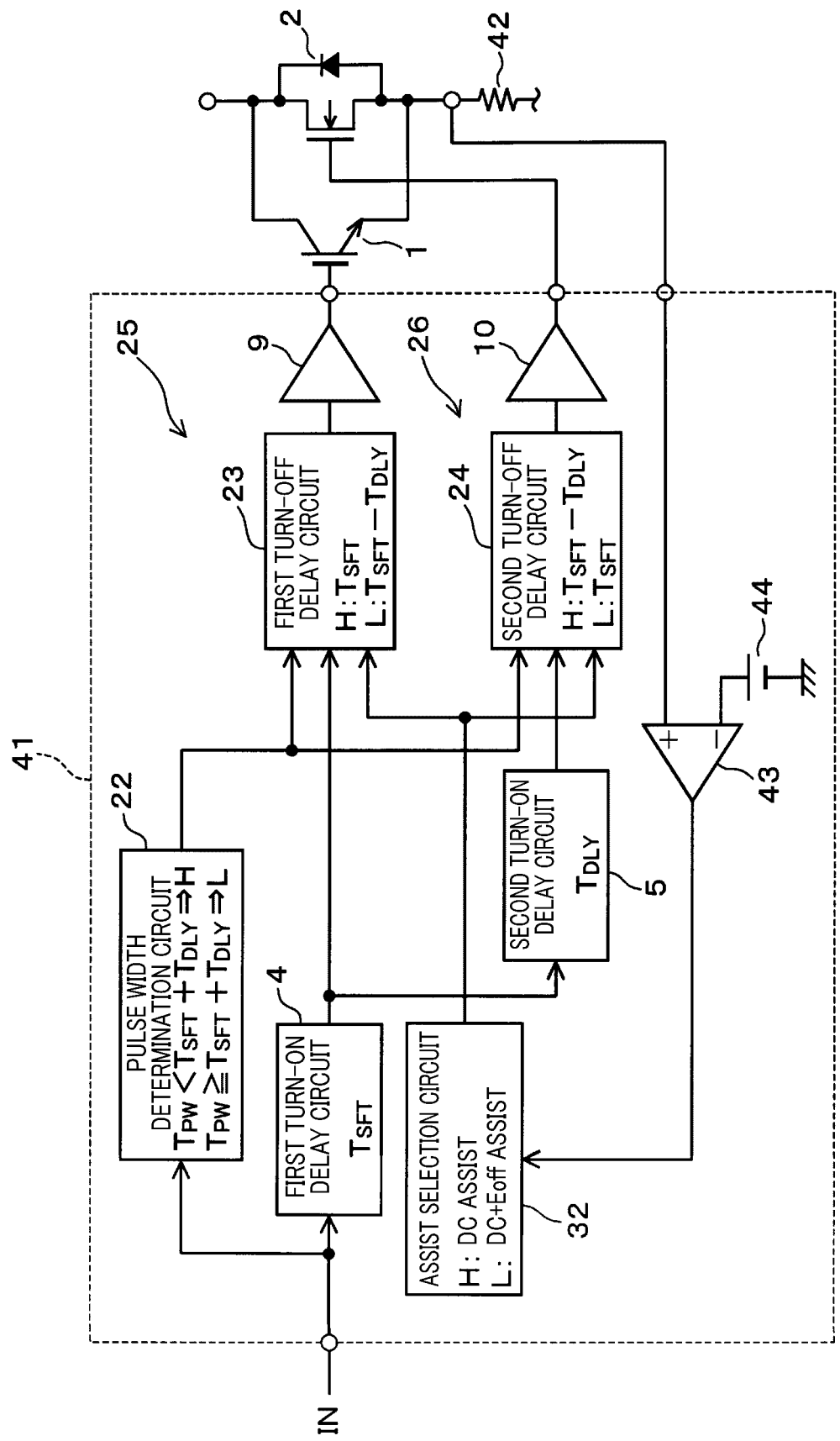
FIG. 41 is a fourth embodiment and a functional block diagram of a configuration of a driver IC.
Figure 42:
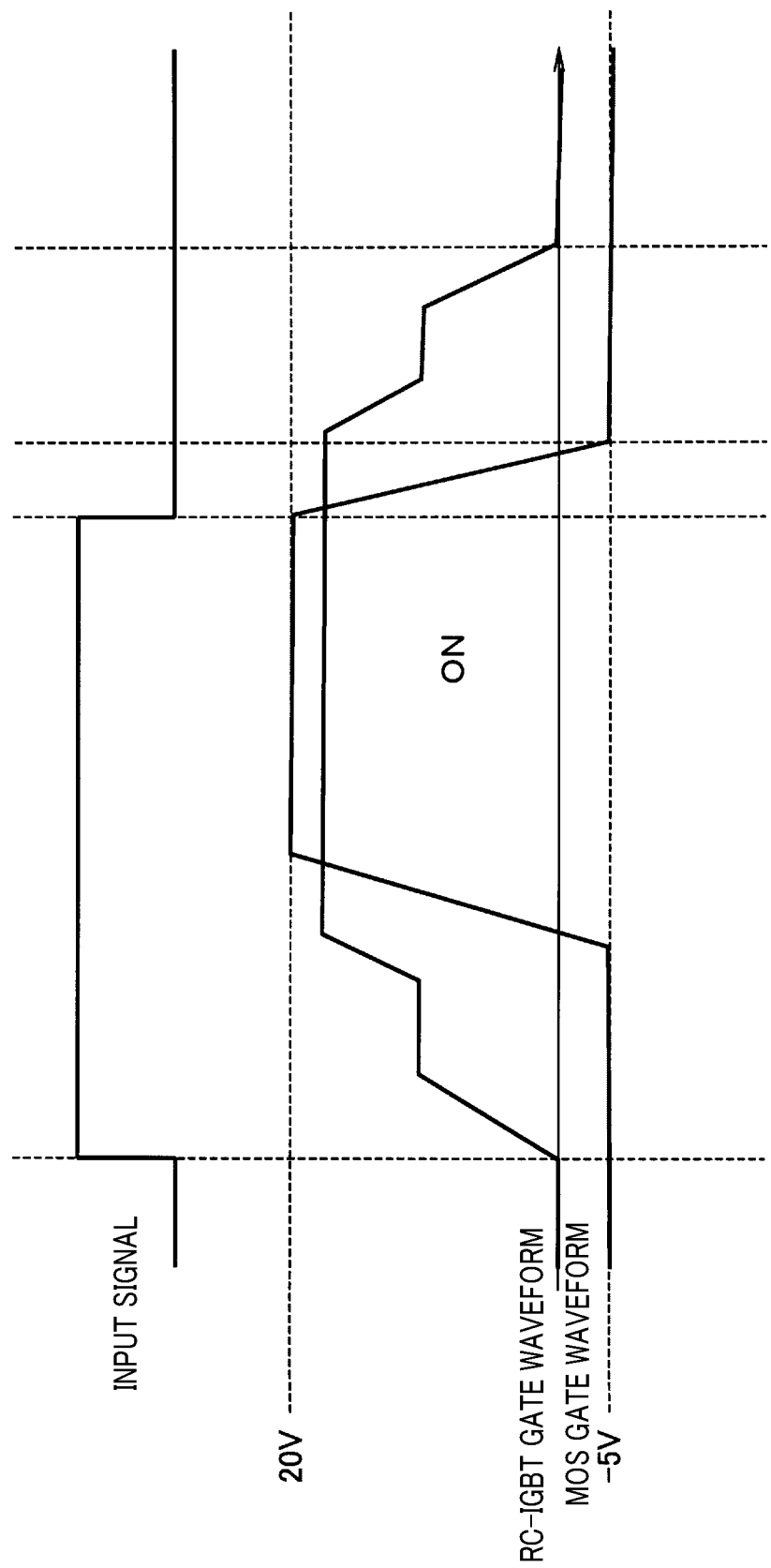
FIG. 42 is a timing chart for explaining a conventional typical parallel-drive method corresponding to a second disclosure.
Figure 43:
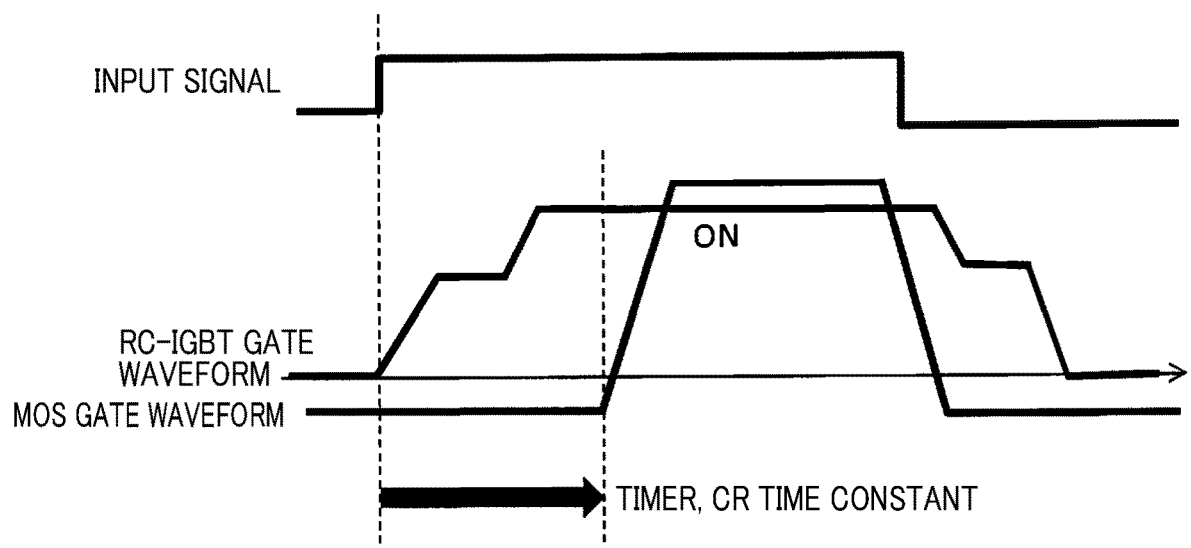
FIG. 43 is an operation timing chart of a conventional technology corresponding to a third disclosure.
Figure 44:
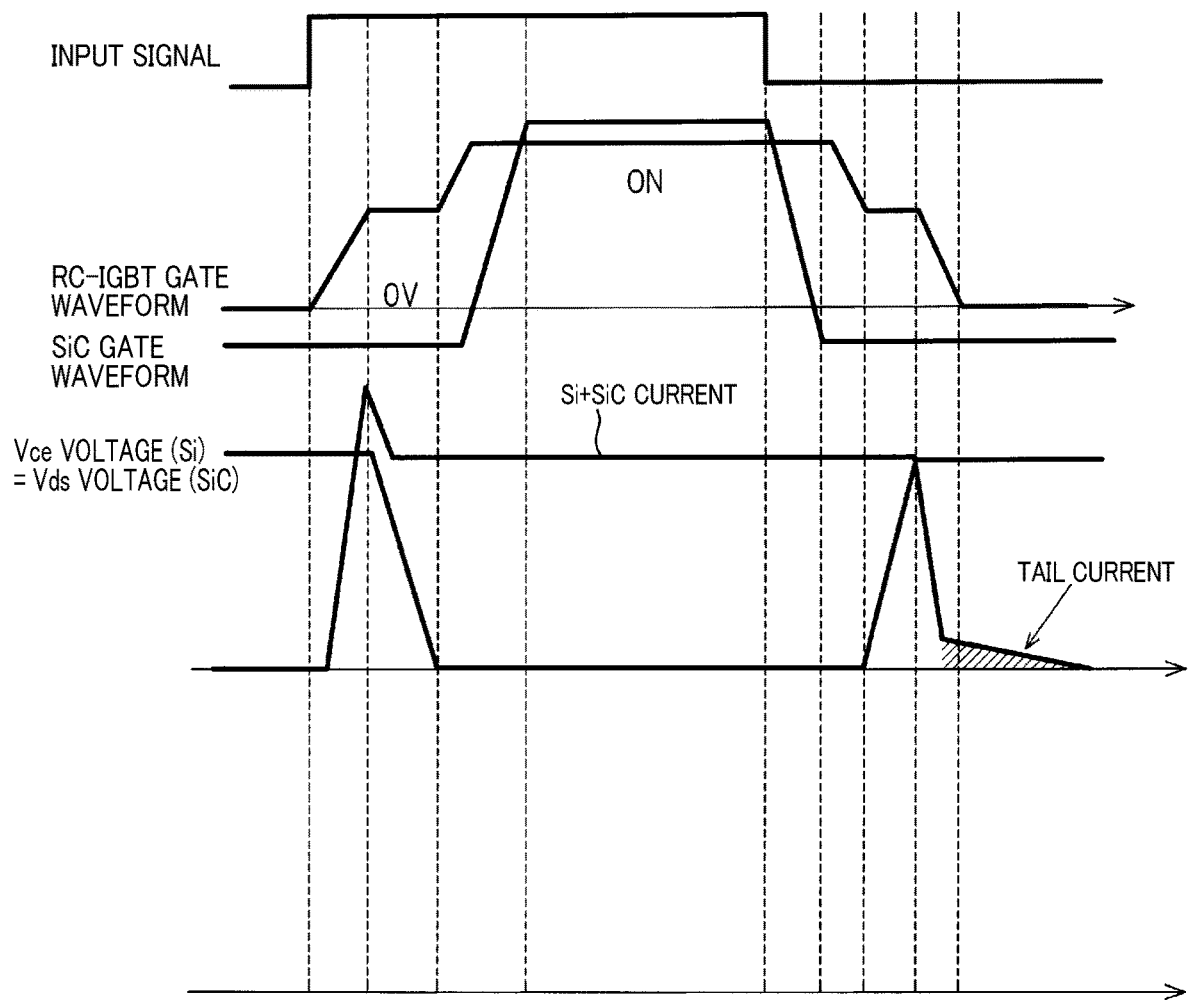
FIG. 44 is a timing chart for explaining a conventional typical parallel-drive method corresponding to a fourth disclosure.
Figure 45:
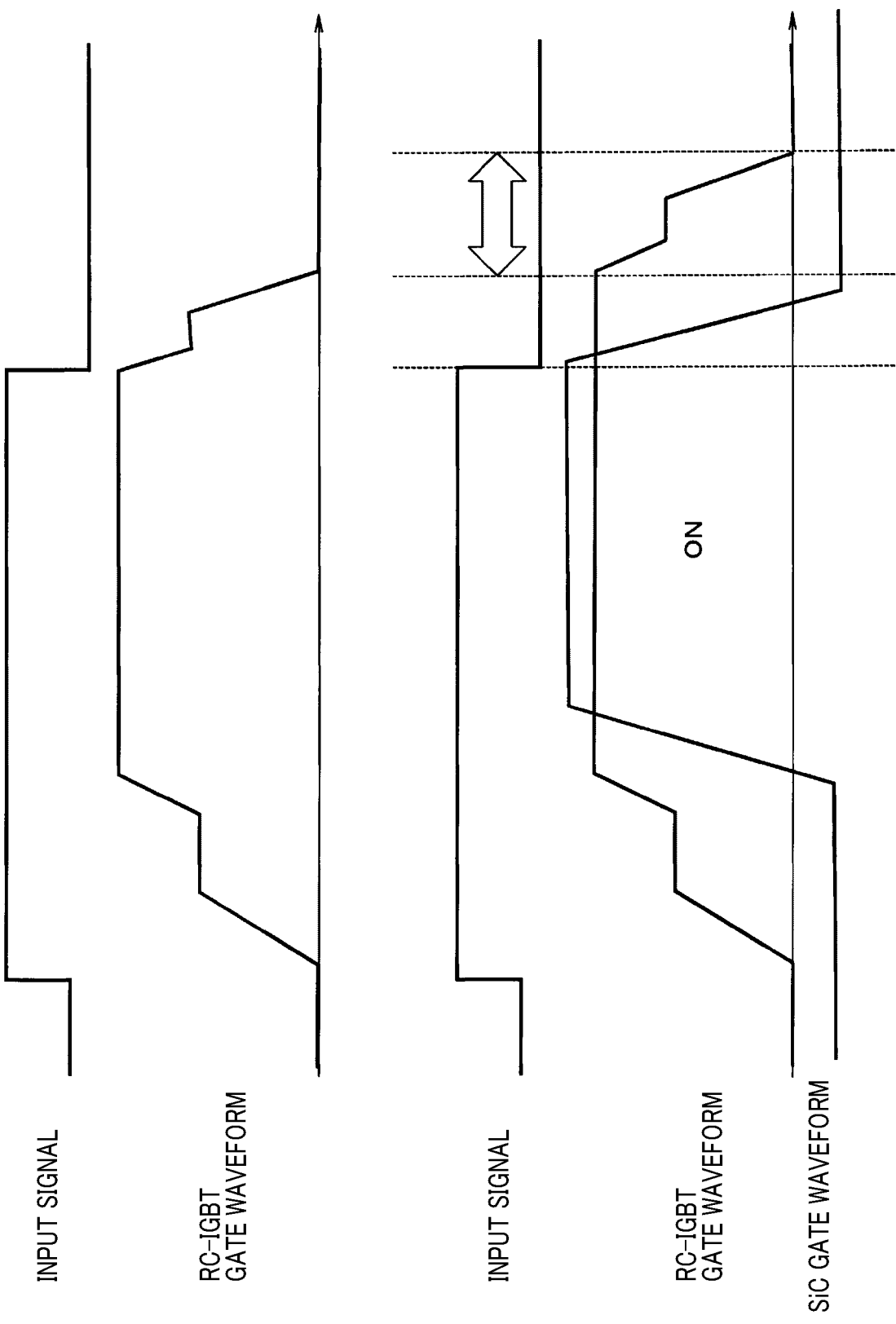
FIG. 45 is a timing chart of conventional driving of an IGBT alone and a timing chart of a conventional parallel-drive method corresponding to a fifth disclosure.

A driver IC 41 according to the fourth embodiment shown in FIG. 41 uses the assist selection circuit 32 in a manner similar to that according to the third embodiment. A current detection resistor 42 is inserted on the emitter side of the IGBT 1 and the source side of the FET 2. The emitter of the IGBT 1 and the source of the FET 2 are connected to the non-inverting input terminal of a comparator 43 within the driver IC 41. A threshold voltage 44 is applied to the inverting input terminal of the comparator 43. The output terminal of the comparator 43 is connected to the input terminal of the assist selection circuit 32 instead of the selection signal according to the third embodiment.

Next, workings according to the fourth embodiment will be described. When the current flowing to the emitter of the IGBT 1 is small and the potential of the non-inverting input terminal of the comparator 43 is below the threshold voltage 44, the output level of the comparator 43 is low. As a result, L: "DC+Eoff assist" is selected in the assist selection circuit 32. Meanwhile, when the current flowing to the emitter of the IGBT 1 increases and the potential of the non-inverting input terminal exceeds the threshold voltage 44, the output level of the comparator 43 changes to high. As a result, H: "DC assist" is selected in the assist selection circuit 32.

That is, when the load current is small, "DC+Eoff assist" is performed. Switching loss when the IGBT 1 is turned off is reduced. When the load current increases, "DC assist" is performed. The load current is covered during the on-period of the IGBT 1. Consequently, according to the fourth embodiment, the appropriate drive method can be selected based on the magnitude of the load current.

Other Embodiments

Control may be performed using shorter amount of time instead of the difference time ($T_{SFT}-T_{DLY}$).

The threshold of the pulse width determination circuit 22 may be set to a longer amount of time than ($T_{SFT}+T_{DLY}$).

The third and fourth embodiments may be applied to the configuration according to the first embodiment.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

The invention claimed is:

1. A transistor drive circuit that drives a bipolar-type transistor and a MOSFET that are connected in parallel to each other, the transistor drive circuit comprising:
   a temperature detection element that detects a temperature of the bipolar-type transistor or the MOSFET,
   the transistor drive circuit
      turning on both of the MOSFET and the bipolar-type transistor when the temperature is equal to or less than a threshold, and
      turning on only the bipolar-type transistor when the temperature exceeds the threshold.

2. The transistor drive circuit according to claim 1, wherein:
   the temperature detection element detects the temperature of the MOSFET.

3. The transistor drive circuit according to claim 1, further comprising:
   a turn-off delay circuit that delays a falling timing of an input signal;
   a bipolar drive circuit that applies a turn-on level voltage and a turn-off level voltage to a gate of the bipolar-type transistor based on level change in a signal received via the turn-off delay circuit;
   a MOS drive circuit that applies a turn-on level voltage and a turn-off level voltage to a gate of the MOSFET;
   a temperature detecting unit that outputs a voltage signal based on the temperature detected by the temperature detection element;
   a peak hold circuit that holds a peak value of the voltage signal;
   a comparator that compares the peak value to a threshold;
   a rising determination circuit that outputs a trigger signal when a drive voltage of the bipolar-type transistor exceeds a predetermined voltage, during a period in which the transistor is turned on;
   an ON/OFF determination circuit that determines whether or not to turn on the MOSFET using the MOS drive circuit based on a comparison result of the comparator, when the trigger signal is received; and
   a falling detection circuit that detects a falling edge of the input signal and outputs an off-command to turn off the MOSFET by the MOS drive circuit.

4. A transistor drive circuit that drives a bipolar-type transistor and a MOSFET that are connected in parallel to each other, the transistor drive circuit comprising:
   a current detection element that detects a current that flows via the bipolar-type transistor,
   the transistor drive circuit
      turning on both of the MOSFET and the bipolar-type transistor when the current is equal to or less than a threshold, and
      turning on only the bipolar-type transistor when the current exceeds the threshold.

5. The transistor drive circuit according to claim 4, further comprising:
   a turn-off delay circuit that delays a falling timing of an input signal;
   a bipolar drive circuit that applies a turn-on level voltage and a turn-off level voltage to a gate of the bipolar-type transistor based on level change in a signal received via the turn-off delay circuit;
   a MOS drive circuit that applies a turn-on level voltage and a turn-off level voltage to a gate of the MOSFET based on level change in the input signal;
   a comparator that compares a voltage signal outputted based on the current detected by the current detection element to a threshold;
   a rising determination circuit that outputs a trigger signal when a drive voltage of the bipolar-type transistor exceeds a predetermined voltage, during a period in which the transistor is turned on;
   an ON/OFF determination circuit that determines whether or not to turn on the MOSFET using the MOS drive circuit based on a comparison result of the comparator, when the trigger signal is received; and
   a falling detection circuit that detects a falling edge of the input signal and outputs an off-command to turn off the MOSFET by the MOS drive circuit.

6. A transistor drive circuit that drives a bipolar-type transistor and a MOSFET that are connected in parallel to each other, the transistor drive circuit comprising:
   a current detection element that detects a current that flows via the bipolar-type transistor,
   the transistor drive circuit
      turning on both of the MOSFET and the bipolar-type transistor when the current is equal to or less than a first threshold in one polarity, and only the bipolar-type transistor is turned on when the current exceeds the first threshold,
      simultaneously turning on the MOSFET and the bipolar-type transistor when the current is equal to or less than a second threshold that is set to be higher than the first threshold correspondence value in an other polarity, and
      turning on only the bipolar-type transistor when the current exceeds the second threshold.

7. The transistor drive circuit according to claim 6, further comprising:

a turn-off delay circuit that delays a falling timing of an input signal;
a bipolar drive circuit that applies a turn-on level voltage and a turn-off level voltage to a gate of the bipolar-type transistor based on level change in a signal received via the turn-off delay circuit;
a MOS drive circuit that applies a turn-on level voltage and a turn-off level voltage to a gate of the MOSFET based on level change in the input signal;
a rising determination circuit that outputs a trigger signal when a drive voltage of the bipolar-type transistor exceeds a predetermined voltage, during a period in which the transistor is turned on;
a first comparator that compares the current detected by the current detection element to the first threshold;
a second comparator that compares the current detected by the current detection element to the second threshold;
an ON/OFF determination circuit that determines whether or not to turn on the MOSFET using the MOS drive circuit based on comparison results of the first and second comparators; and
a falling detection circuit that detects a falling edge of the input signal and outputs an off-command to turn off the MOSFET by the MOS drive circuit.

8. A transistor drive circuit that drives a bipolar-type transistor and a MOSFET that are connected in parallel to each other, the transistor drive circuit comprising:
a temperature detection element that detects a temperature of the bipolar-type transistor or the MOSFET; and
a current detection element that detects a current that flows via the bipolar-type transistor,
the transistor drive circuit
turning on both of the MOSFET and the bipolar-type transistor when a two-dimensional coordinate value determined based on the temperature and the current is equal to or less than a threshold that is set on the coordinate, and
turning on only the bipolar-type transistor when the two-dimensional coordinate value exceeds the threshold.

9. The transistor drive circuit according to claim 8, wherein:
the temperature detection element detects the temperature of the bipolar transistor.

10. The transistor drive circuit according to claim 8, further comprising:
a turn-off delay circuit that delays a falling timing of an input signal;
a bipolar drive circuit that applies a turn-on level voltage and a turn-off level voltage to a gate of the bipolar-type transistor based on level change in a signal received via the turn-off delay circuit;
a falling detection circuit that detects falling of the signal received via the turn-off delay circuit;
a temperature peak detection circuit that detects a peak value of the temperature detected by the temperature detection element upon detection of the falling of the input signal;
a current peak detection circuit that detects a peak value of the current detected by the current detection element upon detection of the falling of the input signal;
a MOS drive circuit that applies a turn-on level voltage and a turn-off level voltage to a gate of the MOSFET based on level change in the input signal;
a timing detection circuit that outputs a one-shot pulse signal after elapse of a fixed amount of time when rising of an input signal provided from an external source is detected;
an ON/OFF determination circuit that compares a two-dimensional value to the threshold and determines whether or not to turn on the MOSFET using the MOS drive circuit when the one-shot pulse signal is received, the two-dimensional value being determined by the peak value of the temperature detected by the temperature peak detection circuit and the peak value of the current detected by the current peak detection circuit, and
a falling detection circuit that detects a falling edge of the input signal and outputs an off-command to turn off the MOSFET by the MOS drive circuit.

11. A transistor drive circuit that drives a bipolar-type transistor and a MOSFET that are connected in parallel to each other, the transistor drive circuit comprising:
a temperature detection element that detects a temperature of the bipolar-type transistor or the MOSFET; and
a current detection element that detects a current that flows via the bipolar-type transistor,
the transistor drive circuit
turning on both of the MOSFET and the bipolar-type transistor when a two-dimensional coordinate value determined based on the temperature and the current is equal to or less than a threshold that is set on the coordinate, and
turning on the MOSFET by decreasing a drive voltage applied to a gate of the MOSFET and turning on the bipolar-type transistor, when the two-dimensional coordinate value exceeds the threshold.

12. The transistor drive circuit according to claim 11, wherein:
the temperature detection element detects the temperature of the bipolar-type transistor.

13. The transistor drive circuit according to claim 11, wherein:
a plurality of thresholds are set as the threshold; and
the transistor drive circuit decreases the drive voltage applied to the gate of the MOSFET in stages as the threshold exceeded by the two-dimensional coordinate value increases.

14. The transistor drive circuit according to claim 11, further comprising:
a turn-off delay circuit that delays a falling timing of an input signal;
a bipolar drive circuit that applies a turn-on level voltage and a turn-off level voltage to a gate of the bipolar-type transistor based on level change in a signal received via the turn-off delay circuit;
a MOS drive circuit that applies a turn-on level voltage and a turn-off level voltage to the gate of the MOSFET based on level change in the input signal;
a timing detection circuit that outputs a one-shot pulse signal after elapse of a fixed amount of time when rising of an input signal provided from an external source is detected;
a temperature peak detection circuit that detects a peak value of the temperature detected by the temperature detection element upon detection of the falling of the input signal;
a current peak detection circuit that detects a peak value of the current detected by the current detection element upon detection of the falling of the input signal;

a falling detection circuit that detects falling of the signal received via the turn-off delay circuit;
a drive voltage generation circuit that generates the drive voltage to be applied to the gate of the MOSFET; and
a drive voltage determination circuit that compares a two-dimensional value to the threshold and determines the turn-on level voltage applied to the gate of the MOSFET when the one-shot pulse signal is received, the two-dimensional value being determined by the peak value of the temperature detected by the temperature peak detection circuit and the peak value of the current detected by the current peak detection circuit.

15. The transistor drive circuit according to claim 14, wherein:
the temperature peak detection circuit includes
a temperature detecting unit that outputs a voltage signal based on the temperature detected by the temperature detection element, and
a peak hold circuit that holds a peak value of the voltage signal;
the current peak detection circuit includes
a current detecting unit that outputs a voltage signal based on the current detected by the current detection element, and
a peak hold circuit that holds a peak value of the voltage signal; and
the timing detection circuit includes
a rising detection circuit that outputs a trigger signal when rising of an input signal provided from an external source is detected,
a timer that starts counting of a fixed amount of time when the trigger signal is received, and
a one-shot pulse generation circuit that outputs a one-shot pulse signal when the fixed amount of time has been counted by the timer.

16. A motor drive control apparatus comprising:
a transistor drive circuit that drives a bipolar-type transistor and a MOSFET in a motor drive circuit in which the bipolar-type transistor and the MOSFET are connected in parallel is configured as a single arm;
a temperature detection element that detects a temperature of the bipolar-type transistor or the MOSFET;
a current detection element that detects a current flowing to a motor; and
a control circuit that determines a driving state of the bipolar-type transistor and the MOSFET based on magnitude of the temperature and magnitude of the current, and outputs a drive control signal to the transistor drive circuit.

17. The motor drive control apparatus according to claim 16, wherein:
the transistor drive circuit includes
a bipolar drive circuit that applies a turn-on level voltage and a turn-off level voltage to a gate of the bipolar-type transistor;
a bipolar pre-driver that outputs a drive signal to the bipolar drive circuit based on level change in the drive control signal,
a MOS drive circuit that applies a turn-on level voltage and a turn-off level voltage to a gate of the MOSFET, and of which the turn-on level voltage is variable, and
a MOS pre-driver that outputs a drive signal to the MOS drive circuit based on level change in the drive control signal, and determines the turn-on level voltage outputted by the MOS drive circuit based on a drive voltage control signal received by the control circuit;
the control circuit includes
a register that stores therein peak values of the temperature and the current when a peak value of the temperature detected by the temperature detection element is detected and a peak value of the current detected by the current detection element is detected, and
a timer that generates a pulse width modulation signal as the drive control signal; and
the control circuit determines the turn-on level voltage applied to the gate of the MOSFET by comparing a two-dimensional coordinate value determined by the peak value of the temperature and the peak value of the current with a threshold set on the coordinate, and outputs the drive voltage control signal to the MOS pre-driver.

18. A transistor drive circuit that drives a bipolar-type transistor and a MOSFET that are connected in parallel to each other,
the transistor drive circuit setting a period in which an intermediate level between a positive-polarity high level and a negative-polarity low level is applied as a voltage applied to the gate of the MOSFET so as to turn on and off the MOSFET, while the voltage is changed between the positive-polarity high level and the negative-polarity low level.

19. The transistor drive circuit according to claim 18, further comprising:
an insulated gate bipolar transistor drive circuit that applies a turn-on level voltage and a turn-off level voltage to a gate of the bipolar-type transistor based on level change in an input signal;
a MOS drive circuit that includes a low-level application circuit that applies a low-level voltage to the gate of the MOSFET, a high-level application circuit that applies a high-level voltage, and an intermediate level application circuit that applies an intermediate-level voltage, based on level change in the input signal;
a rising edge detection circuit that detects a rising edge of the input signal;
a falling edge detection circuit that detects a falling edge of the input signal;
a rising timer that counts a fixed amount of time from when the rising edge is detected;
a falling timer that counts a fixed amount of time from when the falling edge is detected;
an insulated-gate bipolar transistor drive control unit that applies the turn-on level voltage by the insulated-gate bipolar transistor drive circuit from when the rising edge is detected, and applies the turn-off level voltage by the insulated-gate bipolar transistor drive circuit upon elapse of the fixed amount of time counted by the falling timer from when the falling edge is detected;
a first MOS drive control unit that makes the low-level application circuit apply the low-level voltage during a period in which the insulated-gate bipolar transistor drive circuit is applying the turn-off level voltage;
a second MOS drive control unit that makes the intermediate level application circuit apply the intermediate-level voltage during a first period from when the rising edge is detected until elapse of the fixed amount of time counted by the rising timer and a second period from when the falling edge is detected until the elapse of the fixed amount of time counted by the falling timer; and a third MOS drive control unit that makes the high-level application circuit apply the high-level voltage between the first period and the second period.

20. The transistor drive circuit according to claim 19, wherein:
the falling timer is a plurality of falling timers that are individually provided and respectively referenced by the bipolar drive circuit and the MOS drive circuit.

21. A transistor drive circuit that drives a bipolar-type transistor and a MOSFET that are connected in parallel to each other,
the transistor drive circuit starting turn-on of the MOSFET on or after end of a Miller period after a drive voltage of the transistor reaches a Miller voltage when the bipolar-type transistor is turned on.

22. The transistor drive circuit according to claim 21, further comprising:
a turn-off delay circuit that delays a falling timing of the input signal;
an insulated-gate bipolar transistor drive circuit that applies a turn-on level voltage and a turn-off level voltage to a gate of the bipolar-type transistor based on changes in an output signal of the turn-off delay circuit;
a rising detection circuit that detects rising of the input signal;
a falling detection circuit that detects falling of the input signal;
a gate rising-period detection circuit that detects a rising-period until a drive voltage of the bipolar-type transistor rises to a turn-on level;
a gate voltage difference detection circuit that, during the rising-period, operates synchronously with a clock signal of which a period is shorter than changing time of the drive voltage of the bipolar-type transistor, determines a difference between a current value of the drive voltage and a value at one period before, and outputs a difference detection signal when the difference is greater than a threshold voltage;
a charge period detection circuit that outputs a charge period detection signal during a capacity charge period of the bipolar-type transistor from when a first output of the difference detection signal is stopped until when a second output is stopped, during the rising-period;
an AND gate that takes logical AND of the difference detection signal, the charge period detection signal, and the clock signal;
a rising detection circuit that detects rising of an output signal of the AND gate;
a MOS drive circuit that applies a turn-on level voltage to a gate of the MOSFET when the rising detection circuit detects the rising of the output signal of the AND gate and applies a turn-off level voltage to the gate of the MOSFET when the falling detection circuit detects the falling of the input signal; and
a falling detection circuit that detects falling of the charge period detection signal, wherein
the gate rising-period detection circuit performs detection with a period from when the rising detection circuit detects the rising of the input signal until when the falling detection circuit detects the falling of the charge period detection signal as the rising-period.

23. The transistor drive circuit according to claim 22, wherein:
the charge period detection circuit includes a counter that counts a number of times of detection of a falling edge of a signal received by the gate voltage difference detection circuit, wherein the counter is reset to zero when rising of the input signal is detected and, thereafter, sets the charge period detection signal to high level when a first falling edge is received by the gate voltage difference detection circuit and changes the signal to low level when a second falling edge is received.

24. The transistor drive circuit according to claim 22, wherein:
the gate voltage difference detection circuit includes
a current value storage unit that stores therein a current drive voltage of the bipolar-type transistor,
a previous value storage unit that stores therein a drive voltage at a single clock cycle before that of the current drive voltage,
a difference detecting unit that detects a difference between the drive voltages stored in the previous value storage unit and the current value storage unit, and
a comparator that compares the difference and a threshold value, and outputs the comparison result as the difference detection signal.

25. The transistor drive circuit according to claim 21, further comprising:
a turn-off delay circuit that delays a falling timing of the input signal;
an insulated-gate bipolar transistor drive circuit that applies a turn-on level voltage and a turn-off level voltage to a gate of the bipolar-type transistor based on changes in an output signal of the turn-off delay circuit;
a comparator that compares the drive voltage of the bipolar-type transistor and a threshold voltage that is set to be higher than the Miller voltage;
a rising detection circuit that detects rising of an output signal of the comparator;
a falling detection circuit that detects falling of the input signal; and
a MOS drive circuit that applies a turn-on level voltage to a gate of the MOSFET when the rising detection circuit detects the rise and applies a turn-off level voltage to the gate of the MOSFET when the falling detection circuit detects the falling of the input signal.

26. A transistor drive circuit that drives a bipolar-type transistor and a MOSFET that are connected in parallel to each other, the transistor drive circuit comprising:
a current detection element that detects a current that flows via the bipolar-type transistor or the MOSFET,
the transistor drive circuit,
when the bipolar-type transistor and the MOSFET are to be turned off,
turning off the MOSFET after the bipolar-type transistor when the current is equal to or less than a threshold, and
turning off the bipolar-type transistor after the MOSFET when the current exceeds the threshold.

27. The transistor drive circuit according to claim 26, wherein:
the current detection element detects the current that flows via the MOSFET.

28. The transistor drive circuit according to claim 26, wherein:
the current detection element detects the current that flows via the bipolar-type transistor.

29. The transistor drive circuit according to claim 26, further comprising:
a comparator that compares a terminal voltage of the current detection element and a voltage that corresponds to the threshold;

a bipolar drive circuit that that applies a turn-on level voltage and a turn-off level voltage to a gate of the bipolar-type transistor based on level change in an input signal;
a MOS drive circuit that applies a turn-on level voltage and a turn-off level voltage to a gate of the MOSFET based on level change in the input signal;
a turn-on delay circuit that is arranged on a path in which the input signal is received by the MOS drive circuit, and delays a rising timing of the input signal;
a first turn-off delay circuit that is arranged on a path that branches from a path in which the input signal is directly received by the bipolar drive circuit, and delays the falling timing of the input signal;
a second turn-off delay circuit that is arranged on a path that branches from a path in which the input signal that has passed through the turn-on delay circuit is directly received by the MOS drive circuit, and delays the falling timing of the input signal;
a third turn-off delay circuit that delays the falling timing of the input signal;
a first selector that is arranged on an input-side of the bipolar drive circuit, and switches between a path in which the first turn-on delay circuit is interposed and a path in which the first turn-on delay circuit is not interposed; and
a set/reset flip-flop that is set by an output signal of the comparator and reset by an output signal of the third turn-off delay circuit, wherein
switching of the first and second selectors is performed by an output signal of the set/reset flip-flop.

30. The transistor drive circuit according to claim 29, wherein:
the first turn-off delay circuit is also used as the third turn-off delay circuit.

31. A transistor drive circuit that drives a bipolar-type transistor and a MOSFET that are connected in parallel to each other, the transistor drive circuit comprising:
a bipolar drive circuit that applies a turn-on level voltage and a turn-off level voltage to a gate of the bipolar-type transistor based on level change in an input signal;
a MOS drive circuit that applies a turn-on level voltage and a turn-off level voltage to a gate of the MOSFET based on level change in the input signal;
a carrier midpoint estimating unit that, based on a received pulse width modulation signal, estimates an intermediate time of a carrier that generates the pulse width modulation signal; and
an on-time adjusting unit that adjusts an on-time of the MOSFET by the MOS drive circuit based on the intermediate time.

32. The transistor drive circuit according to claim 31, wherein:
the carrier midpoint estimating unit includes
a pulse width modulation width counter circuit that counts a period from rising and falling of the pulse width modulation signal,
a pulse width modulation midpoint estimation circuit that halves a timer value counted by the pulse width modulation width counter circuit;
a time detection counter circuit that performs a count operation of a value that indicates a current time based on a clock signal;
a carrier midpoint storage circuit that stores therein results of a value obtained by the timer value being halved being added to the value that indicates the current time, for two consecutive periods, as first and second data, respectively, and
a carrier midpoint estimation circuit that determines a difference between the first data and the second data and adds the second data to the difference;
the result of the addition is an estimation value of the intermediate time; and
the on-time adjusting unit uses the estimation value when turning on the MOSFET in a third period following the second period.

33. The transistor drive circuit according to claim 32, wherein:
the on-time adjusting unit includes
an on-side delay circuit that delays a rising timing of the pulse width modulation signal,
a pulse width estimation circuit that estimates a pulse width of the pulse width modulation signal that is outputted by the bipolar-type transistor based on the rising timing of the pulse width modulation signal and the intermediate time received by the carrier midpoint estimation circuit, and
a MOSFET pulse width determination circuit that sets a period from the rising timing delayed by the on-side delay circuit to a result of a predetermined value being subtracted from the estimated pulse width as an on-time of the MOSFET in the third period, and turns on the MOSFET within a period before and after the intermediate point.

34. The transistor drive circuit according to claim 31, further comprising:
an AND gate of which one input terminal is connected to an output terminal of the on-time adjusting unit and an output terminal is connected to an input terminal of the MOS drive circuit; and
an initial direct-current assist stop circuit that outputs a low-level signal to another input terminal of the AND gate during a period corresponding to two consecutive periods of a pulse width modulation carrier from the start of output of the pulse width modulation signal.

35. A transistor drive circuit that drives a bipolar-type transistor and a MOSFET that are connected in parallel to each other, the transistor drive circuit comprising:
a bipolar drive circuit that applies a turn-on level voltage and a turn-off level voltage to a gate of the bipolar-type transistor based on level change in an input signal;
a MOS drive circuit that applies a turn-on level voltage and a turn-off level voltage to a gate of the MOSFET based on level change in the input signal; and
a selection circuit that selects and sets a first drive method and a second drive method,
the bipolar drive circuit
applying, when the input signal becomes a turn-on level, the turn-on level voltage to the gate of the bipolar-type transistor after elapse of a first delay time,
applying, when the first drive method is selected, the turn-off level voltage to the gate after the elapse of the first delay time when the input signal becomes a turn-off level, and
applying, when the second drive method is selected, the turn-off level voltage to the gate upon elapse of an amount of time that is equal to or less than a difference time in which a second delay time that is set to be shorter than the first delay time is subtracted from the first delay time, the MOS drive circuit
applying, when the input signal becomes the turn-on level, the turn-on level voltage to the gate of the MOSFET after the elapse of the second delay time after the elapse of the first delay time, and
applying, when the first drive method is selected, the turn-off level voltage to the gate after the elapse of the first delay time, when the input signal becomes the turn-off level.

36. The transistor drive circuit according to claim 35, further comprising:
a determination circuit that determines whether the pulse width of the input signal is less than a predetermined threshold,
the bipolar drive circuit and the MOS drive circuit selecting the first drive method when the pulse width is less than the threshold, even when the second drive method is selected in the selection circuit.

37. The transistor drive circuit according to claim 36, wherein:
the threshold is set to a sum of the first delay time and the second delay time.

38. The transistor drive circuit according to claim 35, wherein:
the selection circuit selects the first drive method and the second drive method based on a selection signal that is received from an external source.

39. The transistor drive circuit according to claim 35, further comprising:
a current detecting unit that detects a current that flows to a parallel circuit of the bipolar transistor and the MOSFET, wherein
the selection circuit selects the first drive method when the current detected by the current detecting unit is greater than a predetermined threshold, and selects the second drive method when the current is equal to or less than the threshold.

* * * * *